(12) United States Patent
Takahashi

(10) Patent No.: US 7,313,494 B2
(45) Date of Patent: Dec. 25, 2007

(54) SEMICONDUCTOR CHIP INSPECTION SUPPORTING APPARATUS

(75) Inventor: Yasunao Takahashi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 224 days.

(21) Appl. No.: 11/262,989

(22) Filed: Nov. 1, 2005

(65) Prior Publication Data

US 2006/0111859 A1    May 25, 2006

(30) Foreign Application Priority Data

Nov. 2, 2004    (JP) .............................. 2004-319922

(51) Int. Cl.
*G01N 37/00* (2006.01)
*H01J 37/29* (2006.01)

(52) U.S. Cl. ........................ 702/85; 250/310
(58) Field of Classification Search ............ 702/81–85; 250/310
See application file for complete search history.

(56) References Cited

U.S. PATENT DOCUMENTS

| | | | | |
|---|---|---|---|---|
| 6,589,801 B1 * | 7/2003 | Yoon et al. | .................... | 438/15 |
| 6,687,633 B2 * | 2/2004 | Ono et al. | .................... | 702/83 |
| 7,022,986 B2 * | 4/2006 | Shinada et al. | ............. | 250/310 |
| 7,034,298 B2 * | 4/2006 | Miyai et al. | ................. | 250/310 |

FOREIGN PATENT DOCUMENTS

| | | |
|---|---|---|
| JP | 04-133443 | 5/1992 |
| JP | 06-168991 | 6/1994 |
| JP | 07-169800 | 7/1995 |
| JP | 09-270446 | 10/1997 |
| JP | 10-160798 | 6/1998 |
| JP | 2000-040720 | 2/2000 |
| JP | 3107798 | 9/2000 |
| JP | 2001-230181 | 8/2001 |
| JP | 2004-055910 | 2/2004 |

* cited by examiner

*Primary Examiner*—John Barlow
*Assistant Examiner*—Victor J. Taylor
(74) *Attorney, Agent, or Firm*—McGinn IP Law Group, PLLC

(57) ABSTRACT

A semiconductor chip inspection supporting apparatus includes a data processing unit. To the data processing unit, an image data is supplied. The image data indicates a layout of a plurality of normal chips and a plurality of abnormal chip on a semiconductor wafer. The data processing unit includes a data processing unit and a search processing portion. The generation portion generates a connection propriety data indicating prohibition of each of the plurality of normal chips from being connected to adjacent one of the plurality of abnormal chips based on the image data. The search processing portion searches for a chip to be paired with the each of plurality of the normal chips for execution of paired measurement, based on the image data and the connection propriety data. The data processing unit outputs the search result.

18 Claims, 28 Drawing Sheets

SEMICONDUCTOR CHIP INSPECTION SUPPORTING APPARATUS

BACKGROUND OF THE INVENTION

1. Field of the Invention

The present invention relates to a semiconductor chip inspection supporting apparatus for supporting a semiconductor chip inspection.

2. Description of the Related Art

In a semiconductor manufacturing process, a plurality of semiconductor chips (hereinafter referred to as "chips"), each of which includes circuit elements, is formed on a semiconductor wafer so as to build circuits thereon. The plurality of chips is inspected (measured) with a probe card and a measuring instrument for examination of electrical characteristics. Those chips judged as good through the inspection are shipped.

During the chip inspection, simultaneous measurements of multiple chips are performed in order to reduce the inspection time. In the simultaneous measurements of multiple chips, the number of chips to be measured simultaneously can be increased by performing paired measurement in which a measuring pin is shared between two chips. However, since the shape of a chip is typically quadrangular while the shape of a semiconductor wafer is generally a circular, a plurality of normal chips and a plurality of abnormal chips are formed on the semiconductor wafer. Here, the normal chip is a chip that builds a circuit on the semiconductor wafer. The abnormal chip is a chip that cannot build a circuit on the semiconductor wafer. The abnormal chip is formed, for example, near an end portion of the semiconductor wafer. This abnormal chip is separated from the semiconductor wafer to be used as one device in a later step.

In the paired measurement, with the probe card (probe) being set on the normal chip and the abnormal chip, a voltage may be applied from the measuring instrument in some cases. In this case, a current leakage occurs. This leakage causes a phenomenon such as a leakage trouble or voltage decrease in the measuring pin. This results in malfunction of the normal chips. Therefore, the following methods have been adopted in conventional practices:

(Method 1) Measurement time reduction based on simultaneous measurements of multiple chips is prioritized. Thus, the occurrence of malfunctions of some normal chips is abandoned;

(Method 2) Considerable manpower (including labor cost) and time are dedicated to determining chip combinations;

(Method 3) Simultaneous measurements of multiple chips are abandoned to eliminate the malfunction of some normal chips; and (Method 4) Considerable manpower (including labor cost) is dedicated to taking countermeasures (disconnection between the Pad and the inside) against abnormal chips so as to achieve simultaneous measurement of multiple chips.

In conjunction with the chip inspection, the conventional techniques are disclosed as shown below.

Japanese Laid-Open Patent Application JP-A-Heisei, 04-133443 discloses a method for manufacturing a semiconductor device, which relates to a case where a plurality of chips are simultaneously measured in a wafer probing test. In order to enable the probing test to be performed easily, this manufacturing method prevents the probe of a probe card from selecting a section other than chips laid on the wafer.

Japanese Laid-Open Patent Application JP-A-Heisei, 06-168991 discloses a multi-probing semiconductor inspection method, which enables an inspection of a semiconductor chip with high inspection efficiency without causing an increase in the transfer range of a wafer transfer device.

Japanese Laid-Open Patent Application JP-A-Heisei, 09-270446 discloses a semiconductor inspection device, which is capable of inspecting a semiconductor device in which a plurality of product chips and one TEG chip are formed with the same shot.

Japanese Laid-Open Patent Application JP-P2004-55910A discloses a probe device, which is easily adaptable to a change in the layout of a probe card or the arrangement of an identification number.

Japanese Laid-Open Patent Application JP-P2000-40720A discloses an IC test system, which is capable of reading even location data to be specified at later time and also which operates by using new location data that permits reading the probe layout without a conversion table for each location data being provided to an IC test device.

Japanese Laid-Open Patent Application JP-A-Heisei, 10-160798 discloses an IC test method, which is capable of efficiently performing a test with a shorter measurement time even when only one measurement condition is provided at a time during simultaneous measurement of a plurality of ICs.

Japanese Patent JP-P3107798B discloses a semiconductor device inspection apparatus, which is capable of easily managing probe card usage history data at low costs.

Japanese Laid-Open Patent Application JP-A-Heisei, 07-169800 discloses a method of determining a probe card regular inspection period, which automatically judges a regular inspection period to be performed for a probe card that is used in semiconductor manufacturing, based on the time elapsed and the number of usage after the last regular inspection of the probe card, and then notifying the operator of this period.

Japanese Laid-Open Patent Application JP-P2001-230181 discloses a shot map creation method, which is capable of providing an improved throughput.

SUMMARY OF THE INVENTION

It is, therefore, an object of the present invention to provide a semiconductor chip inspection supporting apparatus capable of performing an inspection without causing malfunction of a normal chip impaired measurement.

This and other objects, features and advantages of the present invention will be readily ascertained by referring to the following description and drawings.

In order to achieve an aspect of the present invention, the present invention provides a semiconductor chip inspection supporting apparatus including: a data processing unit to which an image data is supplied, wherein the image data indicates a layout of a plurality of normal chips and a plurality of abnormal chip on a semiconductor wafer. The data processing unit includes: a generation portion and a search processing portion. The generation portion generates a connection propriety data indicating prohibition of each of the plurality of normal chips from being connected to adjacent one of the plurality of abnormal chips based on the image data. The search processing portion searches for a chip to be paired with the each of plurality of the normal chips for execution of paired measurement, based on the image data and the connection propriety data. The data processing unit outputs the search result to an output device.

In the semiconductor chip inspection supporting apparatus, the image data includes a plurality of area image data corresponding to areas measured with a probe card. Each of the plurality of area image data includes a plurality of blocks regularly arrayed. Each of the plurality of blocks indicates chips on the semiconductor wafer. The generation portion includes: a first generation section which generates a plurality of area connection status data by examining one, indicating the each normal chip, of the plurality of blocks and adjacent one, indicating adjacent the one abnormal chip, of the plurality of blocks in each of the plurality of area image data. Each of the plurality of area connection status data includes a plurality of connection status blocks corresponding to the plurality of blocks. Each of the plurality of connection status blocks includes a plurality connection status sub-blocks. One, which corresponds to an end of the areas measured with the probe card, of the plurality of connection status sub-blocks and one, which is adjacent to one, corresponding to the one abnormal chip, of the plurality of connection status blocks, of the plurality of connection status sub-blocks indicate a figure of zero, in the plurality connection status sub-blocks in the each of plurality of connection status blocks. One, which is not adjacent to the one, corresponding to the one abnormal chip, of the plurality of connection status blocks, of the plurality of connection status sub-blocks indicate a figure of one, in the plurality connection status sub-blocks in the each of plurality of connection status blocks. The generation portion further includes: a second generation section which generates a logical connection propriety data by an AND operation performed on figures indicated in the same position located in each of the plurality of connection status sub-blocks in each of the plurality of connection status blocks in the plurality of area connection status data for all of the plurality of connection status sub-blocks. The logical connection propriety data includes a plurality of logical connection propriety blocks corresponding to the plurality of the connection status blocks. Each of the plurality of logical connection propriety blocks includes a plurality of connection propriety sub-blocks with a figure obtained by the AND operation. The generation portion further includes: a third generation section which generates the connection propriety data by adding up figures indicated in the plurality of connection propriety sub-blocks in each of the logical connection propriety blocks. The connection propriety data includes a plurality of connection propriety blocks corresponding to the plurality of logical connection propriety blocks. Each of the plurality of connection propriety blocks includes the plurality of connection propriety sub-blocks and a connectable quantity sub-block with a figure obtained by the adding-up operation. The figure of zero indicated in the plurality of connection propriety sub-blocks represents prohibition of a connection to an adjacent chip, and the figure of one indicated in the plurality of connection propriety sub-blocks represents permission of a connection to the adjacent chip. A figure in the connectable quantity sub-block represents a number of the chips adjacent to and permitted to connect to. The search processing portion outputs the search result data, based on the plurality of area image data, the figures indicated in the plurality of connection propriety sub-blocks and the figure indicated in the connectable quantity sub-block in the each of plurality of connection propriety block.

In the semiconductor chip inspection supporting apparatus, the search processing portion includes: a first search section, a first processing section, a second search section, a second processing section, a third search section, a third processing section, a fourth search section, a fourth processing section, a fifth search section and a fifth processing section. The first search section searches the plurality of connection propriety blocks in the connection propriety data for a single measurement block whose the connectable quantity sub-block indicates a figure of zero. The first processing section specifies a block corresponding to the single measurement block in each of the plurality of area image data as a chip that a single measurement is executed. The second search section searches the plurality of connection propriety blocks in the connection propriety data, excluding the single measurement block, for first paired measurement blocks including of a first connection propriety block whose a connectable quantity sub-block indicates a figure of one and a connection propriety block adjacent to the first connection propriety block. The second processing section specifies blocks corresponding to the first paired measurement blocks in each of the plurality of area image data as chips that a paired measurement is executed. The third search section searches the plurality of connection propriety blocks in the connection propriety data, excluding the single measurement block and the first paired measurement blocks, for second paired measurement blocks including of a second connection propriety block whose a connectable quantity sub-block indicates a figure of two and a connection propriety block adjacent to the second connection propriety block. The third processing section specifies blocks corresponding to the second paired measurement blocks in each of the plurality of area image data as chips that the paired measurement is executed. The fourth search section searches the plurality of connection propriety blocks in the connection propriety data, excluding the single measurement block and the first to second paired measurement blocks, for third paired measurement blocks including of a third connection propriety block whose a connectable quantity sub-block indicates a figure of three and a connection propriety block adjacent to the third connection propriety block. The fourth processing section specifies blocks corresponding to the third paired measurement blocks in each of the plurality of area image data as chips that the paired measurement is executed. The fifth search section searches the plurality of connection propriety blocks in the connection propriety data, excluding the single measurement block and the first to third paired measurement blocks, for fourth paired measurement blocks including of a fourth connection propriety block whose a connectable quantity sub-block indicates a figure of four and a connection propriety block adjacent to the fourth connection propriety block. The fifth processing section specifies blocks corresponding to the fourth paired measurement blocks in each of the plurality of area image data as chips that the paired measurement is executed. The fifth processing section outputs the image data which includes the plurality of area image data specifying at least one of the single measurement block, and the first to fourth paired measurement blocks as the search result to the output device.

In the semiconductor chip inspection supporting apparatus, the search processing portion includes: a first search section, a first processing section, a second search section, a second processing section, a third search section, a third processing section, a fourth search section, a fourth processing section, a fifth search section and a fifth processing section. The first search section searches the plurality of connection propriety blocks in the connection propriety data for a single measurement block whose the connectable quantity sub-block indicates a figure of zero. The first processing section specifies a block corresponding to the single measurement block in each of the plurality of area image data as a chip that a single measurement is executed. The second search section searches the plurality of connection propriety blocks in the connection propriety data, excluding the single measurement block, for first paired measurement blocks including of a first connection propriety block whose a connectable quantity sub-block indicates a figure of one and a connection propriety block adjacent to the first connection propriety block. The second processing section specifies blocks corresponding to the first paired measurement blocks in each of the plurality of area image data as chips that a paired measurement is executed. The third search section searches the plurality of connection propriety blocks in the connection propriety data, excluding the single measurement block and the first paired measurement blocks, for second paired measurement blocks including of a second connection propriety block whose a connectable quantity sub-block indicates a figure of two and at least one of two connection propriety block adjacent to the second connection propriety block. The third processing section specifies blocks corresponding to the second paired measurement blocks in each of the plurality of area image data as chips that the paired measurement is executed. The fourth search section searches the plurality of connection propriety blocks in the connection propriety data, excluding the single measurement block and the first to second paired measurement blocks, for third paired measurement blocks including of a third connection propriety block whose a connectable quantity sub-block indicates a figure of three and at least one of three connection propriety block adjacent to the third connection propriety block. The fourth processing section specifies blocks corresponding to the third paired measurement blocks in each of the plurality of area image data as chips that the paired measurement is executed. The fifth search section searches the plurality of connection propriety blocks in the connection propriety data, excluding the single measurement block and the first to third paired measurement blocks, for fourth paired measurement blocks including of a fourth connection propriety block whose a connectable quantity sub-block indicates a figure of four and at least one of four connection propriety block adjacent to the fourth connection propriety block. The fifth processing section specifies blocks corresponding to the fourth paired measurement blocks in each of the plurality of area image data as chips that the paired measurement is executed. The fifth processing section outputs the image data which includes the plurality of area image data specifying at least one of the single measurement block, and the first to fourth paired measurement blocks as the search result to the output device.

In the semiconductor chip inspection supporting apparatus, the each normal chip is a chip including an electronic circuit on the semiconductor wafer. The each abnormal chip is a chip not being able to include the electronic circuit on the semiconductor wafer.

In the semiconductor chip inspection supporting apparatus, the each abnormal chip includes a test element group chip.

In order to achieve another aspect of the present invention, the present invention provides a method for supporting a semiconductor chip inspection by using a computer to which an image data is supplied, wherein the image data indicates a layout of a plurality of normal chips and a plurality of abnormal chip on a semiconductor wafer. The method including: (a) generating a connection propriety data indicating prohibition of each of the plurality of normal chips from being connected to adjacent one of the plurality of abnormal chips based on the image data, (b) searching for a chip to be paired with the each of plurality of the normal chips for execution of paired measurement, based on the image data and the connection propriety data, and (c) outputting the search result to an output device.

In the method for supporting a semiconductor chip inspection, the image data includes a plurality of area image data corresponding to areas measured with a probe card. Each of the plurality of area image data includes a plurality of blocks regularly arrayed. Each of the plurality of blocks indicates chips on the semiconductor wafer. The step (a) includes: (a1) generating a plurality of area connection status data by examining one, indicating the each normal chip, of the plurality of blocks and adjacent one, indicating adjacent the one abnormal chip, of the plurality of blocks in each of the plurality of area image data. Each of the plurality of area connection status data includes a plurality of connection status blocks corresponding to the plurality of blocks. Each of the plurality of connection status blocks includes a plurality connection status sub-blocks. One, which corresponds to an end of the areas measured with the probe card, of the plurality of connection status sub-blocks and one, which is adjacent to one, corresponding to the one abnormal chip, of the plurality of connection status blocks, of the plurality of connection status sub-blocks indicate a figure of zero, in the plurality connection status sub-blocks in the each of plurality of connection status blocks. One, which is not adjacent to the one, corresponding to the one abnormal chip, of the plurality of connection status blocks, of the plurality of connection status sub-blocks indicate a figure of one, in the plurality connection status sub-blocks in the each of plurality of connection status blocks. The step (a) further includes: (a2) generating a logical connection propriety data by an AND operation performed on figures indicated in the same position located in each of the plurality of connection status sub-blocks in each of the plurality of connection status blocks in the plurality of area connection status data for all of the plurality of connection status sub-blocks. The logical connection propriety data includes a plurality of logical connection propriety blocks corresponding to the plurality of the connection status blocks. Each of the plurality of logical connection propriety blocks includes a plurality of connection propriety sub-blocks with a figure obtained by the AND operation. The step (a) further includes: (a3) generating the connection propriety data by adding up figures indicated in the plurality of connection propriety sub-blocks in each of the logical connection propriety blocks. The connection propriety data includes a plurality of connection propriety blocks corresponding to the plurality of logical connection propriety blocks. Each of the plurality of connection propriety blocks includes the plurality of connection propriety sub-blocks and a connectable quantity sub-block with a figure obtained by the adding-up operation. The figure of zero indicated in the plurality of connection propriety sub-blocks represents prohibition of a connection to an adjacent chip, and the figure of one indicated in the plurality of connection propriety sub-blocks represents permission of a connection to the adjacent chip. A figure in the connectable quantity sub-block represents a number of the chips adjacent to and permitted to connect to. The step (b) includes: (b1) outputting the search result data, based on the plurality of area image data, the figures indicated in the plurality of connection propriety sub-blocks and the figure indicated in the connectable quantity sub-block in the each of plurality of connection propriety block.

In the method for supporting a semiconductor chip inspection, the step (b) further includes: (b2) searching the plurality of connection propriety blocks in the connection propriety data for a single measurement block whose the connectable quantity sub-block indicates a figure of zero, (b3) specifying a block corresponding to the single measurement block in each of the plurality of area image data as a chip that a single measurement is executed, (b4) searching the plurality of connection propriety blocks in the connection propriety data, excluding the single measurement block, for first paired measurement blocks including of a first connection propriety block whose a connectable quantity sub-block indicates a figure of one and a connection propriety block adjacent to the first connection propriety block, (b5) specifying blocks corresponding to the first paired measurement blocks in each of the plurality of area image data as chips that a paired measurement is executed, (b6) searching the plurality of connection propriety blocks in the connection propriety data, excluding the single measurement block and the first paired measurement blocks, for second paired measurement blocks including of a second connection propriety block whose a connectable quantity sub-block indicates a figure of two and a connection propriety block adjacent to the second connection propriety block, (b7) specifying blocks corresponding to the second paired measurement blocks in each of the plurality of area image data as chips that the paired measurement is executed, (b8) searching the plurality of connection propriety blocks in the connection propriety data, excluding the single measurement block and the first to second paired measurement blocks, for third paired measurement blocks including of a third connection propriety block whose a connectable quantity sub-block indicates a figure of three and a connection propriety block adjacent to the third connection propriety block, (b9) specifying blocks corresponding to the third paired measurement blocks in each of the plurality of area image data as chips that the paired measurement is executed, (b10) searching the plurality of connection propriety blocks in the connection propriety data, excluding the single measurement block and the first to third paired measurement blocks, for fourth paired measurement blocks including of a fourth connection propriety block whose a connectable quantity sub-block indicates a figure of four and a connection propriety block adjacent to the fourth connection propriety block, (b11) specifying blocks corresponding to the fourth paired measurement blocks in each of the plurality of area image data as chips that the paired measurement is executed, and (b12) outputting the image data which includes the plurality of area image data specifying at least one of the single measurement block, and the first to fourth paired measurement blocks as the search result to an output device.

In the method for supporting a semiconductor chip inspection, the step (b) further includes: (b2) searching the plurality of connection propriety blocks in the connection propriety data for a single measurement block whose the connectable quantity sub-block indicates a figure of zero, (b3) specifying a block corresponding to the single measurement block in each of the plurality of area image data as a chip that a single measurement is executed, (b4) searching the plurality of connection propriety blocks in the connection propriety data, excluding the single measurement block, for first paired measurement blocks including of a first connection propriety block whose a connectable quantity sub-block indicates a figure of one and a connection propriety block adjacent to the first connection propriety block, (b5) specifying blocks corresponding to the first paired measurement blocks in each of the plurality of area image data as chips that a paired measurement is executed, (b6) searching the plurality of connection propriety blocks in the connection propriety data, excluding the single measurement block and the first paired measurement blocks, for second paired measurement blocks including of a second connection propriety block whose a connectable quantity sub-block indicates a figure of two and at least one of two connection propriety block adjacent to the second connection propriety block, (b7) specifying blocks corresponding to the second paired measurement blocks in each of the plurality of area image data as chips that the paired measurement is executed, (b8) searching the plurality of connection propriety blocks in the connection propriety data, excluding the single measurement block and the first to second paired measurement blocks, for third paired measurement blocks including of a third connection propriety block whose a connectable quantity sub-block indicates a figure of three and at least one of three connection propriety block adjacent to the third connection propriety block, (b9) specifying blocks corresponding to the third paired measurement blocks in each of the plurality of area image data as chips that the paired measurement is executed, (b10) searching the plurality of connection propriety blocks in the connection propriety data, excluding the single measurement block and the first to third paired measurement blocks, for fourth paired measurement blocks including of a fourth connection propriety block whose a connectable quantity sub-block indicates a figure of four and at least one of four connection propriety block adjacent to the fourth connection propriety block, and (b11) specifying blocks corresponding to the fourth paired measurement blocks in each of the plurality of area image data as chips that the paired measurement is executed, (b12) outputting the image data which includes the plurality of area image data specifying at least one of the single measurement block, and the first to fourth paired measurement blocks as the search result to an output device.

In the method for supporting a semiconductor chip inspection, the each normal chip is a chip including an electronic circuit on the semiconductor wafer. The each abnormal chip is a chip not being able to include the electronic circuit on the semiconductor wafer.

In the method for supporting a semiconductor chip inspection, the each abnormal chip includes a test element group chip.

In order to achieve still another aspect of the present invention, the present invention provides a computer program product which is used for a method for supporting a semiconductor chip inspection by using a computer to which an image data is supplied, wherein the image data indicates a layout of a plurality of normal chips and a plurality of abnormal chip on a semiconductor wafer. The computer program product embodied on a computer-readable medium and including code that, when executed, causes a computer to perform the following: (a) generating a connection propriety data indicating prohibition of each of the plurality of normal chips from being connected to adjacent one of the plurality of abnormal chips based on the image data, (b) searching for a chip to be paired with the each of plurality of the normal chips for execution of paired measurement, based on the image data and the connection propriety data, and (c) outputting the search result to an output device.

In the computer program product, the image data includes a plurality of area image data corresponding to areas measured with a probe card. Each of the plurality of area image data includes a plurality of blocks regularly arrayed. Each of the plurality of blocks indicates chips on the semiconductor wafer. The step (a) includes: (a1) generating a plurality of area connection status data by examining one, indicating the each normal chip, of the plurality of blocks and adjacent one, indicating adjacent the one abnormal chip, of the plurality of blocks in each of the plurality of area image data. Each of the plurality of area connection status data includes a plurality of connection status blocks corresponding to the plurality of blocks. Each of the plurality of connection status blocks includes a plurality connection status sub-blocks. One, which corresponds to an end of the areas measured with the probe card, of the plurality of connection status sub-blocks and one, which is adjacent to one, corresponding to the one abnormal chip, of the plurality of connection status blocks, of the plurality of connection status sub-blocks indicate a figure of zero, in the plurality connection status sub-blocks in the each of plurality of connection status blocks. One, which is not adjacent to the one, corresponding to the one abnormal chip, of the plurality of connection status blocks, of the plurality of connection status sub-blocks indicate a figure of one, in the plurality connection status sub-blocks in the each of plurality of connection status blocks. The step (a) further includes: (a2) generating a logical connection propriety data by an AND operation performed on figures indicated in the same position located in each of the plurality of connection status sub-blocks in each of the plurality of connection status blocks in the plurality of area connection status data for all of the plurality of connection status sub-blocks. The logical connection propriety data includes a plurality of logical connection propriety blocks corresponding to the plurality of the connection status blocks. Each of the plurality of logical connection propriety blocks includes a plurality of connection propriety sub-blocks with a figure obtained by the AND operation. The step (a) further includes: (a3) generating the connection propriety data by adding up figures indicated in the plurality of connection propriety sub-blocks in each of the logical connection propriety blocks. The connection propriety data includes a plurality of connection propriety blocks corresponding to the plurality of logical connection propriety blocks. Each of the plurality of connection propriety blocks includes the plurality of connection propriety sub-blocks and a connectable quantity sub-block with a figure obtained by the adding-up operation. The figure of zero indicated in the plurality of connection propriety sub-blocks represents prohibition of a connection to an adjacent chip, and the figure of one indicated in the plurality of connection propriety sub-blocks represents permission of a connection to the adjacent chip. A figure in the connectable quantity sub-block represents a number of the chips adjacent to and permitted to connect to. The step (b) includes: (b1) outputting the search result data, based on the plurality of area image data, the figures indicated in the plurality of connection propriety sub-blocks and the figure indicated in the connectable quantity sub-block in the each of plurality of connection propriety block.

In the computer program product, the step (b) further includes: (b2) searching the plurality of connection propriety blocks in the connection propriety data for a single measurement block whose the connectable quantity sub-block indicates a figure of zero, (b3) specifying a block corresponding to the single measurement block in each of the plurality of area image data as a chip that a single measurement is executed, (b4) searching the plurality of connection propriety blocks in the connection propriety data, excluding the single measurement block, for first paired measurement blocks including of a first connection propriety block whose a connectable quantity sub-block indicates a figure of one and a connection propriety block adjacent to the first connection propriety block, (b5) specifying blocks corresponding to the first paired measurement blocks in each of the plurality of area image data as chips that a paired measurement is executed, (b6) searching the plurality of connection propriety blocks in the connection propriety data, excluding the single measurement block and the first paired measurement blocks, for second paired measurement blocks including of a second connection propriety block whose a connectable quantity sub-block indicates a figure of two and a connection propriety block adjacent to the second connection propriety block, (b7) specifying blocks corresponding to the second paired measurement blocks in each of the plurality of area image data as chips that the paired measurement is executed, (b8) searching the plurality of connection propriety blocks in the connection propriety data, excluding the single measurement block and the first to second paired measurement blocks, for third paired measurement blocks including of a third connection propriety block whose a connectable quantity sub-block indicates a figure of three and a connection propriety block adjacent to the third connection propriety block, (b9) specifying blocks corresponding to the third paired measurement blocks in each of the plurality of area image data as chips that the paired measurement is executed, (b10) searching the plurality of connection propriety blocks in the connection propriety data, excluding the single measurement block and the first to third paired measurement blocks, for fourth paired measurement blocks including of a fourth connection propriety block whose a connectable quantity sub-block indicates a figure of four and a connection propriety block adjacent to the fourth connection propriety block, and (b11) specifying blocks corresponding to the fourth paired measurement blocks in each of the plurality of area image data as chips that the paired measurement is executed, (b12) outputting the image data which includes the plurality of area image data specifying at least one of the single measurement block, and the first to fourth paired measurement blocks as the search result to an output device.

In the computer program product, the step (b) further includes: (b2) searching the plurality of connection propriety blocks in the connection propriety data for a single measurement block whose the connectable quantity sub-block indicates a figure of zero, (b3) specifying a block corresponding to the single measurement block in each of the plurality of area image data as a chip that a single measurement is executed, (b4) searching the plurality of connection propriety blocks in the connection propriety data, excluding the single measurement block, for first paired measurement blocks including of a first connection propriety block whose a connectable quantity sub-block indicates a figure of one and a connection propriety block adjacent to the first connection propriety block, (b5) specifying blocks corresponding to the first paired measurement blocks in each of the plurality of area image data as chips that a paired measurement is executed, (b6) searching the plurality of connection propriety blocks in the connection propriety data, excluding the single measurement block and the first paired measurement blocks, for second paired measurement blocks including of a second connection propriety block whose a connectable quantity sub-block indicates a figure of two and at least one of two connection propriety block adjacent to the second connection propriety block, (b7) specifying blocks corresponding to the second paired measurement blocks in each of the plurality of area image data as chips that the paired measurement is executed, (b8) searching the plurality of connection propriety blocks in the connection propriety data, excluding the single measurement block and the first to second paired measurement blocks, for third paired measurement blocks including of a third connection propriety block whose a connectable quantity sub-block indicates a figure of three and at least one of three connection propriety block adjacent to the third connection propriety block, (b9) specifying blocks corresponding to the third paired measurement blocks in each of the plurality of area image data as chips that the paired measurement is executed, (b10) searching the plurality of connection propriety blocks in the connection propriety data, excluding the single measurement block and the first to third paired measurement blocks, for fourth paired measurement blocks including of a fourth connection propriety block whose a connectable quantity sub-block indicates a figure of four and at least one of four connection propriety block adjacent to the fourth connection propriety block, (b11) specifying blocks corresponding to the fourth paired measurement blocks in each of the plurality of area image data as chips that the paired measurement is executed, and (b12) outputting the image data which includes the plurality of area image data specifying at least one of the single measurement block, and the first to fourth paired measurement blocks as the search result to an output device.

In the computer program product according to claim 13, wherein the each normal chip is a chip including an electronic circuit on the semiconductor wafer. The each abnormal chip is a chip not being able to include the electronic circuit on the semiconductor wafer.

In the computer program product, the each abnormal chip includes a test element group chip.

BRIEF DESCRIPTION OF THE DRAWINGS

FIG. 3 is a schematic diagram showing an image data in the embodiment of the semiconductor chip inspection supporting apparatus according to the present invention;

FIGS. 5 to 16 are schematic diagrams showing respective area connection status data in the embodiment of the semiconductor chip inspection supporting apparatus according to the present invention;

FIG. 19 is a schematic diagram showing a connection propriety data in the step S6 in the embodiment of the semiconductor chip inspection supporting apparatus according to the present invention;

FIG. 20 is a schematic diagram showing a connection propriety data in the step S7 in the embodiment of the semiconductor chip inspection supporting apparatus according to the present invention;

FIG. 22 is a schematic diagram showing search result data in the embodiment of the semiconductor chip inspection supporting apparatus according to the invention;

FIG. 23 is a schematic diagram showing an image data in another embodiment of the semiconductor chip inspection supporting apparatus according to the present invention;

FIG. 24 is a schematic diagram showing search result data in the other embodiment of the semiconductor chip inspection supporting apparatus according to the invention;

FIG. 30 is a schematic diagram showing an area connection status data in the other embodiment of the semiconductor chip inspection supporting apparatus according to the present invention.

DESCRIPTION OF THE PREFERRED EMBODIMENTS

Embodiments of a semiconductor chip inspection supporting apparatus according to the present invention will be described below with reference to the attached drawings.

Figure 1:
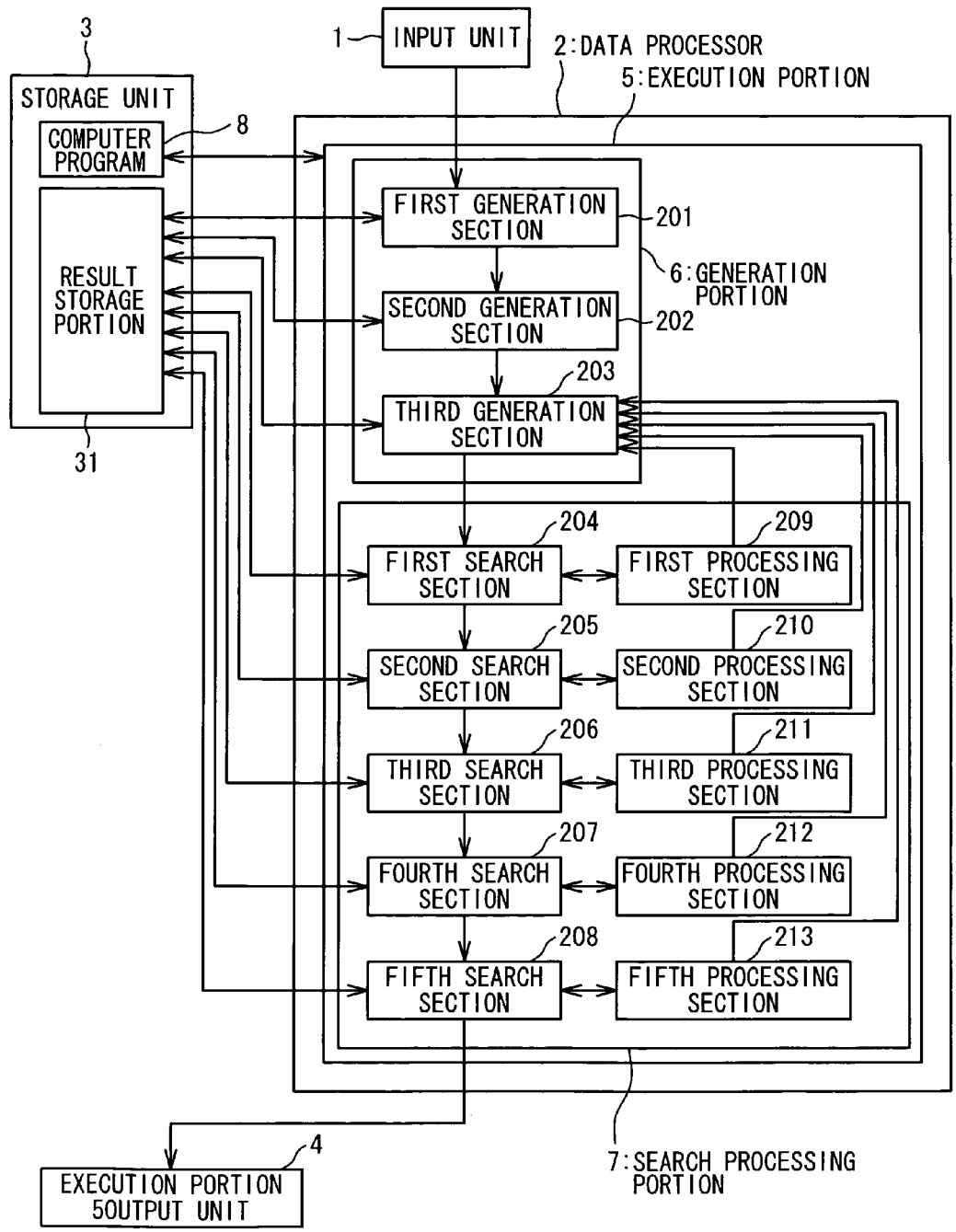
FIG. 1 is a block diagram showing a configuration in an embodiment of the semiconductor chip inspection supporting apparatus according to the present invention.

FIG. 1 is a block diagram showing the configuration in the embodiment of the semiconductor chip inspection supporting apparatus according to the present invention. The semiconductor chip inspection supporting apparatus includes an input unit 1, a data processor 2, a storage unit 3, and an output unit 4. At least one of the input unit 1, the storage unit 3, and the output unit 4 may be included in the data processor 2.

The input unit 1 includes a keyboard and a pointing device. By using the input unit 1, the user generates image data (to be described later) indicating a plurality of normal chips and a plurality of abnormal chips lying on a semiconductor wafer, and then outputs the image data to the data processor 2.

The storage unit 3 includes a result storage portion 31 into which data to be described later is stored. The storage unit 3 further includes a computer program 8.

The data processor 2 is a computer and includes an execution portion 5 for executing the computer program 8. A CPU (Central Processing Unit) is an example of the execution portion 5. The computer program 8 executed by the execution portion 5 includes a generation portion (generation program) 6 and a search processing portion (search processing program) 7.

The generation portion 6 stores image data outputted from the input unit 1 into the result storage portion 31. The image data indicates a layout of a plurality of normal chips and a plurality of abnormal chip on a semiconductor wafer. The generation portion 6 generates connection propriety data (to be described later) for prohibiting each of the plurality of the normal chips from being connected to an abnormal chip, based on the image data stored in the result storage portion 31. The generation portion 6 stores this connection propriety data into the result storage portion 31. This generation portion 6 includes a first generation section 201, a second generation section 202, and a third generation section 203. The operations performed by the first generation section 201, the second generation section 202, and the third generation section 203 will be described later.

The search processing portion 7 searches each of the plurality of the normal chips for a chip to be subjected to paired measurement based on the image data and connection propriety data both stored in the result storage portion 31, and then outputs search result data as search results (to be described later) to the output unit 4. The search processing portion 7 includes a first search section 204, a second search section 205, a third search section 206, a fourth search section 207, a fifth search section 208, a first processing section 209, a second processing section 210, a third processing section 211, a fourth processing section 212, and a fifth processing section 213. The operations performed by these sections (204 to 213) will be described later.

Examples of the output unit 4 include a display and a printer. In the case that the output unit 4 is a display, the output unit 4 displays the search result data provided from the data processor 2. In the case that the output unit 4 is a printer, the output unit 4 prints out the search result data provided from the data processor 2.

In the paired measurement, with a probe card (probe) being set on the normal chip and the abnormal chip, a voltage may be applied from the measuring instrument in some cases. In this case, a current leakage occurs. This results in the malfunction of the normal chip.

With the semiconductor chip inspection supporting apparatus of the present invention, the data processor 2 generates the connection propriety data, whereby each of the plurality of the normal chips is prohibited from being connected to the abnormal chip as a counterpart for paired measurement. The data processor 2 outputs the search result data obtained based on the image data and the connection propriety data to the output unit 4, thereby enabling paired measurement to be performed on each of the plurality of the normal chips while referring to the search results during the inspection. As described above, the semiconductor chip inspection supporting apparatus of the present invention enables to perform an inspection without causing the malfunction of the normal chip during paired measurement, for which reasons will be described in detail below.

Figure 3:
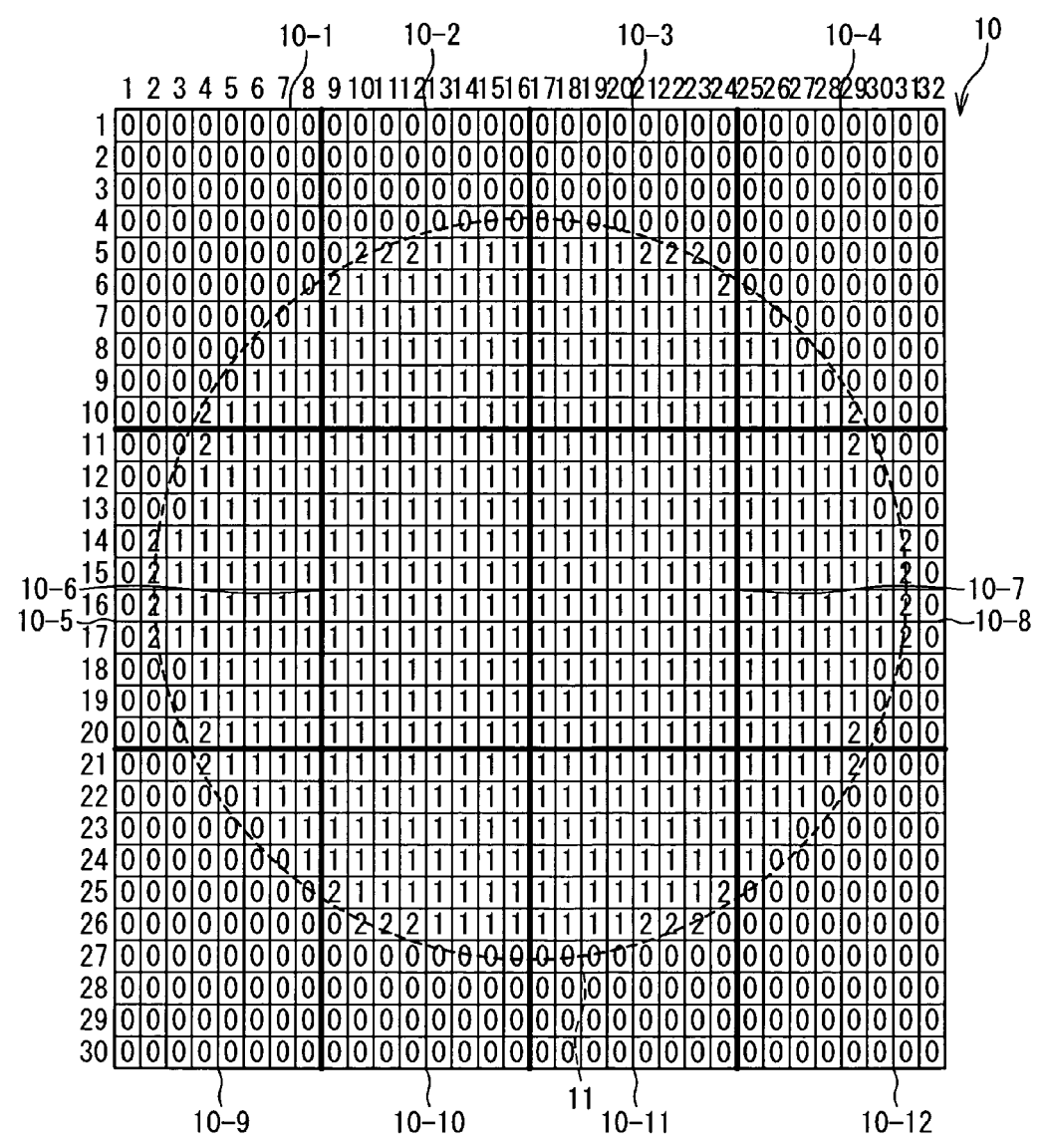

FIG. 3 is a schematic diagram showing the image data 10 provided from the input unit 1 to the data processor 2 in the embodiment of the semiconductor chip inspection supporting apparatus according to the present invention. The image data 10 includes, for example, blocks regularly arrayed in a matrix of 30 rows by 32 columns. The image data 10 is divided into 12 areas in correspondence with areas measured with the probe card, thus including a plurality of area image data 10-1 to 10-12. Each of the plurality of area image data 10-1 to 10-12 includes a plurality of blocks arrayed in a matrix of 8 rows by 10 columns. At least a part of the plurality of blocks overlaps with a wafer region representing the semiconductor wafer 11.

The blocks located in the 1st to 10th rows of the 1st to 8th columns included in the area image data 10-1 correspond to the blocks located in the 1st to 10th rows of the 1st to 8th columns among those blocks included in the image data 10.

For example, in the area image data 10-1, each of the blocks located in the 7th row of the 8th column, the 8th row of the 7th to 8th columns, the 9th rows of the 6th to 8th columns, and the 10th rows of the 5th to 8th columns represents that the chip lies on the semiconductor wafer 11, with a chip status data "1". The chip status data "1" indicates that the chip is normal. The block located in the 10th row of the 4th column included in the area image data 10-1 represents that the chip lies on the semiconductor wafer 11, with the chip status data "2". The chip status data "2" indicates that the chip is abnormal. In the area image data 10-1, each of the blocks other than those described above represents that the chip lies outside the semiconductor wafer 11, with the chip status data "0". The chip status data "0" indicates that the chip lies outside the semiconductor wafer 11.

The blocks located in the 1st to 10th rows of the 1st to 8th columns included in the area image data 10-2 correspond to the blocks located in the 1st to 10th rows of the 9th to 16th columns among those blocks included in the image data 10.

For example, in the area image data 10-2, each of the blocks located in the 5th row of the 5th to 8th columns, the 6th row of the 2nd to 8th columns, and the 7th to 10th rows of the 1st to 8th columns indicates that the chip status data is "1". Each of the blocks located in the 5th rows of the 2nd to 4th column and the 6th row of the 1st column in the area image data 10-2 indicates that the chip status data "2". In the area image data 10-2, each of the blocks other than those described above indicates that the chip status data "0".

The blocks located in the 1st to 10th rows of the 1st to 8th columns included in the area image data 10-3 correspond to the blocks located in the 1st to 10th rows of the 17th to 24th columns among those blocks included in the image data 10.

For example, each of the blocks located in the 5th row of the 1st to 4th columns, the 6th row of the 1st to 7th columns, and the 7th to 10th rows of the 1st to 8th columns in the area image data 10-3 indicates that the chip status data is "1". Each of the blocks located in the 5th row of the 5th to 7th columns and the 6th row of the 8th column in the area image data 10-3 indicates that the chip status data is "2". In the area image data 10-3, each of the blocks other than those described above indicates that the chip status data is "0".

The blocks located in the 1st to 10th rows of the 1st to 8th columns all included in the area image data 10-4 correspond to the blocks located in the 1st to 10th rows of the 25th to 32nd columns among those blocks included in the image data 10.

For example, each of the blocks located in the 7th row of the 1st column, the 8th row of the 1st to 2nd columns, the 9th row of the 1st to 3rd columns, and the 10th row of the 1st to 4th columns in the area image data 10-4 indicates that the chip status data is "1". The blocks located in the 10th row of the 5th column in the area image data 10-4 indicates that the chip status data is "2". In the area image data 10-4, each of the blocks other than those described above indicates that the chip status data is "0".

The blocks located in the 1st to 10th rows of the 1st to 8th columns included in the area image data 10-5 correspond to the blocks located in the 11th to 20th rows of the 1st to 8th columns among those blocks included in the image data 10.

For example, each of the blocks located in the 1st row of the 5th to 8th columns, the 2nd to 3rd rows of the 4th to 8th columns, the 4th to 7th rows of the 3rd to 8th columns, the 8th to 9th rows of the 4th to 8th columns, and the 10th row of the 5th to 8th columns in the area image data 10-5 indicates that the chip status data is "1". Each of the blocks located in the 4th to 7th rows of the 2nd column and the 10th row of the 4th column in the area image data 10-5 indicates that the chip status data is "2". In the area image data 10-5, each of the blocks other than those described above indicates that the chip status data is "0".

The blocks located in the 1st to 10th rows of the 1st to 8th columns included in the area image data 10-6 correspond to the blocks located in the 11th to 20th rows of the 9th to 16th columns among those blocks included in the image data 10.

For example, each of the blocks located in the 1st to 10th rows of the 1st to 8th columns in the area image data 10-6 indicates that the chip status data is "1".

The blocks located in the 1st to 10th rows of the 1st to 8th columns included in the area image data 10-7 correspond to the blocks located in the 11th to 20th rows of the 17th to 24th columns among those blocks included in the image data 10.

For example, each of the blocks located in the 1st to 10th rows of the 1st to 8th columns in the area image data 10-7 indicates that the chip status data is "1".

The blocks located in the 1st to 10th rows of the 1st to 8th columns included in the area image data 10-8 correspond to the blocks located in the 11th to 20th rows of the 25th to 32nd columns among those blocks included in the image data 10.

For example, each of the blocks located in the 1st row of the 1st to 4th columns, the 2nd to 3rd rows of the 1st to 5th columns, the 4th to 7th rows of the 1st to 6th columns, the 8th to 9th rows of the 1st to 5th columns, and the 10th row of the 1st to 4th columns in the area image data 10-8 indicates that the chip status data is "1". Each of the blocks located in the 1st row of the 5th column, the 4th to 7th rows of the 7th column and the 10th row of the 5th column in the area image data 10-8 indicates that the chip status data is "2". In the area image data 10-8, each of the blocks other than those described above indicates that the chip status data is "0".

The blocks located in the 1st to 10th rows of the 1st to 8th columns included in the area image data 10-9 correspond to the blocks located in the 21st to 30th rows of the 1st to 8th columns among those blocks included in the image data 10.

For example, each of the blocks located in the 1st row of the 5th to 8th columns, the 2nd row of the 6th to 8th columns, the 3rd row of the 7th to 8th columns, and the 4th row of the 8th column in the area image data 10-9 indicates that the chip status data is "1". The block located in the 1st row of the 4th column in the area image data 10-9 indicates that the chip status data is "2". In the area image data 10-9, each of the blocks other than those described above indicates that the chip status data is "0".

The blocks located in the 1st to 10th rows of the 1st to 8th columns included in the area image data 10-10 correspond to the blocks located in the 21st to 30th rows of the 9th to 16th columns among those blocks included in the image data 10.

For example, each of the blocks located in the 1st to 4th rows of the 1st to 8th columns, the 5th row of the 2nd to 8th columns, and the 6th row of the 5th to 8th columns in the area image data 10-10 indicates that the chip status data is "1". Each of the blocks located in the 5th row of the 1st column and the 6th row of the 2nd to 4th columns in the area image data 10-10 indicates that the chip status data is "2". In the area image data 10-10, each of the blocks other than those described above indicates that the chip status data is "0".

The blocks located in the 1st to 10th rows of the 1st to 8th columns included in the area image data 10-11 correspond to the blocks located in the 21st to 30th rows of the 17th to 24th columns among those blocks included in the image data 10.

For example, each of the blocks located in the 1st to 4th rows of the 1st to 8th columns, the 5th row of the 1st to 7th columns, and the 6th row of the 1st to 4th columns in the area image data 10-11 indicates that the chip status data is "1". Each of the blocks located in the 5th row of the 8th column and the 6th row of the 5th to 7th columns in the area image data 10-11 indicates that the chip status data is "2". In the area image data 10-11, each of the blocks included other than those described above indicates that the chip status data is "0".

The blocks located in the 1st to 10th rows of the 1st to 8th columns included in the area image data 10-12 correspond to the blocks located in the 21st to 30th rows of the 25th to 32nd columns among those blocks included in the image data 10.

For example, each of the blocks located in the 1st row of the 1st to 4th columns, the 2nd row of the 1st to 3rd columns, the 3rd row of the 1st to 2nd columns, and the 4th row of the 1st column in the area image data 10-12 indicates that the chip status data is "1". The blocks located in the 1st row of the 5th column in the area image data 10-12 indicates that the chip status data is "2". In the area image data 10-12, each of the blocks other than those described above indicates that the chip status data is "0".

Figure 4:
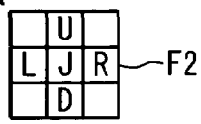
FIG. 4 is a schematic diagram showing a set area connection status data prestored in a storage unit in the embodiment of the semiconductor chip inspection supporting apparatus according to the present invention.

The result storage portion 31 of the storage unit 3 stores prestored set area connection status data 12 therein. FIG. 4 is a schematic diagram showing a set area connection status data 12 prestored in a result storage portion 31 of a storage unit 3 in the embodiment of the semiconductor chip inspection supporting apparatus according to the present invention. The set area connection status data 12 includes a plurality of connection status blocks arrayed in a matrix of 10 rows by 8 columns in correspondence with the plurality of blocks included in each of the area image data 10-1 to 10-12.

As shown in F2 of FIG. 4, each of the plurality of connection status blocks included in the set area connection status data 12 includes a plurality of connection status sub-blocks: "U", "D", "L" and "R". Assuming that F2 is a chip (target chip) representing one of the plurality of connection status blocks, the connection status sub-block "U" indicates the relationship with an adjacent chip located above the target chip F2, the connection status sub-block "D" indicates the relationship with an adjacent chip located below the target chip F2, the connection status sub-block "L" indicates the relationship with an adjacent chip located to the left of the target chip F2, and the connection status sub-block "R1" indicates the relationship with an adjacent chip located to the right of the target chip F2.

As shown in F1 of FIG. 4, among the plurality of connection status sub-blocks "U", "D", "L" and "R" of each of the plurality of connection status blocks included in the set area connection status data 12, the connection status sub-block corresponding to an end portion of the area measured with the probe card previously indicates a figure "0". The figure "0" represents prohibition of connection to an adjacent chip.

More specifically, the connection status sub-block "U" of each of the connection status blocks located in the 1st row of the 1st to 8th columns in the set area connection status data 12 previously indicates a figure "0". The connection status sub-block "D" of each of the connection status blocks located in the 10th row of the 1st to 8th columns in the set area connection status data 12 previously indicates a figure "0". The connection status sub-block "L" of each of the connection status blocks located in the 1st to 10th rows of the 1st column in the set area connection status data 12 previously indicates a figure "0". The connection status sub-block "R" of each of the connection status blocks located in the 1st to 10th rows of the 8th column all included in the set area connection status data 12 previously indicates a FIG.

In the set area connection status data 12, each of the connection status sub-blocks, indicating one of "U", "D", "L" and "R", other than those described above previously indicates a figure "1". The figure "1" represents permission of connection to an adjacent chip.

As shown in F2 of FIG. 4, each of the plurality of connection status blocks in the set area connection status data 12 further includes a connectable quantity sub-block "J". The connectable quantity sub-block "J" indicates the number (quantity) of adjacent chips permitted to be connected with, and obtained by adding up the figures in the connection status sub-blocks "U", "D", "L" and "R" in a connection status block.

The connectable quantity sub-block "J" of each of the connection status blocks located in the 2nd to 9th rows of the 2nd to 7th columns in the set area connection status data 12 previously indicates a figure "4". The connectable quantity sub-block "J" of each of the connection status blocks located in the 1st row of the 2nd to 7th columns, the 10th row of the 2nd to 7th columns, the 2nd to 9th rows of the 1st column, and the 2nd to 9th rows of the 8th column in the set area connection status data 12 previously indicates a figure "3". The connectable quantity sub-block "J" of each of the connection status blocks located in the 1st row of the 1st column, the 1st row of the 10th column, the 10th row of the 1st column, and the 10th row of the 10th column in the set area connection status data 12 previously indicates a figure "2".

Figure 2:
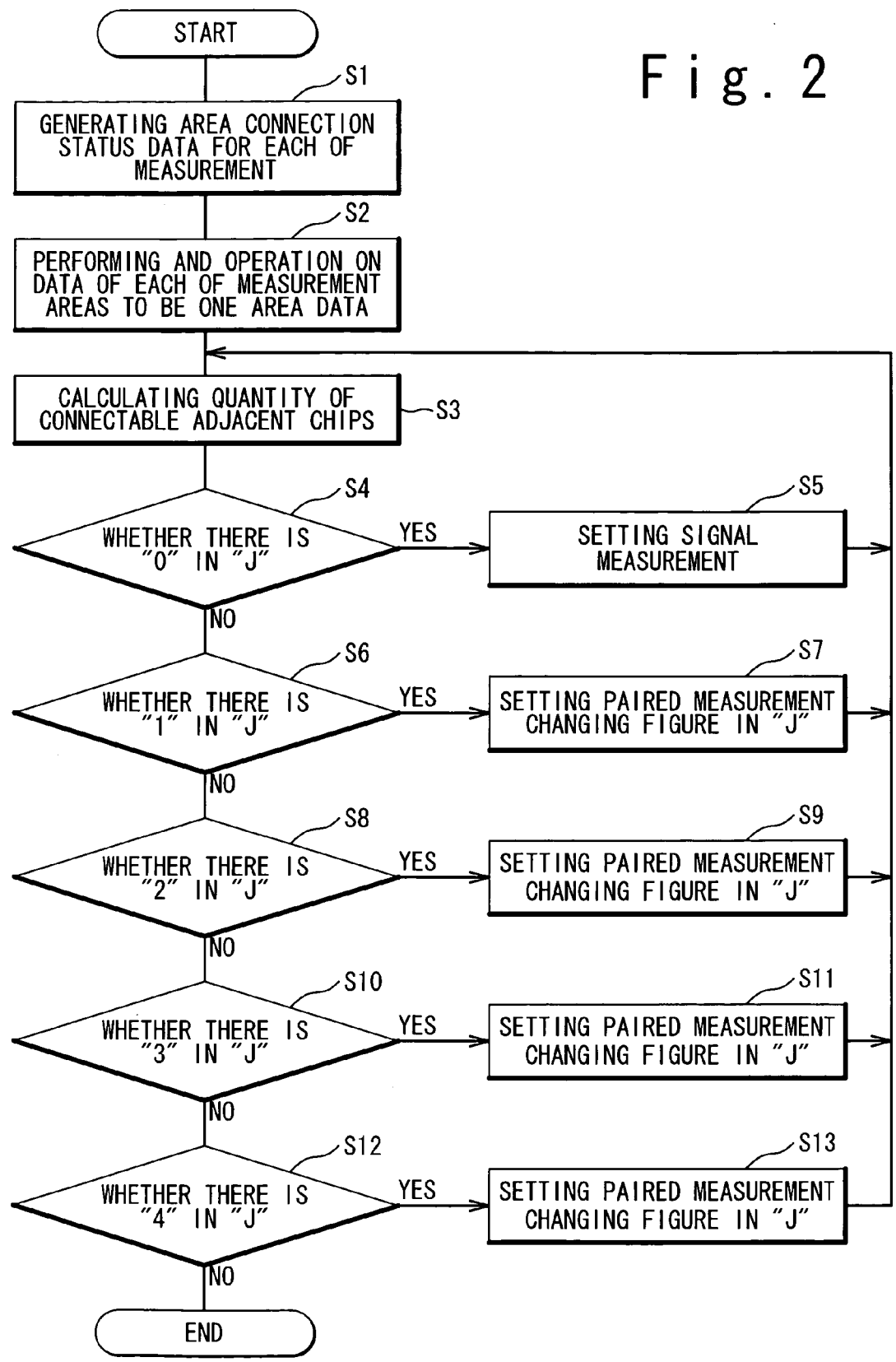
FIG. 2 is a flowchart showing an operation in the embodiment of the semiconductor chip inspection supporting apparatus according to the present invention.

Next, referring to FIGS. 1 to 22, an operation in this embodiment according to the present invention will be described in detail. In FIGS. 5 to 20, each of the figures (numerals) which are changed during the operation is written inside the circle. FIG. 2 is a flowchart showing the operation in the embodiment of the semiconductor chip inspection supporting apparatus according to the present invention. The probe card is initially conditioned for single measurement.

First, the input unit 1 provides the image data 10 (input data) to the generation portion 6 of the data processor 2. Then, the first generation section 201 of the generation portion 6 examines each of the plurality of area image data 10-1 to 10-12 in the image data 10 for identifying, from among a plurality of blocks, a block representing a normal chip and a block representing an abnormal chip that are adjacent to each other. Then, the first generation section 201 generates a plurality of area connection status data 14-1 to 14-12. After that, the first generation section 201 stores these data into the result storage portion 31 of the storage unit 3 (step S1). FIGS. 5 to 16 are schematic diagrams showing respective area connection status data 14-1 to 14-12 generated by the data processor 2 in the embodiment of the semiconductor chip inspection supporting apparatus according to the present invention. This operation will be described in detail below.

In the step S1, the first generation section 201 reads out the set area connection status data 12 as the area connection status data 14-1 from the result storage portion 31.

The first generation section 201 examines the plurality of blocks in the area image data 10-1 for a block indicating chip status data "1" (block representing a normal chip) and a block indicating chip status data "2" (block representing an abnormal block) that are adjacent to each other. Consequently, the first generation section 201 identifies that the adjacent blocks are the blocks located in the 10th row of the 4th column and the 10th row of the 5th column.

Figure 5:
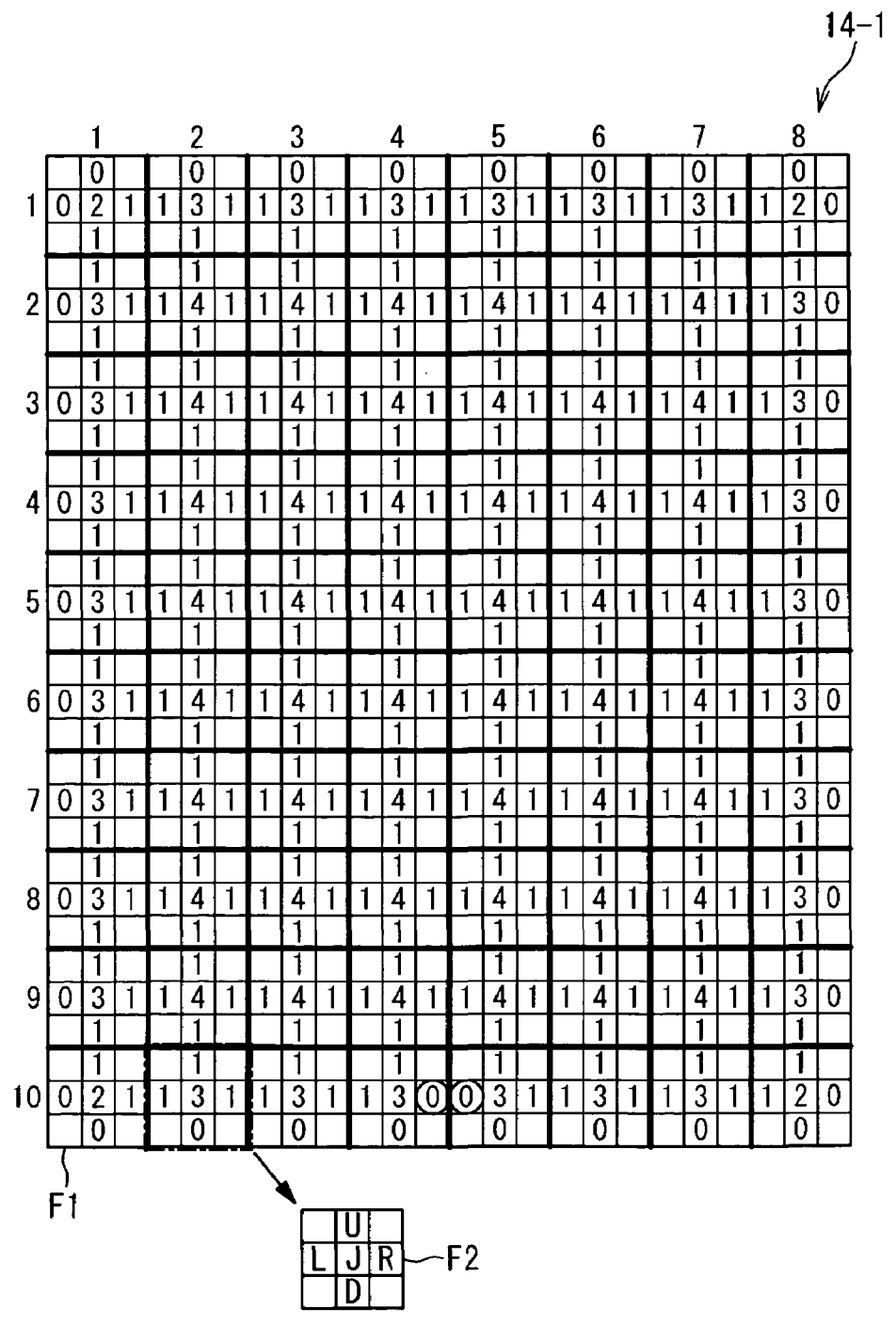

As a result, as shown in FIG. 5, the first generation section 201 changes (sets) the figure "1", which is indicated in each of the connection status sub-block "R" of the connection status block in the 10th row of the 4th column and the connection status sub-block "L" of the connection status block in the 10th row of the 5th column in the area connection status data 14-1, to a figure "0". The first generation section 201 stores this area connection status data 14-1 into the result storage portion 31.

In the step S1, the first generation section 201 reads out the set area connection status data 12 as the area connection status data 14-2 from the result storage portion 31.

The first generation section 201 examines the plurality of blocks in the area image data 10-2 for a block indicating chip status data "1" and a block indicating chip status data "2" that are adjacent to each other. Consequently, the first generation section 201 identifies that the adjacent blocks are the blocks located in the 5th row of the 2nd column and the 6th row of the 2nd column, the blocks located in the 5th row of the 3rd column and the 6th row of the 3rd column, the blocks located in the 5th row of the 4th column and the 6th row of the 4th column, the blocks located in the 6th row of the 1st column and the 6th row of the 2nd column, the blocks located in the 5th row of the 4th column and the 5th row of the 5th column, and the blocks located in the 6th row of the 1st column and the 7th row of the 1st column.

Figure 6:
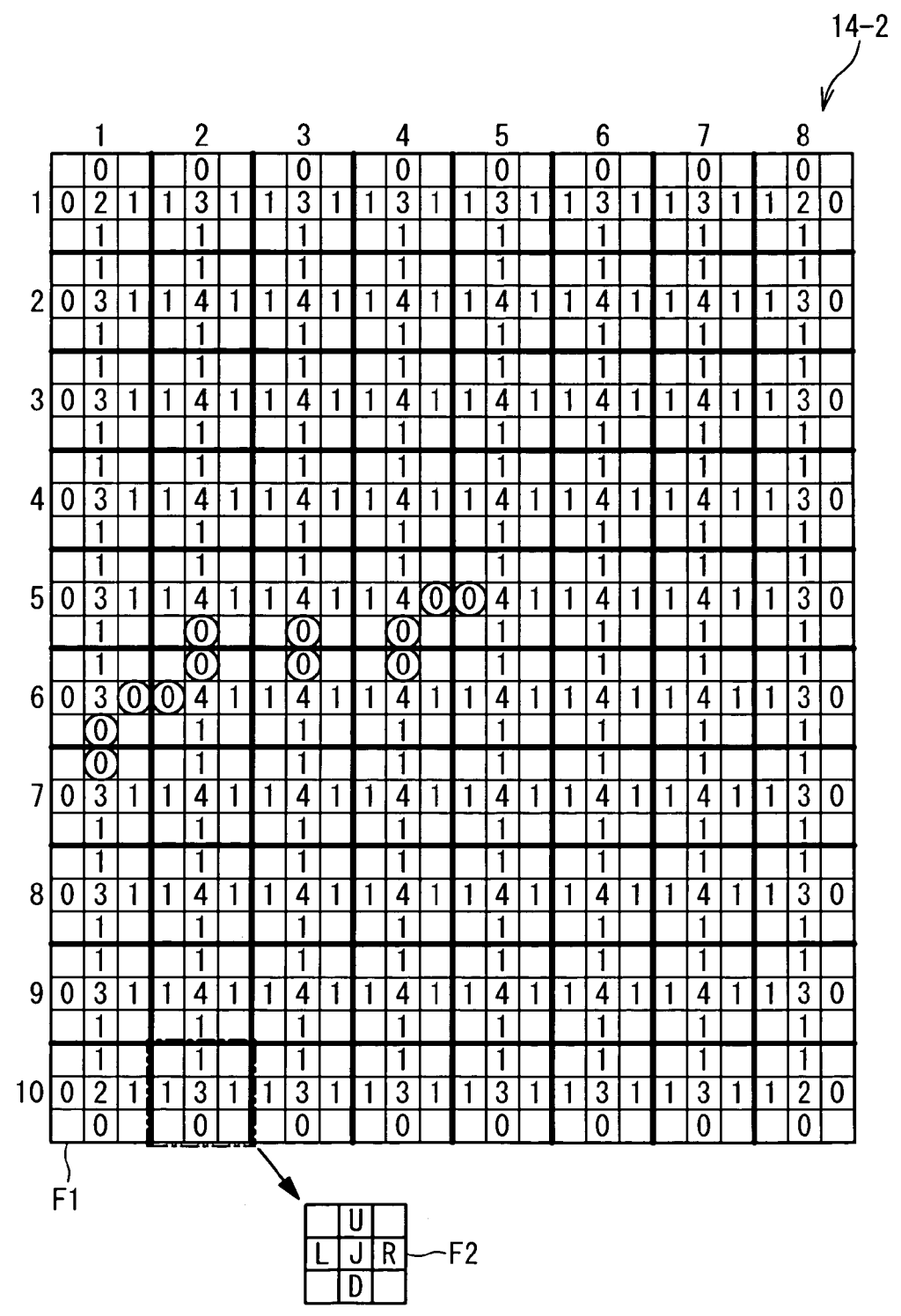

As a result, as shown in FIG. 6, the first generation section 201 changes (sets) the figure "1", which is indicated in each of the connection status sub-blocks "D" of the connection status blocks in the 5th row of the 2nd to 4th columns and the 6th row of the 1st column, the connection status sub-blocks "U" of the connection status blocks in the 6th row of the 2nd to 4th columns and the 7th row of the 1st column, the connection status sub-blocks "R" of the connection status blocks in the 6th row of the 1st column and the 5th row of the 4th column, and the connection status sub-blocks "L" of the connection status blocks in the 6th row of the 2nd column and the 5th row of the 5th column in the area connection status data 14-2, to a figure "0". The first generation section 201 stores this area connection status data 14-2 into the result storage portion 31.

In the step S1, the first generation section 201 reads out the set area connection status data 12 as the area connection status data 14-3 from the result storage portion 31.

The first generation section 201 examines the plurality of blocks in the area image data 10-3 for a block indicating chip status data "1" and a block indicating chip status data "2" that are adjacent to each other. Consequently, the first generation section 201 identifies that the adjacent blocks are the blocks located in the 5th row of the 5th column and the 6th row of the 5th column, the blocks located in the 5th row of the 6th column and the 6th row of the 6th column, the blocks located in the 5th row of the 7th column and the 6th row of the 7th column, the blocks located in the 6th row of the and 8th column and the 7th row of the 8th column, the blocks located in the 6th row of the 7th column and the 6th row of the 8th column, and the blocks located in the 5th row of the 4th column and the 5th row of the 5th column.

Figure 7:
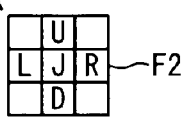

As a result, as shown in FIG. 7, the first generation section 201 changes (sets) the figure "1", which is indicated in each of the connection status sub-blocks "D" of the connection status blocks in the 5th row of the 5th to 7th columns and the 6th row of the 8th column, the connection status sub-blocks "U" of the connection status blocks in the 6th row of the 5th to 7th columns and the 7th row of the 8th column, the connection status sub-blocks "R" of the connection status blocks in the 6th row of the 7th column and the 5th row of the 4th column, and the connection status sub-blocks "L" of the connection status blocks in the 6th row of the 8th column and the 5th row of the 5th column in the area connection status data 14-3, to a figure "0". The first generation section 201 stores this area connection status data 14-3 into the result storage portion 31.

In the step S1, the first generation section 201 reads out the set area connection status data 12 as the area connection status data 14-4 from the result storage portion 31.

The first generation section 201 examines the plurality of blocks in the area image data 10-4 for a block indicating chip status data "1" and a block indicating chip status data "2" that are adjacent to each other. Consequently, the first generation section 201 identifies that the adjacent blocks are the blocks located in the 10th row of the 4th column and the 10th row of the 5th column.

Figure 8:
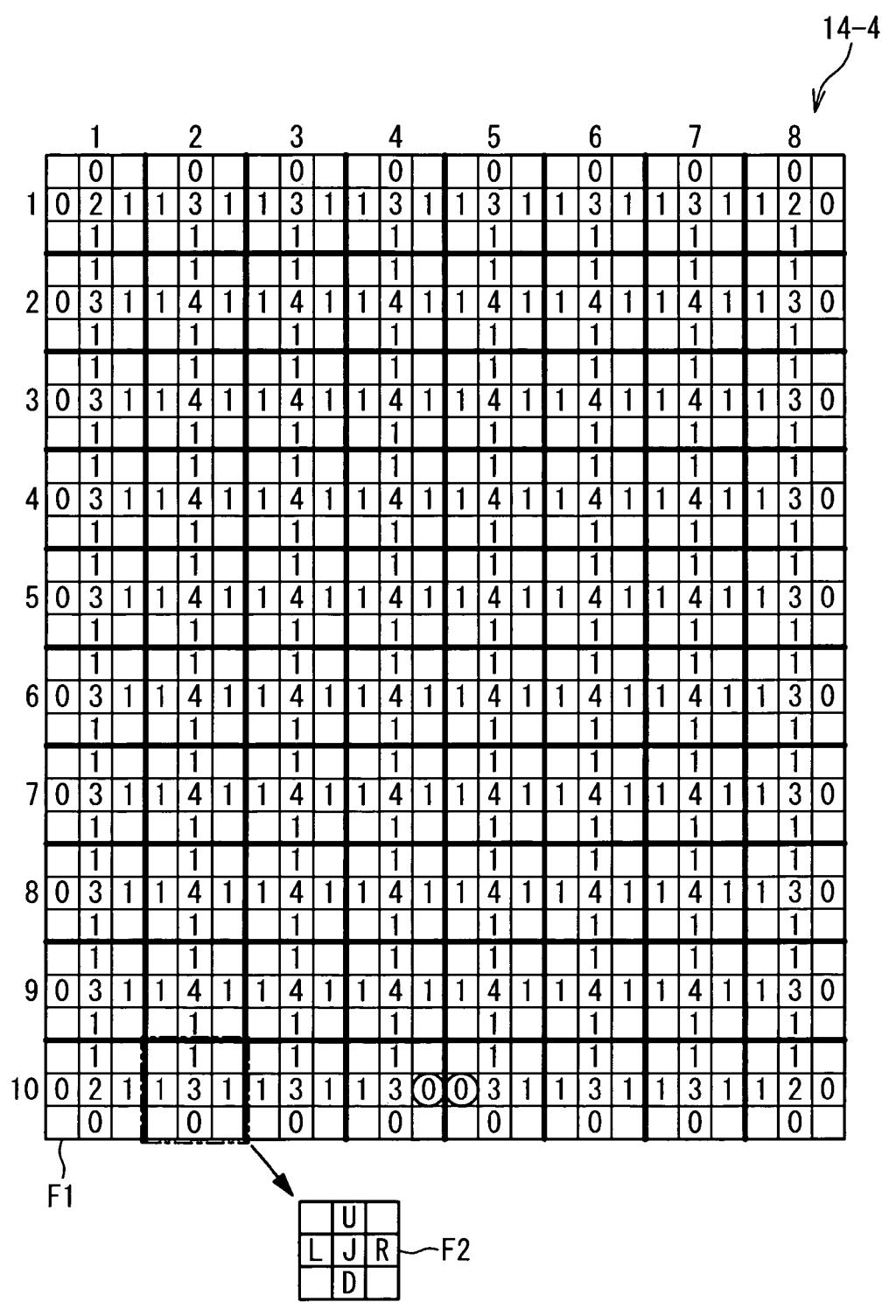

As a result, as shown in FIG. 8, the first generation section 201 changes (sets) the figure "1", which is indicated in each of the connection status sub-block "R" of the connection status block in the 10th row of the 4th column and the connection status sub-block "L" of the connection status block in the 10th row of the 5th column both included in the area connection status data 14-4, to a figure "0". The first generation section 201 stores this area connection status data 14-4 into the result storage portion 31.

In the step S1, the first generation section 201 reads out the set area connection status data 12 as the area connection status data 14-5 from the result storage portion 31.

The first generation section 201 examines the plurality of blocks included in the area image data 10-5 for a block indicating chip status data "1" and a block indicating chip status data "2" that are adjacent to each other. Consequently, the first generation section 201 identifies that the adjacent blocks are the blocks located in the 4th row of the 2nd column and the 4th row and 3rd column, the blocks located in the 5th row of the 2nd column and the 5th row of the 3rd column, the blocks located in the 6th row of the 2nd column and the 6th row of the 3rd column, the blocks located in the 7th row of the 2nd column and the 7th row of the 3rd column, the blocks located in the 1st row of the 4th column and the 1st row of the 5th column, the blocks located in the 1st row of the 4th column and the 2nd row of the 4th column, the blocks located in the 10th row of the 4th column and the 10th row of the 5th column, and the blocks located in the 10th row of the 4th column and the 9th row of the 4th column.

Figure 9:
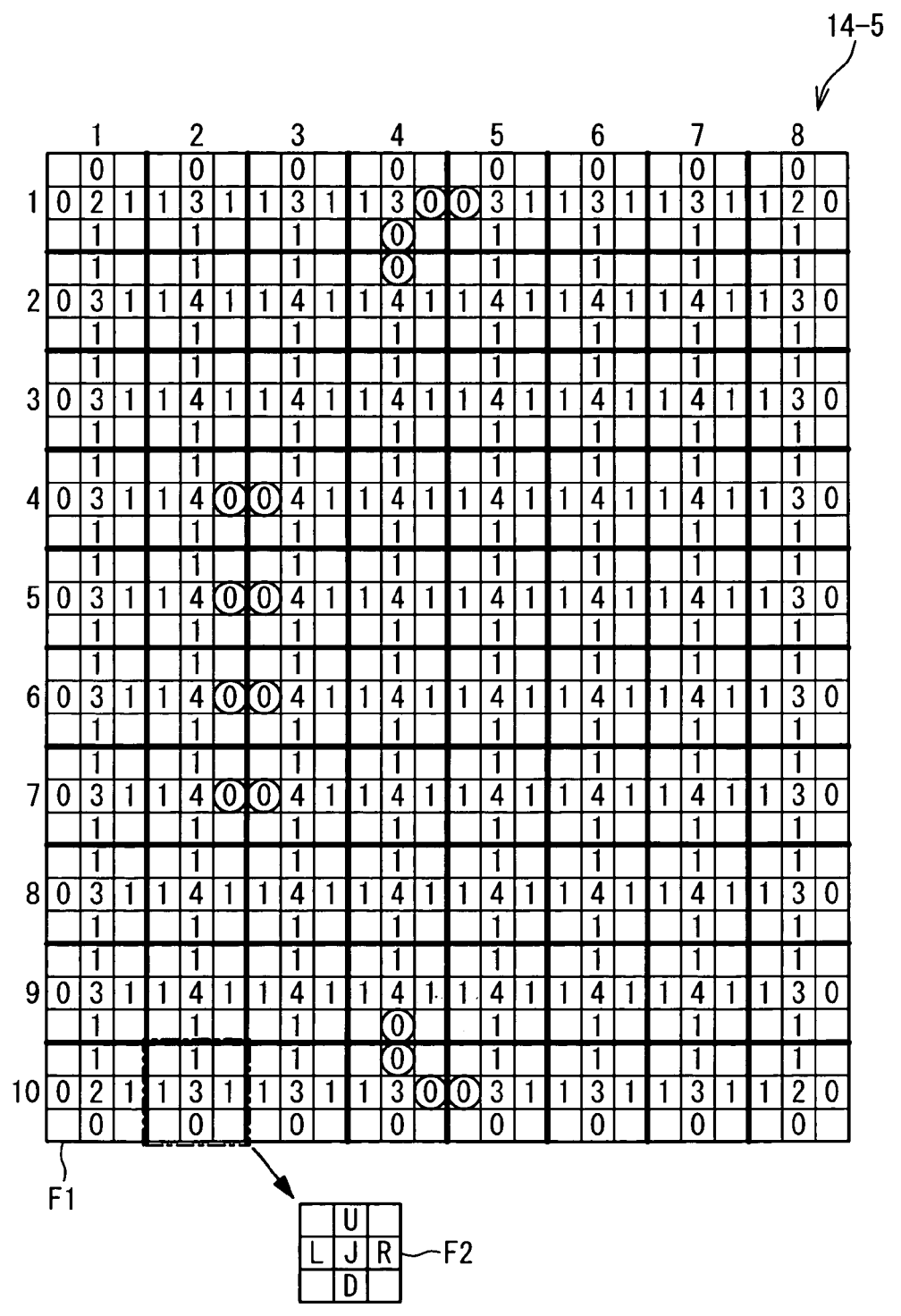

As a result, as shown in FIG. 9, the first generation section 201 changes (sets) the figure "1", which is indicated in each of the connection status sub-blocks "D" of the connection status blocks in the 1st row of the 4th column and the 9th row of the 4th column, the connection status sub-blocks "U" of the connection status blocks in the 2nd row of the 4th column and the 10th row of the 4th column, the connection status sub-blocks "R" of the connection status blocks in the 4th to 7th rows of the 2nd column, the 1st row of the 4th column, and the 10th row of the 4th column, and the connection status sub-blocks "L" of the connection status blocks in the 4th to 7th rows of the 3rd column, the 1st row of the 5th column, and the 10th row of the 5th column in the area connection status data 14-5, to a figure "0". The first generation section 201 stores this area connection status data 14-5 into the result storage portion 31.

In the step S1, the first generation section 201 reads out the set area connection status data 12 as the area connection status data 14-6 from the result storage portion 31.

The first generation section 201 examines the plurality of blocks included in the area image data 10-6 for a block indicating chip status data "1" and a block indicating chip status data "2" that are adjacent to each other. Consequently, the first generation section 201 identifies that there are no corresponding blocks.

Figure 10:
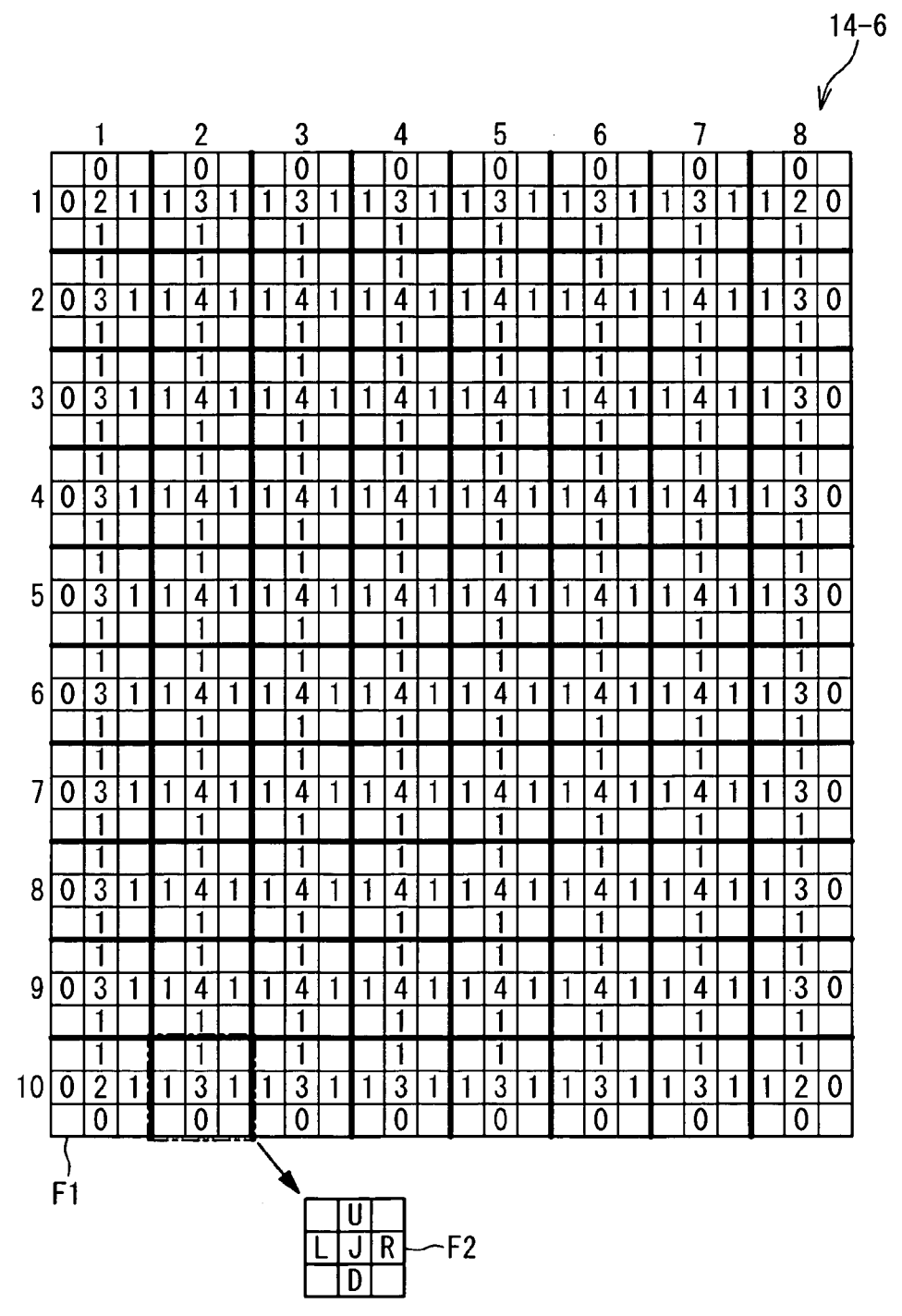

As a result, as shown in FIG. 10, the first generation section 201 stores this area connection status data 14-6 into the result storage portion 31 without making any changes therein.

In the step S1, the first generation section 201 reads out the set area connection status data 12 as the area connection status data 14-7 from the result storage portion 31.

The first generation section 201 examines the plurality of blocks included in the area image data 10-7 for a block indicating chip status data "1" and a block indicating chip status data "2" that are adjacent to each other. Consequently, the first generation section 201 identifies that there are no corresponding blocks.

Figure 11:
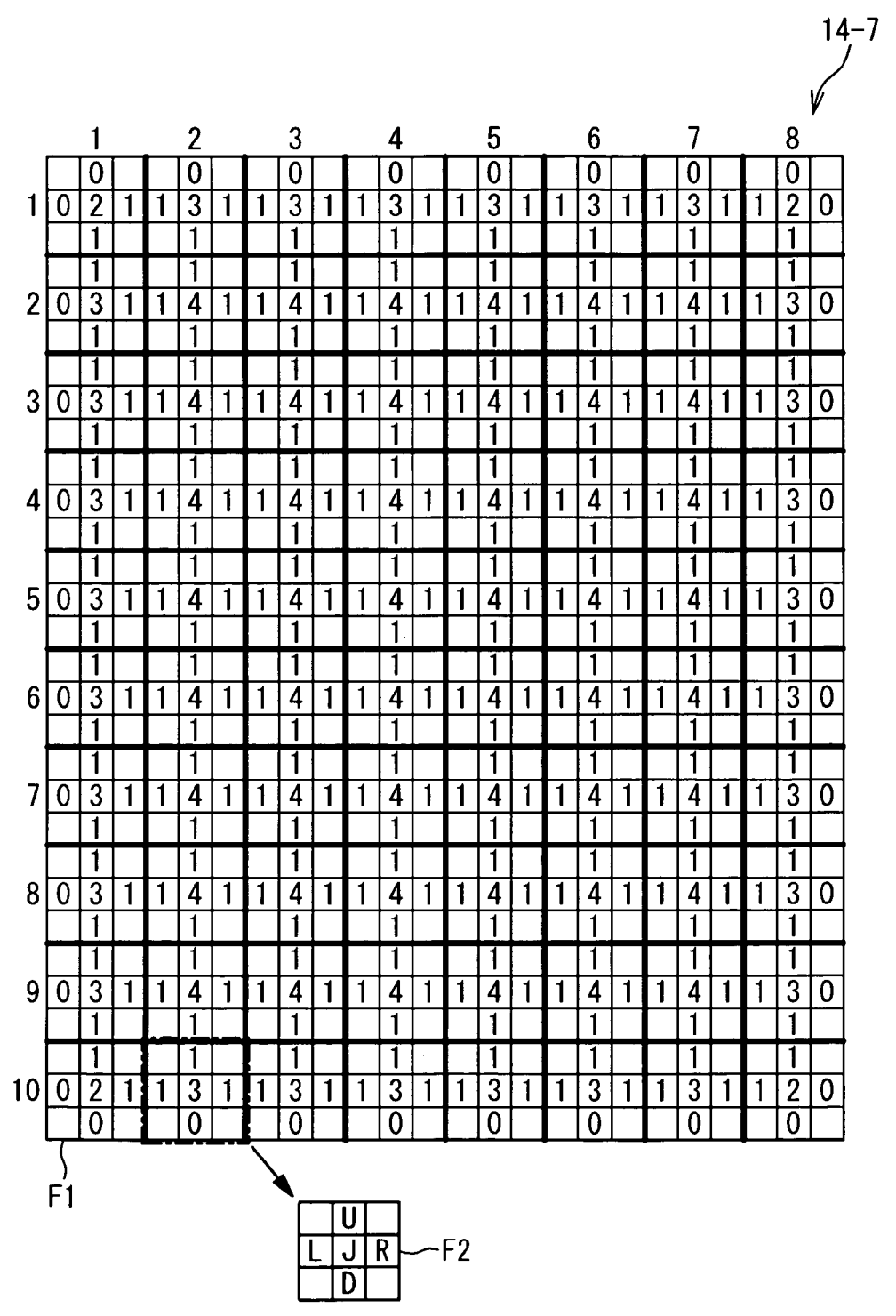

As a result, as shown in FIG. 11, the first generation section 201 stores this area connection status data 14-7 into the result storage portion 31 without making any changes therein.

In the step S1, the first generation section 201 reads out the set area connection status data 12 as the area connection status data 14-8 from the result storage portion 31.

The first generation section 201 examines the plurality of blocks included in the area image data 10-8 for a block indicating chip status data "1" and a block indicating chip status data "2" that are adjacent to each other. Consequently, the first generation section 201 identifies that the adjacent blocks are the blocks located in the 4th row of the 6th column and the 4th row of the 7th column, the blocks located in the 5th row of the 6th column and the 5th row of the 7th column, the blocks located in the 6th row of the 6th column and the 6th row of the 7th column, the blocks located in the 7th row of the 6th column and the 7th row of the 7th column, the blocks located in the 1st row of the 4th column and the 1st row of the 5th column, the blocks located in the 1st row of the 5th column and the 2nd row of the 5th column, the blocks located in the 10th row of the 4th column and the 10th row of the 5th column, and the blocks located in the 10th row of the 5th and the 9th row of the 5th column.

Figure 12:
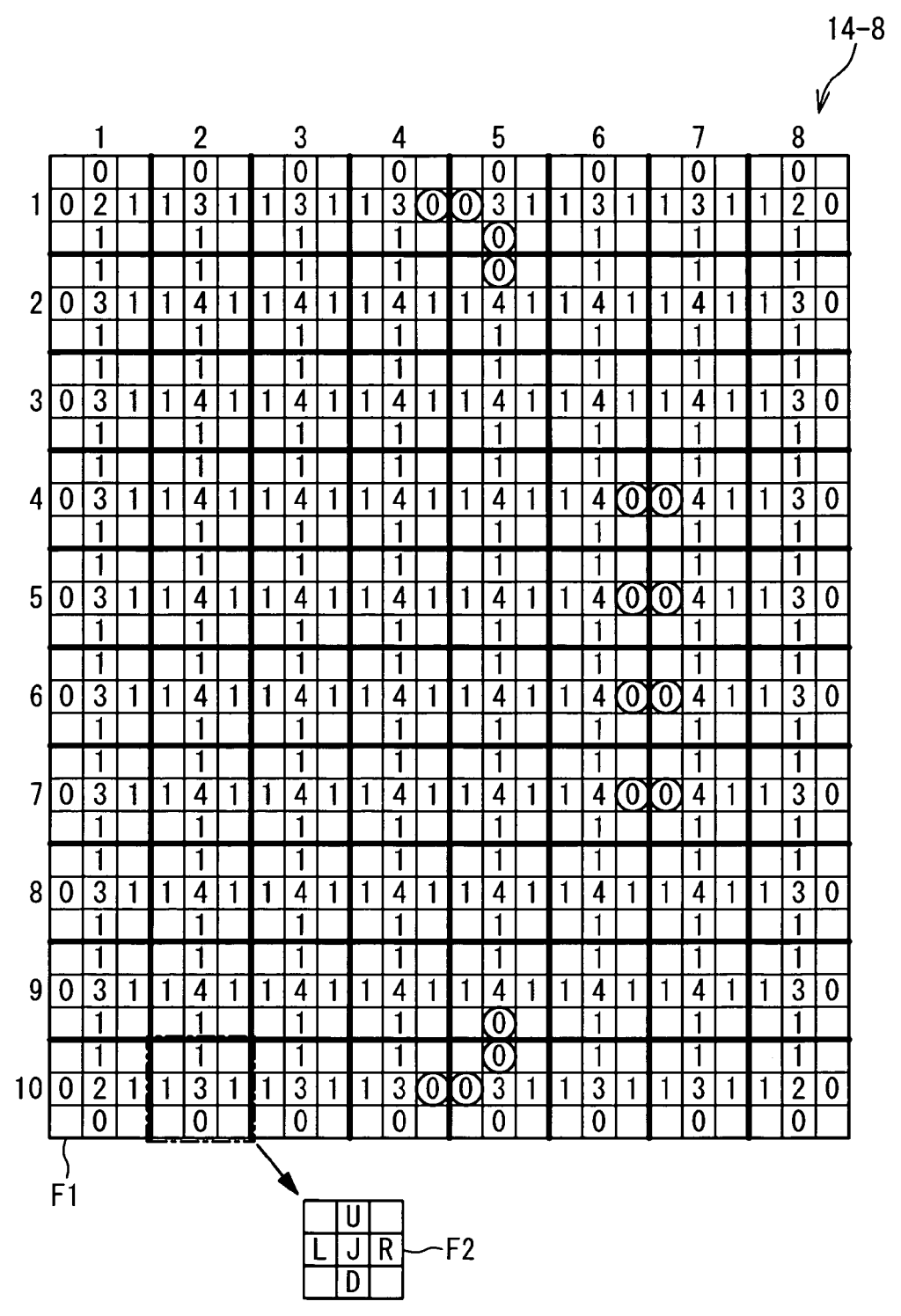

As a result, as shown in FIG. 12, the first generation section 201 changes (sets) the figure "1", which is indicated in each of the connection status sub-blocks "D" of the connection status blocks in the 1st row of the 5th column and the 9th row of the 5th column, the connection status sub-blocks "U" of the connection status blocks in the 2nd row of the 5th column and the 10th row of the 5th column, the connection status sub-blocks "R" of the connection status blocks in the 4th to 7th rows of the 6th column, the 1st row of the 4th column, and the 10th row of the 4th column, and the connection status sub-blocks "L" of the connection status blocks in the 4th to 7th rows of the 7th column, the 1st row of the 5th column, and the 10th row of the 5th column in the area connection status data 14-8, to a figure "0". The first generation section 201 stores this area connection status data 14-8 into the result storage portion 31.

In the step S1, the first generation section 201 reads out the set area connection status data 12 as the area connection status data 14-9 from the result storage portion 31.

The first generation section 201 examines the plurality of blocks in the area image data 10-9 for a block indicating chip status data "1" and a block indicating chip status data "2" that are adjacent to each other. Consequently, the first generation section 201 identifies that the adjacent blocks are the blocks located in the 1st row of the 4th column and the 1st row of the 5th column.

Figure 13:
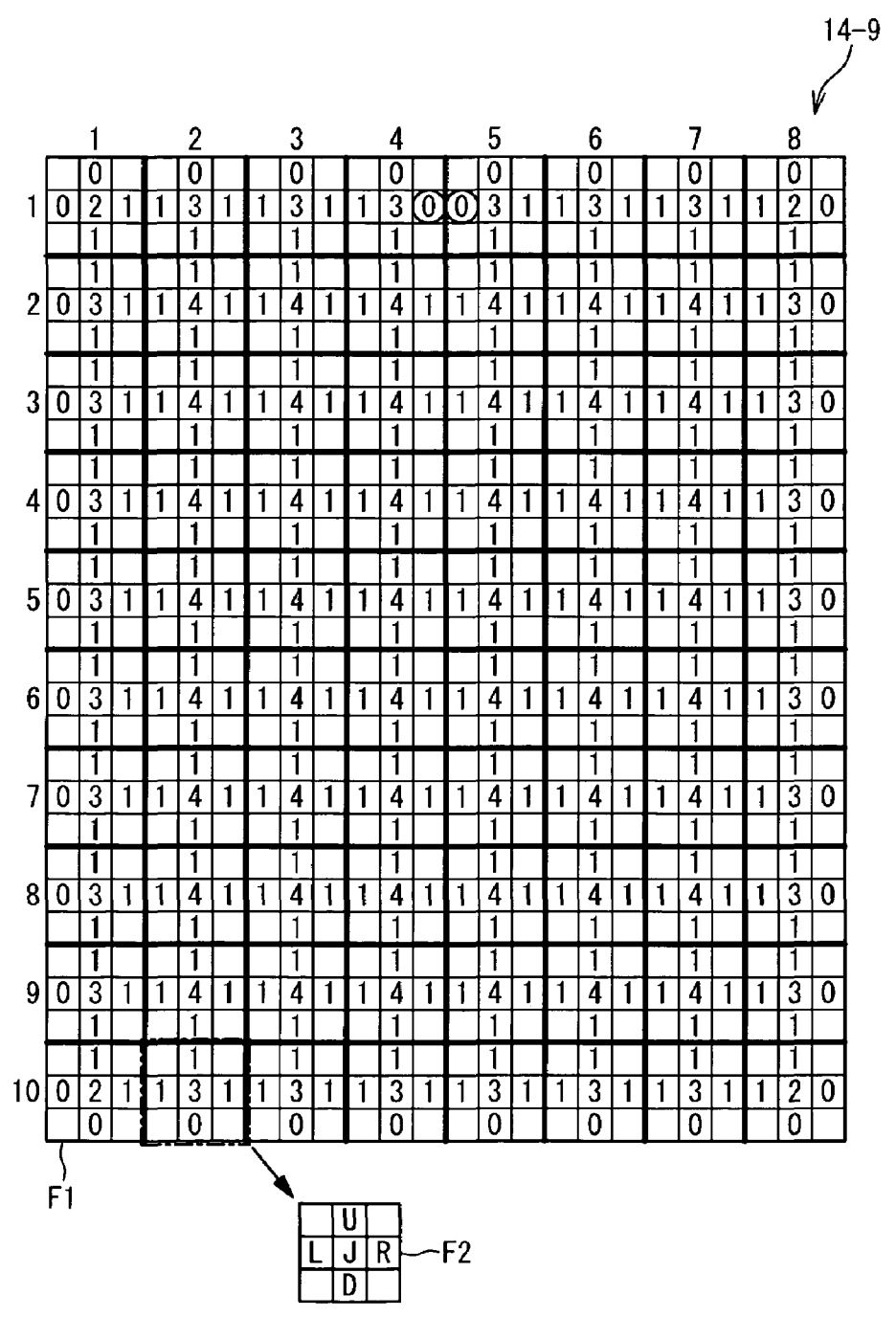

As a result, as shown in FIG. 13, the first generation section 201 changes (sets) the figure "1", which is indicated in each of the connection status sub-block "R" of the connection status block in the 1st row of the 4th column and the connection status sub-block "L" of the connection status block in the 1st row of the 5th column in the area connection status data 14-9, to a figure "0". The first generation section 201 stores this area connection status data 14-9 into the result storage portion 31.

In the step S1, the first generation section 201 reads out the set area connection status data 12 as the area connection status data 14-10 from the result storage portion 31.

The first generation section 201 examines the plurality of blocks included in the area image data 10-10 for a block indicating chip status data "1" and a block indicating chip status data "2" that are adjacent to each other. Consequently, the first generation section 201 identifies that the adjacent blocks are the blocks located in the 5th row of the 2nd column and the 6th row of the 2nd column, the blocks located in the 5th row of the 3rd column and the 6th row of the 3rd column, the blocks located in the 5th row of the 4th column and the 6th row of the 4th column, the blocks located in the 5th row of the 1st column and the 5th row of the 2nd column, the blocks located in the 6th row of the 4th column and the 6th row of the 5th column, and the blocks located in the 4th row of the 1st column and the 5th row of the 1st column.

As a result, as shown in FIG. 6, the first generation section 201 changes (sets) the figure "1", which is indicated in each of the connection status sub-blocks "D" of the connection status blocks in the 5th row of the 2nd to 4th columns and the 4th row of the 1st column, the connection status sub-blocks "U" of the connection status blocks in the 6th row of the 2nd to 4th columns and the 5th row of the 1st column, the connection status sub-blocks "R" of the connection status blocks in the 5th of the 1st column and the 6th row of the 4th column, and the connection status sub-blocks "L" of the connection status blocks in the 5th row of the 2nd column and the 6th row of the 5th column in the area connection status data 14-10, to a figure "0". The first generation section 201 stores this area connection status data 14-10 into the result storage portion 31.

In the step S1, the first generation section 201 reads out the set area connection status data 12 as the area connection status data 14-11 from the result storage portion 31.

The first generation section 201 examines the plurality of blocks included in the area image data 10-11 for a block indicating chip status data "1" and a block indicating chip status data "2" that are adjacent to each other. Consequently, the first generation section 201 identifies that the adjacent blocks are the blocks located in the 5th row of the 5th column and the 6th row of the 5th column, the blocks located in the 5th row of the 6th column and the 6th row of the 6th column, the blocks located in the 5th row of the 7th column and the 6th row of the 7th column, the blocks located in the 5h row of the 7th column and the 5th row of the 8th column, the blocks located in the 6th row of the 4th column and the 6th row of the 5th column, and the blocks located in the 4th row of the 8th column and the 5th row of the 8th column.

Figure 15:
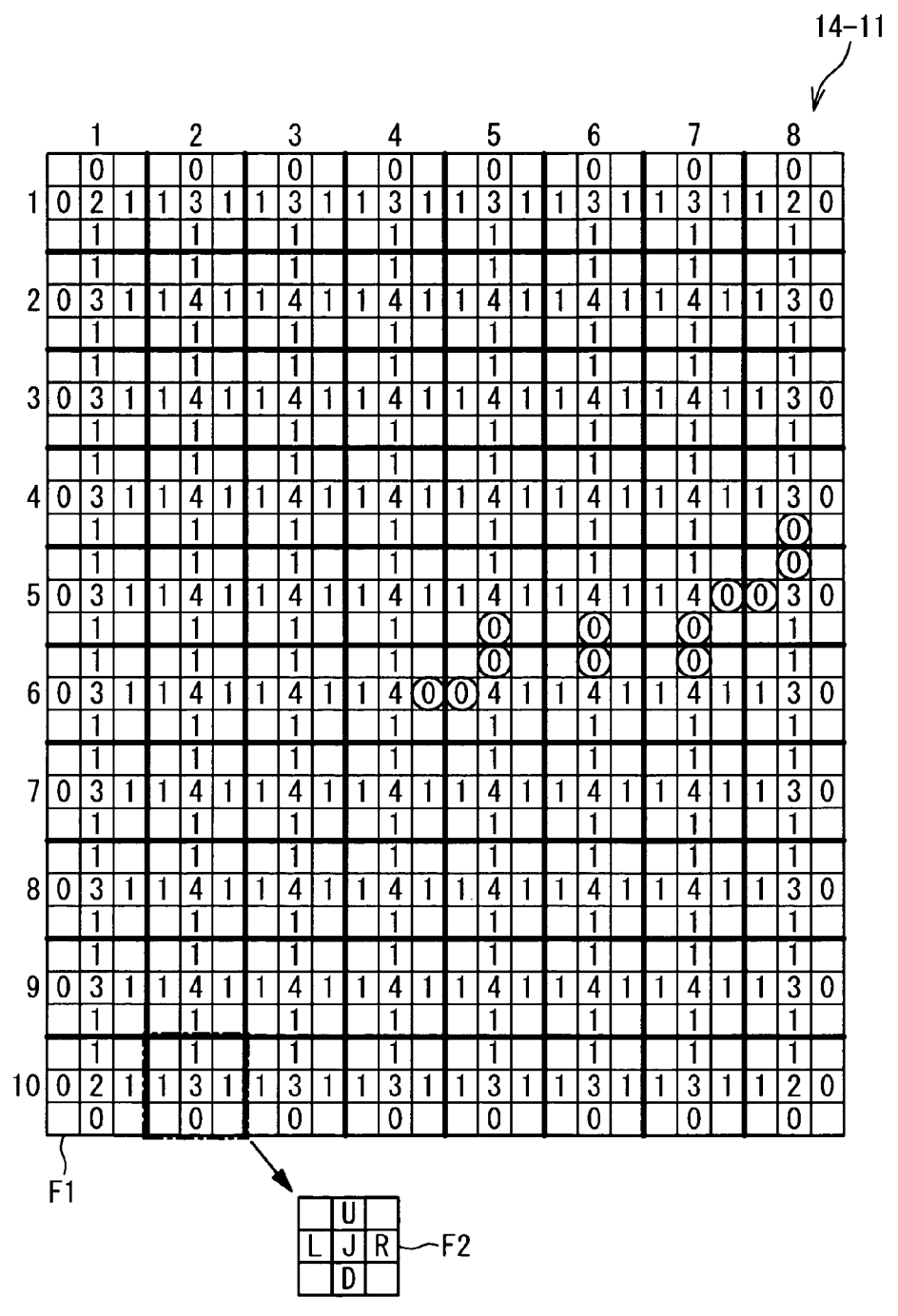

As a result, as shown in FIG. 15, the first generation section 201 changes (sets) the figure "1", which is indicated in each of the connection status sub-blocks "D" of the connection status blocks in the 5th row of the 5th to 7th columns and the 4th row of the 8th column, the connection status sub-blocks "U" of the connection status blocks in the 6th row of the 5th to 7th columns and the 5th row of the 8th column, the connection status sub-blocks "R" of the connection status blocks in the 5th row of the 7th column and the 6th row of the 4th column, and the connection status sub-blocks "L" of the connection status blocks in the 5th row of the 8h column and the 6th row of the 5th column in the area connection status data 14-11, to a figure "0". The first generation section 201 stores this area connection status data 14-11 into the result storage portion 31.

In the step S1, the first generation section 201 reads out the set area connection status data 12 as the area connection status data 14-12 from the result storage portion 31.

The first generation section 201 examines the plurality of blocks included in the area image data 10-12 for a block indicating chip status data "1" and a block indicating chip status data "2" that are adjacent to each other. Consequently, the first generation section 201 identifies that the adjacent blocks are: the blocks located in the 1st row of the 4th column and the 1st row of the 5th column.

Figure 16:
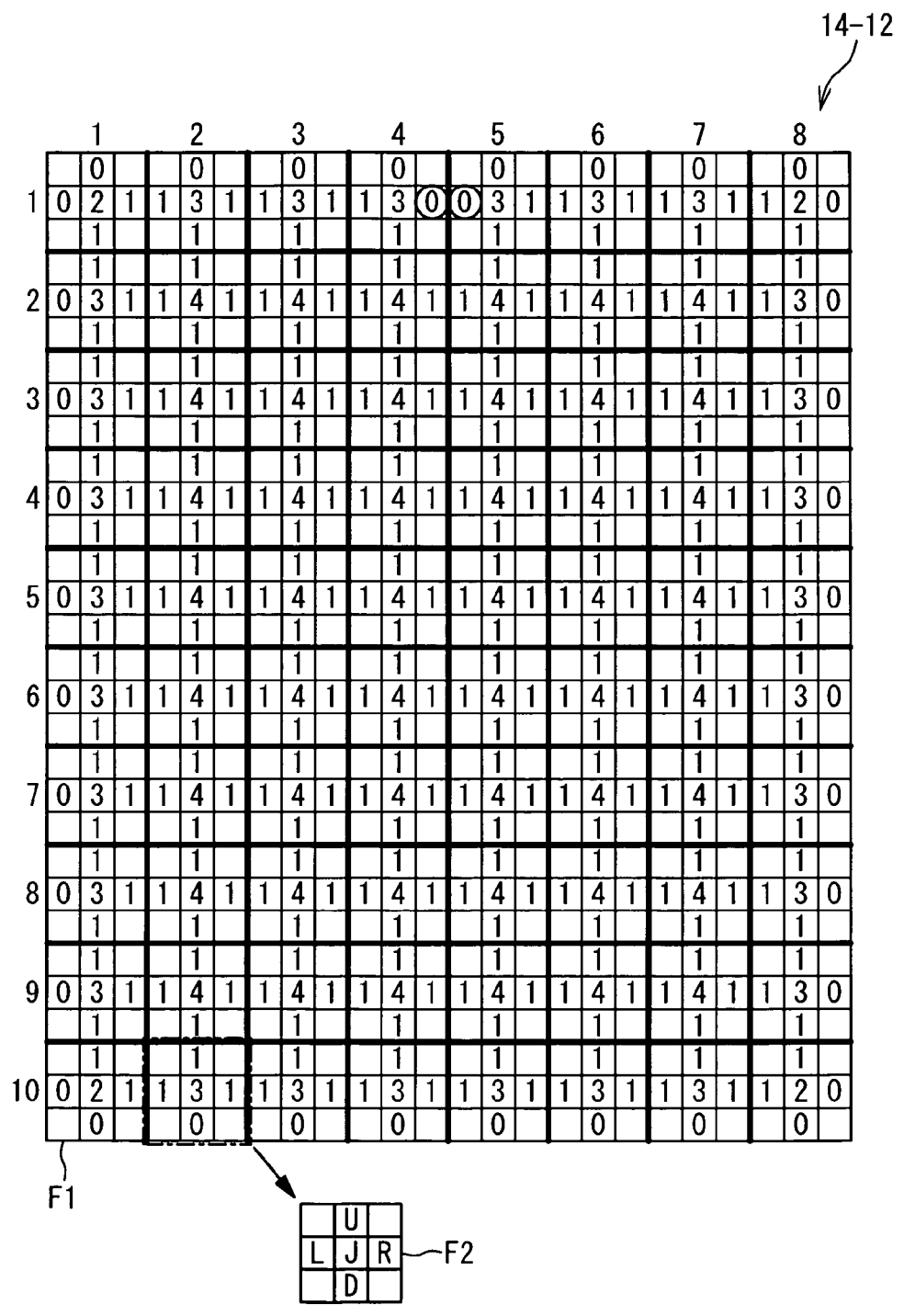

As a result, as shown in FIG. 16, the first generation section 201 changes (sets) the figure "1", which is indicated in each of the connection status sub-block "R" of the connection status block in the 1st row of the 4th column and the connection status sub-block "L" of the connection status block in the 1st to 5th row in the area connection status data 14-12, to a figure "0". The first generation section 201 stores this area connection status data 14-12 into the result storage portion 31.

In the step S1, after storing the plurality of area connection status data 14-1 to 14-12 into the result storage portion 31, the first generation section 201 outputs an AND operation command to the second generation section 202.

Figure 17:
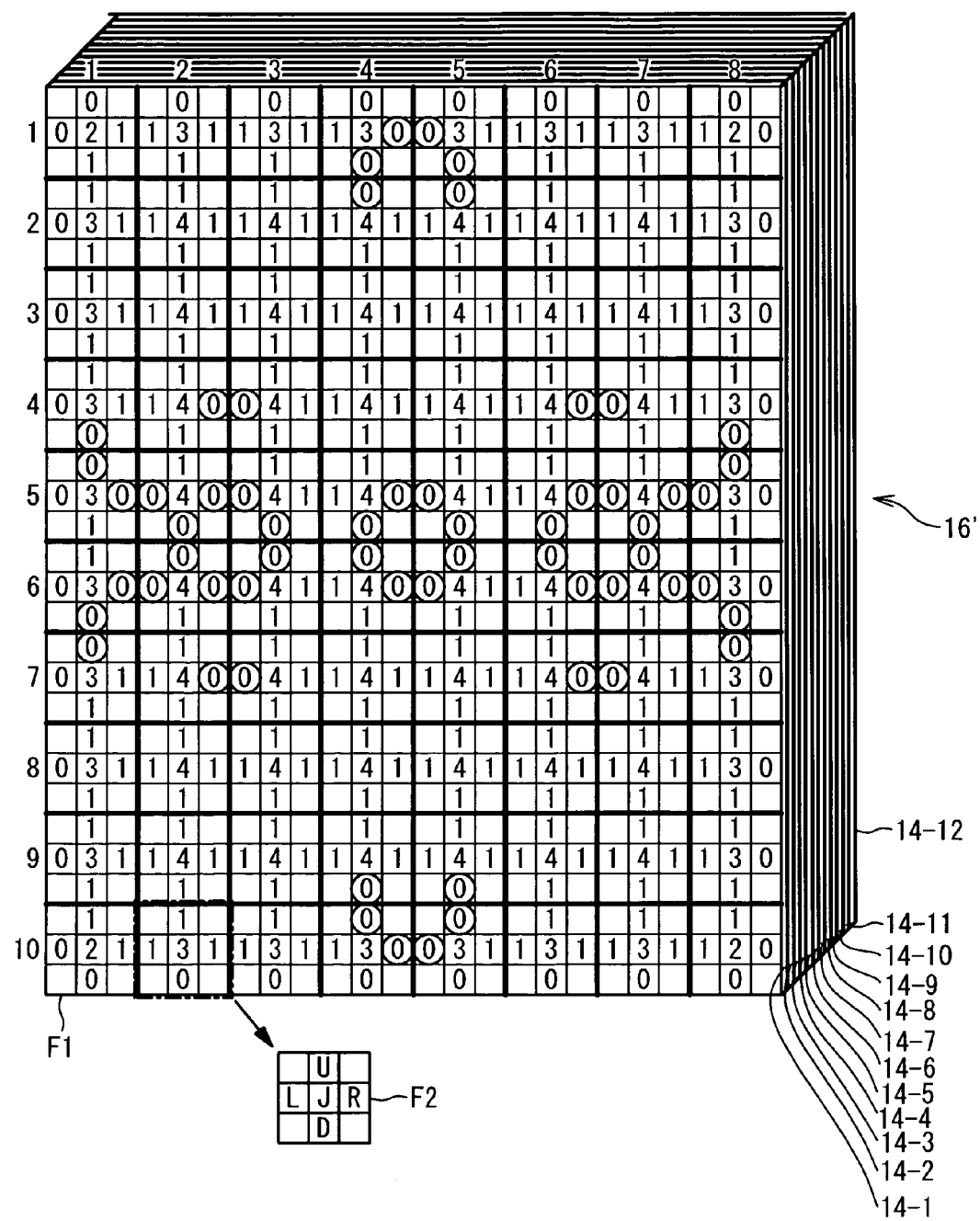
FIG. 17 is a schematic diagram showing logical connection propriety data in the embodiment of the semiconductor chip inspection supporting apparatus according to the present invention.

The second generation section 202 reads out the plurality of area connection status data 14-1 to 14-12 stored in the result storage portion 31 in response to the AND operation command. Then, the second generation section 202 organizes the plurality of area connection status data 14-1 to 14-12 into one area connection status data. An image of this organizing operation is like the plurality of area connection status data 14-1 to 14-12 being superimposed one on another in an aligned manner as is usually practiced in playing cards. More specifically, the second generation section 202 performs an AND operation on the figures indicated in the connection status sub-blocks "U", "D", "L" and "R", respectively, of the connection status blocks arrayed at the same locations in the plurality of area connection status data 14-1 to 14-2 to generate logical connection propriety data 16'. Then, the second generation section 202 stores this data into the result storage portion 31 of the storage unit 3 (step S2). FIG. 17 is a schematic diagram showing logical connection propriety data 16' generated by the data processor 2 in the embodiment of the semiconductor chip inspection supporting apparatus according to the present invention. This operation will be described in detail below.

In the step S2, the second generation section 202 reads out the set area connection status data 12 as the logical connection propriety data 16'. The logical connection propriety data 16' includes a plurality of logical connection propriety blocks corresponding to the plurality of connection status blocks. Each of the plurality of logical connection propriety blocks includes a plurality of connection propriety sub-blocks: "U", "D", "L" and "R" corresponding to the above-mentioned plurality of connection status sub-blocks "U", "D", "L" and "R", respectively, and a connectable quantity sub-block "J".

In the step S2, the second generation section 202 performs the AND operation on the figures indicated in the connection status sub-blocks "D" of the connection status blocks located in each of the 1st row of the 4th to 5th columns, the 4th row of the 1st column, the 4th row of the 8th column, the 5th row of the 2nd to 7th columns, the 6th row of the 1st column, the 6th row of the 8th column, and the 9th row of the 4th to 5th columns in the plurality of area connection status data 14-1 to 14-12, and consequently identifies each result as "0".

As a result, as shown in FIG. 17, the second generation section 202 changes (sets) the figure "1" indicated in each of the connection propriety sub-blocks "D" of the logical connection propriety blocks located in the 1st row of the 4th to 5th columns, the 4th row of the 1st column, the 4th row of the 8th column, the 5th row of the 2nd to 7th columns, the 6th row of the 1st column, the 6th row of the 8th column, and the 9th row of the 4th to 5th columns in the logical connection propriety data 16', to a figure "0".

In the step S2, the second generation section 202 performs the AND operation on the figures indicated in the connection status sub-blocks "U" of the connection status blocks located in each of the 2nd row of the 4th to 5th columns, the 5th row of the 1st column, the 5th row of the 8th column, the 6th row of the 2nd to 7th columns, the 7th row of the 1st column, the 7th row of the 8th column, the 10th row of the 4th column, and the 10th row of the 5th column in the plurality of area connection status data 14-1 to 14-12, and consequently identifies each result as "0".

As a result, as shown in FIG. 17, the second generation section 202 changes (sets) the figure "1", which is indicated in each of the connection propriety sub-blocks "U" of the logical connection propriety blocks located in the 2nd row of the 4th to 5th columns, the 5th row of the 1st column, the 5th row of the 8th column, the 6th row of the 2nd to 7th columns, the 7th row of the 1st column, the 7th row of the 8th column, and the 10th row of the 4th to 5th columns in the logical connection propriety data 16', to a figure "0".

In the step S2, the second generation section 202 performs the AND operation on the figures indicated in the connection status sub-blocks "R" of the connection status blocks located in each of the 1st row of the 4th column, the 4th row of the 2nd column, the 4th row of the 6th column, the 5th row of the 1st column, the 5th row of the 2nd column, the 5th row of the 4th column, the 5th row of the 6th column, the 5th row of the 7th column, the 6th row of the 1st column, the 6th row of the 2nd column, the 6th row of the 4th column, the 6th row of the 6th column, the 6th row of the 7th column, the 7th row of the 2nd column, the 7th row of the 6th column, and the 10th row of the 4th column in the plurality of area connection status data 14-1 to 14-12, and consequently identifies each result as "0".

As a result, as shown in FIG. 17, the second generation section 202 changes (sets) the figure "1", which is indicated in each of the connection propriety sub-blocks "R1" of the logical connection propriety blocks located in the 1st row of the 4th column, the 4th row of the 2nd column, the 4th row of the 6th column, the 5th row of the 1st column, the 5th row of the 2nd column, the 5th row of the 4th column, the 5th row of the 6th column, the 5th row of the 7th column, the 6th row of the 1st column, the 6th row of the 2nd column, the 6th row of the 4th column, the 6th row of the 6th column, the 6th row of the 7th column, the 7th row of the 2nd column, the 7th row of the 6th column, and the 10th row of the 4th column in the logical connection propriety data 16', to a figure "0".

In the step S2, the second generation section 202 performs the AND operation on the figures indicated in the connection status sub-blocks "L" of the connection status blocks located in each of the 1st row of the 5th column, the 4th row of the 3rd column, the 4th row of the 7th column, the 5th row of the 2nd column, the 5th row of the 3rd column, the 5th row of the 5th column, the 5th row of the 7th column, the 5th row of the 8th column, the 6th row of the 2nd column, the 6th row of the 3rd column, the 6th row of the 5th column, the 6th row of the 7th column, the 6th row of the 8th column, the 7th row of the 3rd column, the 7th row of the 7th column, and the 10th row of the 5th column in the plurality of area connection status data 14-1 to 14-12, and consequently identifies each result as "0".

As a result, as shown in FIG. 17, the second generation section 202 changes (sets) the figure "1", which is indicated in each of the connection propriety sub-blocks "L" of the logical connection propriety blocks located in the 1st row of the 5th column, the 4th row of the 3rd column, the 4th row of the 7th column, the 5th row of the 2nd column, the 5th row of the 3rd column, the 5th row of the 5th column, the 5th row of the 7th column, the 5th row of the 8th column, the 6th row of the 2nd column, the 6th row of the 3rd column, the 6th row of the 5th column, the 6th row of the 7th column, the 6th row of the 8th column, the 7th row of the 3rd column, the 7th row of the 7th column, and the 10th row of the 5th column in the logical connection propriety data 16', to a figure "0".

In the step S2, the second generation section 202 performs the AND operation on the figures indicated in the connection status sub-blocks "D", "U", "R" and "L", respectively, located in other than those described above in the plurality of area connection status data 14-1 to 14-12, and consequently identifies that each of the figures indicated in these connection status sub-blocks "D", "U", "R" and "L" do not change.

As a result, as shown in FIG. 17, the second generation section 202 does not change the figures indicated in the logical connection propriety sub-blocks "D", "U", "R" and "L" of the logical connection propriety blocks other than those described above in the logical connection propriety data 16'.

In this example, since "0" is the figure representing connection prohibition, performing the AND operation on the chip data (area connection status data) "U", "D", "L" and "R", respectively, of each area can create a condition such that paired measurement is not performed in any area that meets the connection prohibition condition.

In the step S2, the second generation section 202 stores into the result storage portion 31 the logical connection propriety data 16' that has been subjected to the AND operation, and outputs an addition command to the third generation section 203 of the generation portion 6.

Figure 18:
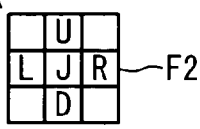
FIG. 18 is a schematic diagram showing connection propriety data in the embodiment of the semiconductor chip inspection supporting apparatus according to the present invention.

The third generation section 203 reads out the logical connection propriety data 16' stored in the result storage portion 31 in response to the addition command. The third generation section 203 adds up the figures indicated in the plurality of logical connection propriety sub-blocks "U", "D", "L" and "R" of each of the logical connection propriety blocks included in the logical connection propriety data 16' to generate connection propriety data 16. Then, the third generation section 203 stores this data into the storage portion 31 of the result storage unit 3 (step S3). FIG. 18 is a schematic diagram showing connection propriety data 16 generated by the data processor 2 in the embodiment of the semiconductor chip inspection supporting apparatus according to the present invention. This operation will be described in detail below.

In the step S3, the third creation section 203 reads out the logical connection propriety data 16' as the connection propriety data 16 from the result storage portion 31. The connection propriety data 16 includes a plurality of connection propriety blocks corresponding to the plurality of logical connection propriety blocks. Each of the plurality of connection propriety blocks includes the above-mentioned plurality of connection propriety sub-blocks: "U", "D", "L" and "R", and the connectable quantity sub-block "J".

In the step S3, the third generation section 203 adds up the figures indicated in the connection propriety sub-blocks "U", "D", "L" and "R" of each of the connection propriety blocks located in the 1st row of the 4th column, the 1st row of the 5th column, the 5th row of the 1st column, the 5th row of the 2nd column, the 5th row of the 7th column, the 5th row of the 8th column, the 6th row of the 1st column, the 6th row of the 2nd column, the 6th row of the 7th column, the 6th row of the 8th column, the 10th row of the 4th column, and the 10th row of the 5ht column in the connection propriety data 16, and consequently identifies each result as "1". For example, "0" in the "U", "0" in the "D", "1" in the "L" and "0" in the "R" are added up and the result is "1" for the connection propriety blocks located in the 1st row of the 4th column.

As a result, as shown in FIG. 18, the third generation section 203 changes (sets) the figure "3", which is indicated in each of the connectable quantity sub-blocks "J" of the connection propriety blocks located in the 1st row of the 4th column, the 1st row of the 5th column, the 5th row of the 1st column, the 5th row of the 8th column, the 6th row of the 1st column, the 6th row of the 8th column, the 10th row of the 4th column, and the 10th row of the 5ht column in the connection propriety data 16, to a figure "1". Also, the third generation section 203 changes (sets) the figure "4", which is indicated in each of the connectable quantity sub-blocks "J" of the connection propriety blocks located in the 5th row of the 2nd column, the 5th row of the 7th column, the 6th row of the 2nd column, and the 6th row of the 7th column in the connection propriety data 16, to a figure "1".

In the step S3, the third generation section 203 adds up the figures indicated in the connection propriety sub-blocks "U", "D", "L" and "R" of each of the connection propriety blocks located in the 4th row of the 1st column, the 4th row of the 8th column, the 5th row of the 3rd to 6th columns, the 6th row of the 3rd to 6th columns, the 7th row of the 1st column, and the 7th row of the 8th column in the connection propriety data 16, and consequently identifies each result as "2".

As a result, as shown in FIG. 18, the third generation section 203 changes (sets) the figure "3", which is indicated in each of the connectable quantity sub-blocks "J" of the connection propriety blocks located in the 4th row of the 1st column, the 4th row of the 8th column, the 7th row of the 1st column, and the 7th row of the 8th column in the connection propriety data 16, to a figure "2". Also, the third generation section 203 changes (sets) the figure "4", which is indicated in each of the connectable quantity sub-blocks "J" of the connection propriety blocks located in the 5th row of the 3rd to 6th columns, the 6th row of the 3rd to 6th columns in the connection propriety data 16, to a figure "2".

In the step S3, the third generation section 203 adds up the figures indicated in the connection propriety sub-blocks "U", "D", "L" and "R" of each of the connection propriety blocks located in the 2nd row of the 4th column, the 2nd row of the 5th column, the 4th row of the 2nd column, the 4th row of the 3rd column, the 4th row of the 6th column, the 4th row of the 7th column, the 7th row of the 2nd column, the 7th row of the 3rd column, the 7th row of the 6th column, the 7th row of the 7th column, the 9th row of the 4th column, and the 9th row of the 5th column in the connection propriety data 16, and consequently identifies each result as "3".

As a result, as shown in FIG. 18, the third generation section 203 changes (sets) the figure "4", which is indicated in each of the connectable quantity sub-blocks "J" of the connection propriety blocks located in the 2nd row of the 4th column, the 2nd row of the 5th column, the 4th row of the 2nd column, the 4th row of the 3rd column, the 4th row of the 6th column, the 4th row of the 7th column, the 7th row of the 2nd column, the 7th row of the 3rd column, the 7th row of the 6th column, the 7th row of the 7th column, the 9th row of the 4th column, and the 9th row of the 5th column in the connection propriety data 16, to a figure "3".

In the step S3, the third generation section 203 adds up the figures indicated in the connection propriety sub-blocks "U", "D", "R" and "L" of each of the connection propriety blocks, other than those described above in the connection propriety data 16. Consequently, the third generation section 203 identifies that the figures indicated in the connectable quantity sub-blocks "J" of the connection propriety blocks other than those described above do not change.

As a result, as shown in FIG. 18, the third generation section 203 does not change the figures indicated in the connectable quantity sub-blocks "J" of the connection propriety blocks, other than those described above in the connection propriety data 16.

In the step S3, the third generation section 203 stores the connection propriety data 16 that has been subjected to the addition operation into the result storage portion 31. Then, the third generation section 203 outputs a first search command to the search processing portion 7. In this way, among the plurality of connection propriety sub-blocks "U", "D", "L" and "R" of the connection propriety blocks in the connection propriety data 16, each of the connection propriety sub-blocks with the figure "0" represents that a connection with an adjacent chip is prohibited. Also, each of the connection propriety sub-blocks with the figure "1" represents that a connection with an adjacent chip is permitted. Each of the figures indicated in the connection propriety sub-blocks "J" of the connection propriety blocks in the connection propriety data 16 represents the number of chips that are adjacent and also permitted for the connection. Thus, the search processing portion 7 can search for a chip to be subjected to paired measurement for each of a plurality of normal chips, based on the figures indicated in the plurality of area image data 10-1 to 10-12, the figures indicated in the plurality of connection propriety sub-blocks "U", "D", "L" and "R" and the connectable quantity sub-block "J" of each of the plurality of connection propriety blocks in the connection propriety data 16. Then, the search processing portion 7 outputs search result data 20 as the search result to the output unit 4.

The first search section 204 of the search processing portion 7 reads out the connection propriety data 16 and the plurality of area image data 10-1 to 10-12 stored in the result storage portion 31, in response to the first search command. The first search section 204 searches for a connectable quantity indicating "0". More specifically, the first search section 204 searches the plurality of connection propriety blocks in the connection propriety data 16 for a connection propriety block including a connectable quantity sub-block "J" indicating a figure "0" as a signal measurement block (step S4). When there is any single measurement block (step S4: YES), the first search section 204 outputs a single measurement setting command representing the single measurement block, together with the connection propriety data 16 and the plurality of area image data 10-1 to 10-12, to the first processing section 209 of the search processing portion 7.

The first processing section 209 specifies the blocks, which correspond to the single measurement block in each of the plurality of area image data 10-1 to 10-12, as chips to be subjected to single measurement, in response to the single measurement setting command (step S5). In the step S5, the first processing section 209 outputs the plurality of area image data 10-1 to 10-12, whose single measurement block has been specified, to the first search section 204. The first search section 204 stores the plurality of area image data 10-1 to 10-12 outputted from the first processing section 209 into the result storage portion 31 of the storage unit 3. In addition, in the step 5, in the connection propriety data 16, the first processing section 209 changes each of the figures, which is indicated in the connection propriety sub-blocks of the connection propriety blocks adjacent to the single measurement block, to a figure "0". Subsequently, the first processing section 209 outputs an addition command and the connection propriety data 16 to the third generation section 203 of the generation portion 6.

The third generation section 203 executes the step S3 in response to the addition command outputted from the first processing section 209. More specifically, the third generation section 203 adds up the figures indicated in the plurality of connection propriety sub-blocks "U", "D", "L" and "R" of each of the connection propriety blocks in the connection propriety data 16 outputted from the first processing section 209. Then, the third generation section 203 changes (resets) the figure indicated in the connection propriety sub-block "J" of the connection propriety block. Subsequently, the third generation section 203 stores the connection propriety data 16 subjected to the addition operation into the result storage portion 31, and then outputs a first search command to the search processing portion 7.

In this example (FIG. 18), there exists no signal measurement block; therefore, the step S4: YES, step S5, and step S3 are not executed.

The first search section 204 of the search processing portion 7 executes the step S4 in response to the first search command, and then recognizes that the search for a single measurement block has been completed or recognizes that there exists no single measurement block. In this case, the first search section 204 outputs a second search command to the second search section 205 (step S4: NO).

Figure 19:
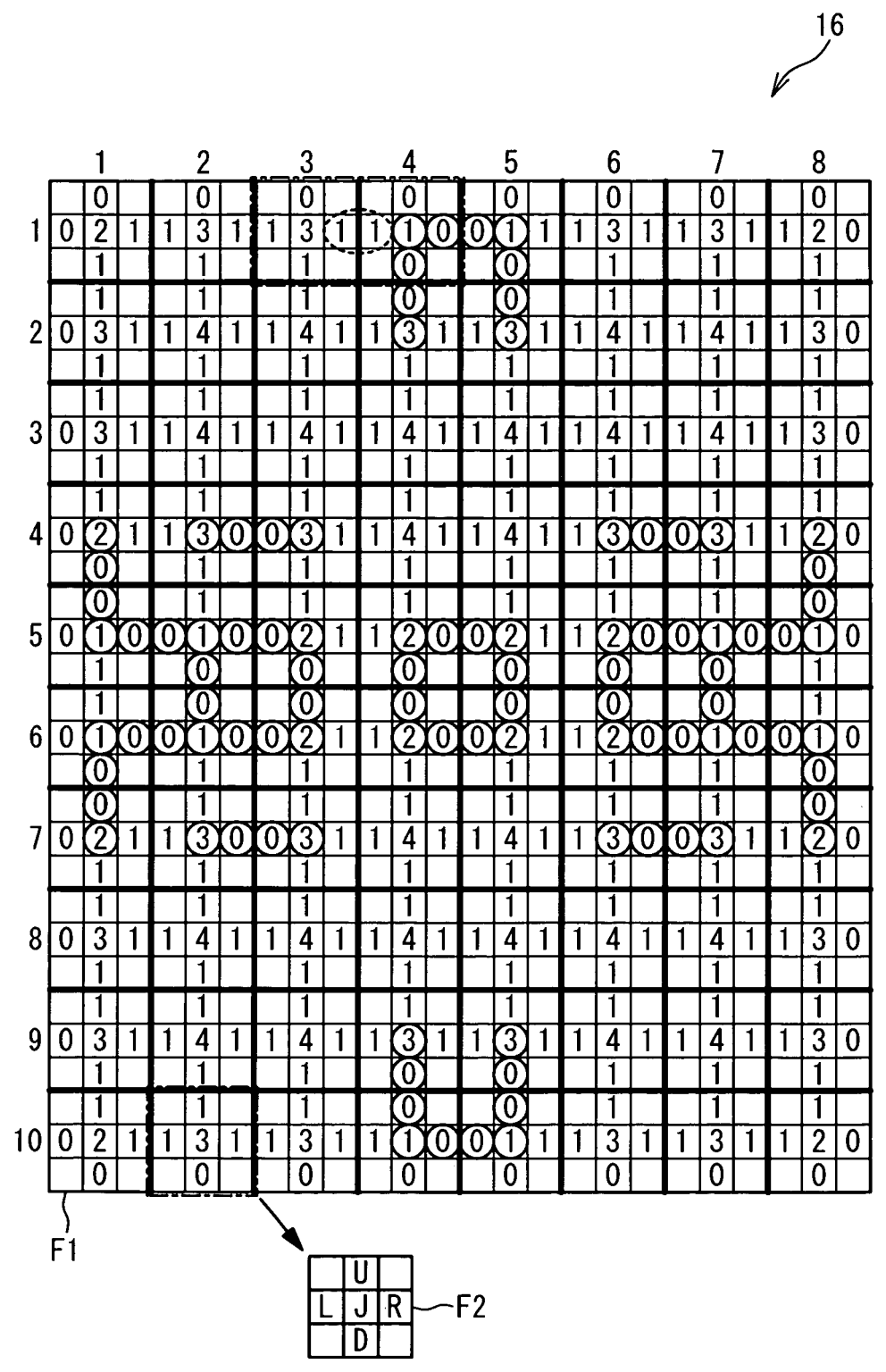

The second search section 205 of the search processing portion 7 reads out the connection propriety data 16 and the plurality of area image data 10-1 to 10-12 stored in the result storage portion 31, in response to the second search command. The second search section 205 searches for a connectable quantity indicating "1". More specifically, the second search section 205 searches the plurality of connection propriety blocks in the connection propriety data 16, excluding the single measurement block (not specified in this example), for first paired measurement blocks (step S6). The first paired measurement blocks consist of a first connection propriety block, i.e., a connection propriety block including a connectable quantity sub-block "J" indicating a figure "1", and one connection propriety block adjacent to the first connection propriety block. For example, FIG. 19 is a schematic diagram showing the connection propriety data 16 in the step S6 in the embodiment of the semiconductor chip inspection supporting apparatus according to the present invention. As shown in FIG. 19, the second search section 205 finds, based on the figure "1" indicated in the connection propriety sub-block "J" of the connection propriety block in the connection propriety data 16, the connection propriety block located in the 1st row of the 4th column as a first connection propriety block. The second search section 205 then finds the connection propriety block located in the 1st row of the 3rd column as one connection propriety block adjacent to the first connection propriety block, based on the figure "1" indicated in the connection propriety sub-block "L" of the connection propriety block located in the 1st row of the 4th column. The second search section 205 recognizes the connection propriety blocks located in the 1st row of the 4th column and the 1st row of the 3rd column as first paired measurement blocks. As the first paired measurement blocks exist in this example, the second search section 205 outputs a first paired measurement setting command representing the first paired measurement blocks, together with the connection propriety data 16 and the plurality of area image data 10-1 to 10-12, to the second processing section 210 of the search processing portion 7 (step S6: YES).

The second processing section 210 specifies the blocks, which correspond to the first paired measurement blocks in each of the plurality of area image data 10-1 to 10-12, as chips to be subjected to paired measurement, in response to the first paired measurement setting command (step S7). Of the two blocks specified as the first paired measurement blocks in each of the plurality of area image data 10-1 to 10-12, a chip represented by the block concerned and a chip represented by the block adjacent and connectable thereto are specified as the paired chips. The paired chips are subjected to paired measurement with the input-output pins being shared by these two chips.

Figure 20:
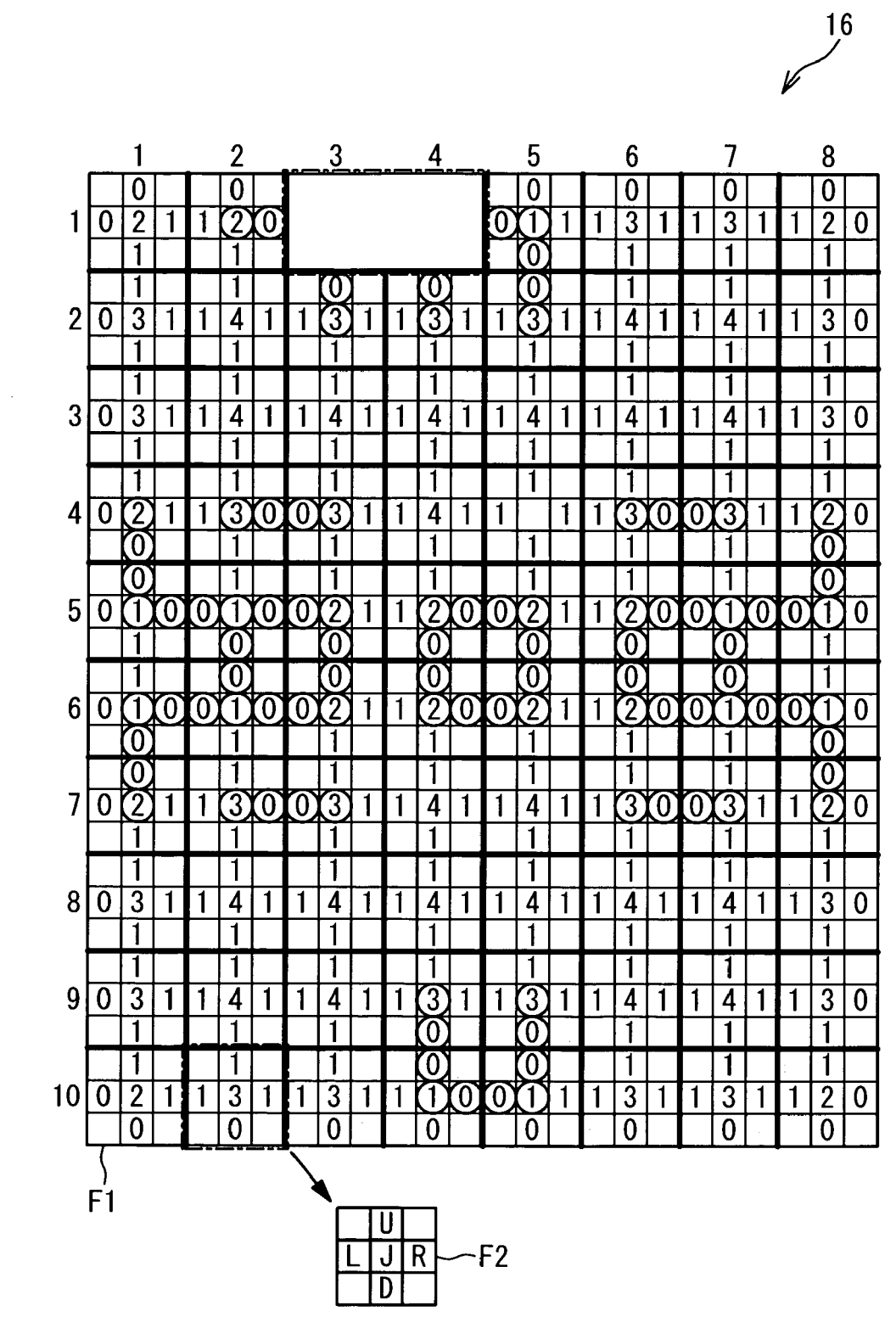

In the step S7, the second processing section 210 outputs the plurality of area image data 10-1 to 10-12 whose first paired measurement blocks have been specified to the second search section 205. The second search section 205 stores the plurality of area image data 10-1 to 10-12 outputted from the second processing section 210 into the result storage portion 31 of the storage unit 3. In addition, in the step S7, in the connection propriety data 16, the second processing section 210 changes each of the figures, which is indicated in the connection propriety sub-blocks of the connection propriety blocks adjacent to the first paired measurement blocks, to a figure "0" as shown in FIG. 20. FIG. 20 is a schematic diagram showing the connection propriety data 16 in the step S7 in the embodiment of the semiconductor chip inspection supporting apparatus according to the present invention. In FIG. 20, one of the first pair measurement blocks are shown as the open quadrangle. Subsequently, the second processing section 210 outputs an addition command and the connection propriety data 16 to the third generation section 203 of the generation portion 6.

The third generation section 203 executes the step S3 in response to the addition command outputted from the second processing section 210. More specifically, the third generation section 203 adds up the figures indicated in the plurality of connection propriety sub-blocks "U", "D", "L" and "R" of each of the connection propriety blocks in the connection propriety data 16 outputted from the second processing section 210. Then, the third generation section 203 changes (resets) the figure indicated in the connection propriety sub-block "J" of the connection propriety block. Subsequently, the third generation section 203 stores the connection propriety data 16 subjected to the addition operation into the result storage portion 31, and then outputs a first search command to the search processing portion 7.

The second search section 205 of the search processing portion 7 executes the step S6 in response to the second search command, and then recognizes that the search for first paired measurement blocks has been completed or recognizes that there exists no first paired measurement blocks. In this case, the second search section 205 outputs a third search command to the third search section 206 (step S6: NO).

The third search section 206 of the search processing portion 7 reads out the connection propriety data 16 and the plurality of area image data 10-1 to 10-12 stored in the result storage portion 31, in response to the third search command. The third search section 206 searches for a connectable quantity indicating "2". More specifically, the third search section 206 searches the plurality of connection propriety blocks in the connection propriety data 16, excluding the single measurement block (not specified in this example) and the first paired measurement blocks, for second paired measurement blocks (step S8). The second paired measurement blocks consist of a second connection propriety block, i.e., a connection propriety block including a connectable quantity sub-block "J" indicating a figure "2", and one of two connection propriety blocks adjacent to the second connection propriety block. For example, in the step S8, the third search section 206 finds, based on the figure "2" indicated in the connection propriety sub-block "J" of the connection propriety block in the connection propriety data 16, the connection propriety block located in the 1st row of the 1st column as a second connection propriety block. The third search section 206 then recognizes, based on the figure "1" indicated in the connection propriety sub-blocks "D" and "R" of the connection propriety block located in the 1st row of the 1st column, that connection with an adjacent chip (adjacent connection propriety block) is permitted in two directions. The third search section 206 finds (selects) a connection propriety block in an arbitrary direction, for example, the connection propriety block located in the 1st row of the 2nd column, as one of the connection propriety blocks adjacent to the second connection propriety block. The third search section 206 recognizes the connection propriety blocks located in the 1st row of the 1st column and the 1st row of the 2nd column as second paired measurement blocks. As the second paired measurement blocks exist in this example, the third search section 206 outputs a second paired measurement setting command representing the second paired measurement blocks, together with the connection propriety data 16 and the plurality of area image data 10-1 to 10-12, to the third processing section 211 of the search processing portion 7 (step S8: YES).

The third processing section 211 specifies the blocks which correspond to the second paired measurement blocks in each of the plurality of area image data 10-1 to 10-12 as chips to be subjected to paired measurement, in response to the second paired measurement setting command (step S9) Of the two blocks specified as the second paired measurement blocks of each of the plurality of area image data 10-1 to 10-12, a chip represented by the block concerned and a chip represented by the block adjacent and connectable thereto are specified as the paired chips. The paired chips are subjected to paired measurement with the input-output pin being shared by these two chips.

In the step S9, the third processing section 211 outputs the plurality of area image data 10-1 to 10-12 whose second paired measurement blocks have been specified to the third search section 206. The third search section 206 stores the plurality of area image data 10-1 to 10-12 outputted from the third processing section 211 into the result storage portion 31 of the storage unit 3. In addition, in the step S9, in the connection propriety data 16, the third processing section 211 changes each of the figures, which is indicated in the connection propriety sub-blocks of the connection propriety blocks adjacent to the second paired measurement blocks, to a figure "0". Subsequently, the third processing section 211 outputs an addition command and the connection propriety data 16 to the third generation section 203 of the generation portion 6.

The third generation section 203 executes the step S3 in response to the addition command outputted from the third processing section 211. More specifically, the third generation section 203 adds up the figures indicated in the plurality of connection propriety sub-blocks "U", "D", "L" and "R" of each of the connection propriety blocks included in the connection propriety data 16 outputted from the third processing section 211. Then, the third generation section 203 changes (resets) the figure indicated in the connection propriety sub-block "J" of the connection propriety block. Subsequently, the third generation section 203 stores the connection propriety data 16 subjected to the addition operation into the result storage portion 31, and then outputs a first search command to the search processing portion 7.

The third search section 206 of the search processing portion 7 executes the step S8 in response to the third search command, and then recognizes that the search for second paired measurement blocks has been completed or recognizes that there exists no second paired measurement blocks. In this case, the third search section 206 outputs a fourth search command to the fourth search section 207 (step S8: NO).

The fourth search section 207 of the search processing portion 7 reads out the connection propriety data 16 and the plurality of area image data 10-1 to 10-12 stored in the result storage portion 31, in response to the fourth search command. The fourth search section 207 searches for a connectable quantity indicating "3". More specifically, the fourth search section 207 searches the plurality of connection propriety blocks, excluding the single measurement block (not specified in this example) and the first and second paired measurement blocks, for third paired measurement blocks (step S10). The third paired measurement blocks consist of a third connection propriety block, i.e., a connection propriety block including a connectable quantity sub-block "J" indicating a figure "3", and one of three connection propriety blocks adjacent to the third connection propriety block. For example, in the step S10, the fourth search section 207 finds, based on the figure "3" indicated in the connection propriety sub-block "J" of the connection propriety block included in the connection propriety data 16, the connection propriety block (reset connection propriety block as shown in FIG. 20) located in the 2nd row of the 3rd column as a third connection propriety block. The fourth search section 207 then recognizes, based on the figures "1" indicated in the connection propriety sub-blocks "D", "L" and "R" of the connection propriety block located in the 2nd row of the 3rd column, that connection with an adjacent chip (adjacent connection propriety block) is permitted in three directions. The fourth search section 207 finds (selects) a connection propriety block in an arbitrary direction, for example, the connection propriety block located in, the 2nd row of the 4th column, as one of the connection propriety blocks adjacent to the third connection propriety block. The fourth search section 207 recognizes the connection propriety blocks located in the 2nd row of the 3rd column and the 2nd row of the 4th column as third paired measurement blocks. As the third paired measurement blocks exist in this example, the fourth search section 207 outputs a third paired measurement setting command representing the third paired measurement blocks, together with the connection propriety data 16 and the plurality of area image data 10-1 to 10-12 to the fourth processing section 212 of the search processing portion 7 (step S10: YES) The fourth processing section 212 specifies the blocks which correspond to the third paired measurement blocks in each of the plurality of area image data 10-1 to 10-12 as chips to be subjected to paired measurement, in response to the third paired measurement setting command (step S11). Of the two blocks specified as the third paired measurement blocks of each of the plurality of area image data 10-1 to 10-12, a chip represented by the block concerned and a chip represented by the block adjacent and connectable thereto are specified as the paired chips. The paired chips are subjected to paired measurement with the input-output pin being shared by these two chips.

In the step S11, the fourth processing section 212 outputs the plurality of area image data 10-1 to 10-12 whose third paired measurement blocks have been specified to the fourth search section 207. The fourth search section 207 stores the plurality of area image data 10-1 to 10-12 outputted from the fourth processing section 212 into the result storage portion 31 of the storage unit 3. In addition, in the step S11, in the connection propriety data 16, the fourth processing section 212 changes each of the figures, which is indicated in the connection propriety sub-blocks of the connection propriety blocks adjacent to the third paired measurement blocks, to a figure "0". Subsequently, the fourth processing section 212 outputs an addition command and the connection propriety data 16 to the third generation section 203 of the generation portion 6.

The third generation section 203 executes the step S3 in response to the addition command outputted from the fourth processing section 212. More specifically, the third generation section 203 adds up the figures indicated in the plurality of connection propriety sub-blocks "U", "D", "L" and "R" of each of the connection propriety blocks included in the connection propriety data 16 outputted from the fourth processing section 212. Then, the third generation section 203 changes (resets) the figure indicated in the connection propriety sub-block "J" of the connection propriety block. Subsequently, the third generation section 203 stores the connection propriety data 16 subjected to the addition operation into the result storage portion 31, and then outputs a first search command to the search processing portion 7.

The fourth search section 207 of the search processing portion 7 executes the step S10 in response to the third search command, and then recognizes that the search for third paired measurement blocks has been completed or recognizes that there exists no third paired measurement blocks. In this case, the fourth search section 207 outputs a fifth search command to the fifth search section 208 (step S10: NO).

The fifth search section 208 of the search processing portion 7 reads out the connection propriety data 16 and the plurality of area image data 10-1 to 10-12 stored in the result storage portion 31, in response to the fifth search command. The fifth search section 208 searches for a connectable quantity indicating "4". More specifically, the fifth search section 208 searches the plurality of connection propriety blocks in the connection propriety data 16, excluding the single measurement block (not specified in this example) and the first to third paired measurement blocks, for fourth paired measurement blocks (step S12). The fourth paired measurement blocks consist of a fourth connection propriety block, i.e., a connection propriety block including a connectable quantity sub-block "J" indicating a figure "4", and one of four connection propriety blocks adjacent to the fourth connection propriety block. For example, in the step S12, the fifth search section 208 finds, based on the figure "4" indicated in the connection propriety sub-block "J" of the connection propriety block in the connection propriety data 16, the fourth connection propriety block. The fifth search section 208 then recognizes, based on the figures "1" indicated in the connection propriety sub-blocks "U", "D", "L" and "R" of the fourth connection propriety block, that connection with an adjacent chip (adjacent connection propriety block) is permitted in four directions. The fifth search section 208 finds (selects) a connection propriety block in an arbitrary direction as one of the four connection propriety blocks adjacent to the fourth connection propriety block. The fifth search section 208 recognizes the fourth connection propriety block and the aforementioned one of the connection propriety blocks as fourth paired measurement blocks. As the fourth paired measurement blocks exist, the fifth search section 208 outputs a fourth paired measurement setting command representing the fourth paired measurement blocks, together with the connection propriety data 16 and the plurality of area image data 10-1 to 10-12, to the fifth processing section 213 of the search processing portion 7 (step S12: YES).

The fifth processing section 213 specifies the blocks which correspond to the fourth paired measurement blocks in each of the plurality of area image data 10-1 to 10-12 as chips to be subjected to paired measurement, in response to the fourth paired measurement setting command (step S13) Of the two blocks specified as the fourth paired measurement blocks of each of the plurality of area image data 10-1 to 10-12, a chip represented by the block concerned and a chip represented by the block adjacent and connectable thereto are specified as the paired chips. The paired chips are subjected to paired measurement with the input-output pin being shared by these two chips.

In the step S13, the fifth processing section 213 outputs the plurality of area image data 10-1 to 10-12 whose fourth paired measurement blocks have been specified to the fifth search section 208. The fifth search section 208 stores the plurality of area image data 10-1 to 10-12 outputted from the fifth processing section 213 into the result storage portion 31 of the storage unit 3. In addition, in the step S13, in the connection propriety data 16, the fifth processing section 213 changes each of the figures, which is indicated in the connection propriety sub-blocks of the connection propriety blocks adjacent to the fourth paired measurement blocks, to a figure "0". Subsequently, the fifth processing section 213 outputs an addition command and the connection propriety data 16 to the third generation section 203 of the generation portion 6.

The third generation section 203 executes the step S3 in response to the addition command outputted from the fifth processing section 213. More specifically, the third generation section 203 adds up the figures indicated in the plurality of connection propriety sub-blocks "U", "D", "L" and "R" of each of the connection propriety blocks included in the connection propriety data 16 outputted from the fifth processing section 213. Then, the third generation section 203 changes (resets) the figure indicated in the connection propriety sub-block "J" of the connection propriety block. Subsequently, the third generation section 203 stores the connection propriety data 16 subjected to the addition operation into the result storage portion 31, and then outputs a first search command to the search processing portion 7.

Figure 21:
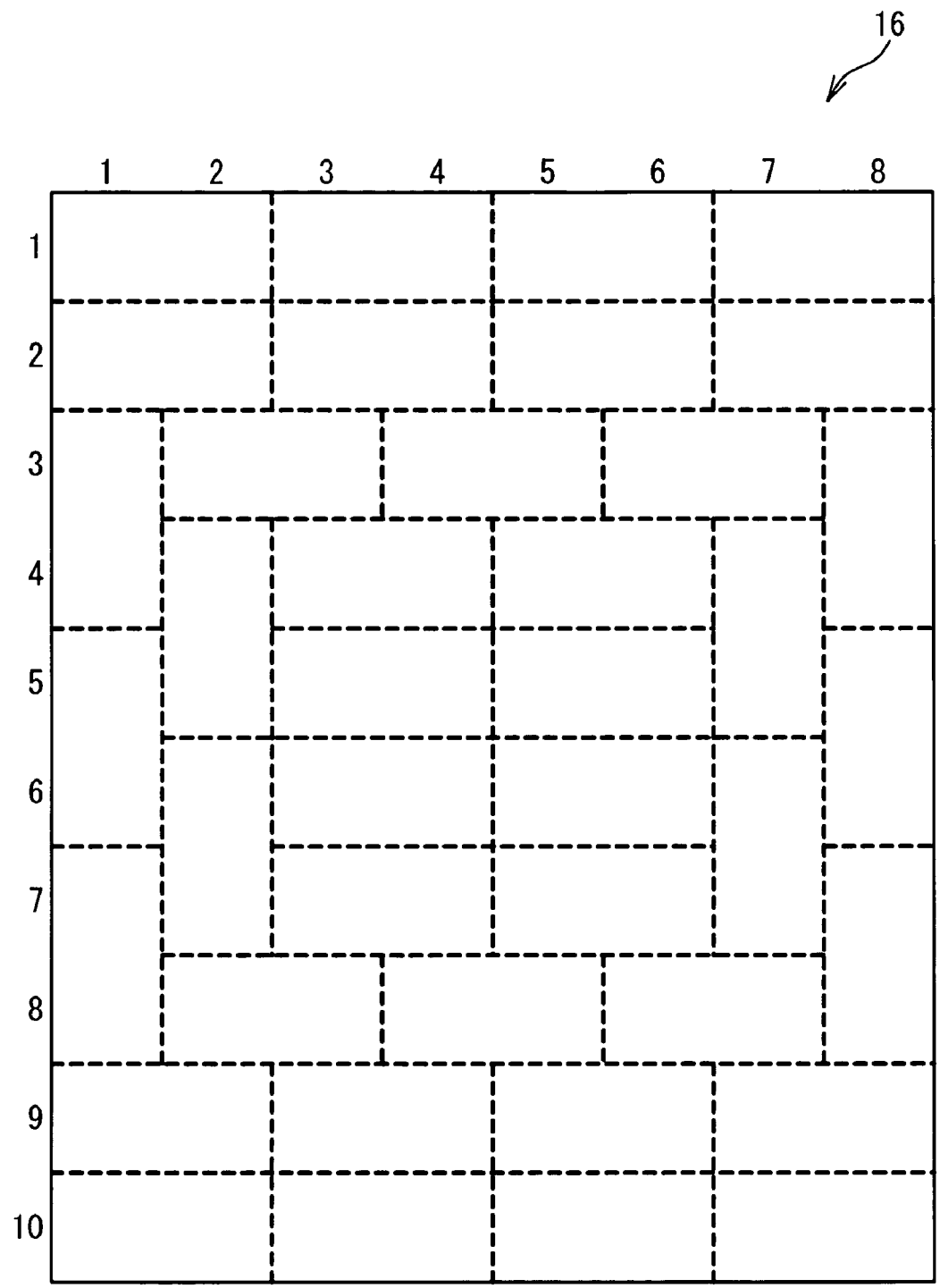
FIG. 21 is a schematic diagram showing a connection propriety data in the step S13 in the embodiment of the semiconductor chip inspection supporting apparatus according to the present invention.
Figure 22:
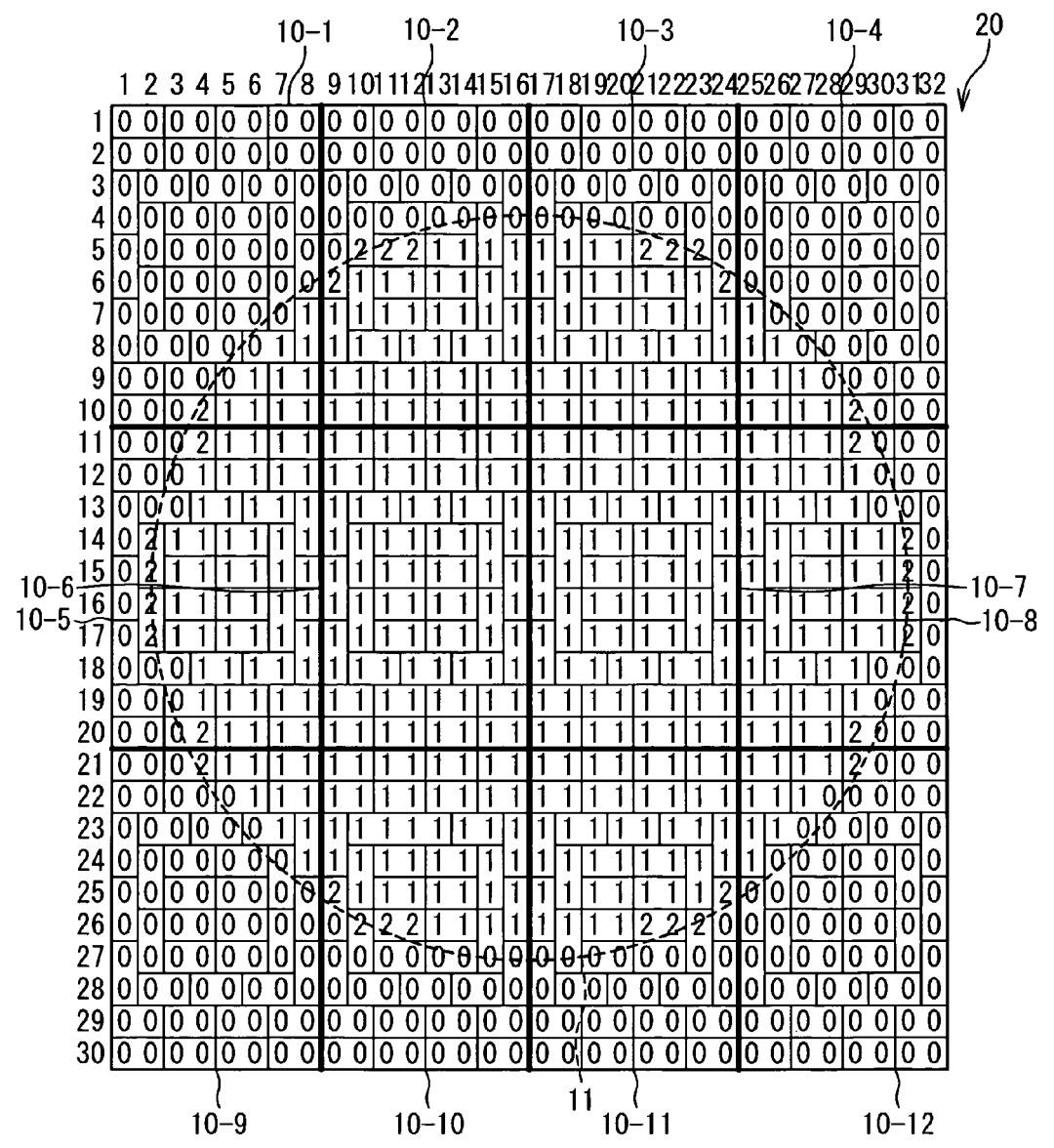

The fifth search section 208 of the search processing portion 7 executes the step S12 in response to the fourth search command and then recognizes that the search for fourth paired measurement blocks has been completed or recognizes that there exists no fourth paired measurement blocks. That is, the fifth search section 208 recognizes that the processing has been completed. At this point, each of the plurality of connection propriety blocks included in the connection propriety data 16 is specified as at least one of a single measurement block (not specified in this example), and the first to fourth paired measurement blocks, as shown in FIG. 21. FIG. 21 is a schematic diagram showing the connection propriety data 16 in the step S13 in the embodiment of the semiconductor chip inspection supporting apparatus according to the present invention. In this case, the fifth search section 208 outputs the image data 10 to the output unit 4 (step S12: NO). Here, the image data 10 includes the area image data 10-1 to 10-12 in which at least one of the single measurement block (not specified in this example) and the first to fourth paired measurement blocks has been specified as the search result data 20, as shown in FIG. 22. FIG. 22 is a schematic diagram showing the outputted image data 10 in the embodiment of the semiconductor chip inspection supporting apparatus according to the present invention.

As described above, with the semiconductor chip inspection supporting apparatus according to the present invention, the data processor 2 generates the connection propriety data 16, whereby an abnormal chip is prohibited from being connected, as a counterpart chip for paired measurement, to a normal chip adjacent thereto. The data processor 2 outputs to the output unit 4 the search result data 20 obtained based on the plurality of area image data 10-1 to 10-12, the figures representing whether or not connection to an adjacent chip is prohibited (i.e., figures indicated in the connection propriety sub-blocks, "U", "D", "L" and "R"), and the figures representing the number of chips permitted for connection to an adjacent chip (i.e., figures indicated in the connectable quantity sub-blocks "J"). Consequently, paired measurement can be performed on each of the plurality of normal chips while referring to the search result 20 during the inspection. As described above, the semiconductor chip inspection supporting apparatus of the present invention permits performing an inspection without causing malfunction of a normal chip during paired measurement.

According to the present invention, the use of the semiconductor chip inspection supporting apparatus permits uniquely obtaining combination conditions for paired measurement by using formulas.

Moreover, according to the invention, the ability to uniquely obtain the combination conditions makes it easier to achieve automatic operation with a calculator or the like.

According to the invention, no costs arise for taking countermeasures against abnormal chips in the process just for the purpose of measurement of multiple chips.

According to the invention, even when a plurality of wafer shapes (including those of different sizes or the like) are provided, the arrangements of a probe card can be easily and obtained at a time in response to the plurality of wafer shapes by taking the same procedures.

Furthermore, even in a wafer burn-in device, the arrangements of a probe card can be obtained by taking the same procedures, and the input-output pins can be used effectively for the simultaneous measurement of multiple chips.

Other embodiments of the semiconductor chip inspection supporting apparatus according to the present invention will be described below. Those overlapping with the above description will be omitted.

Figure 23:
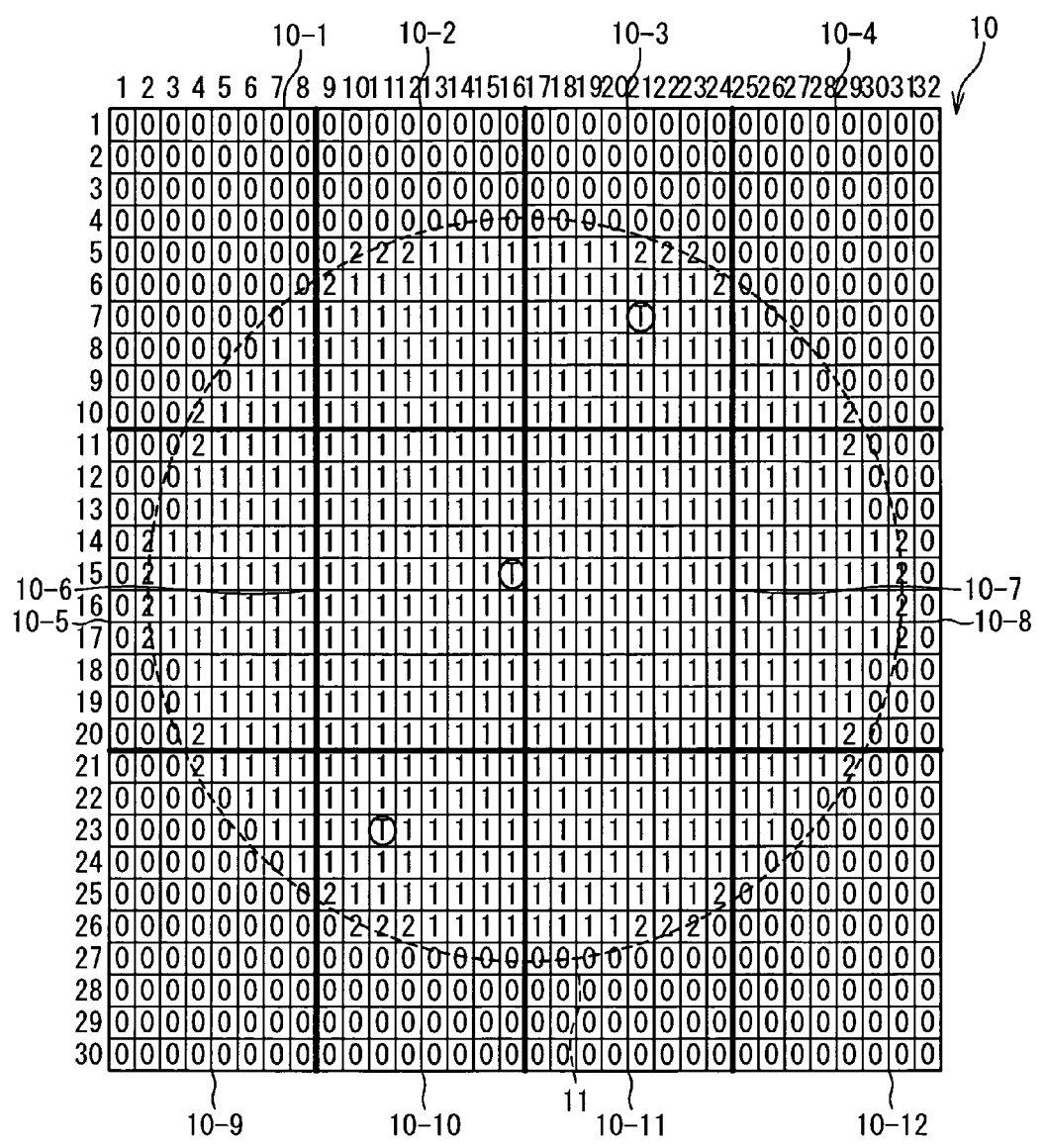

In another embodiment, as shown in FIG. 23, in addition to the normal chips and abnormal chips described above, TEG (Test Element Group) chips may be used. The TEG chips, included in the open circles in FIG. 23, are chips for characteristic measurement of a transistor or the like frequently used in the semiconductor. The TEG chips will be described in detail below.

Figure 24:
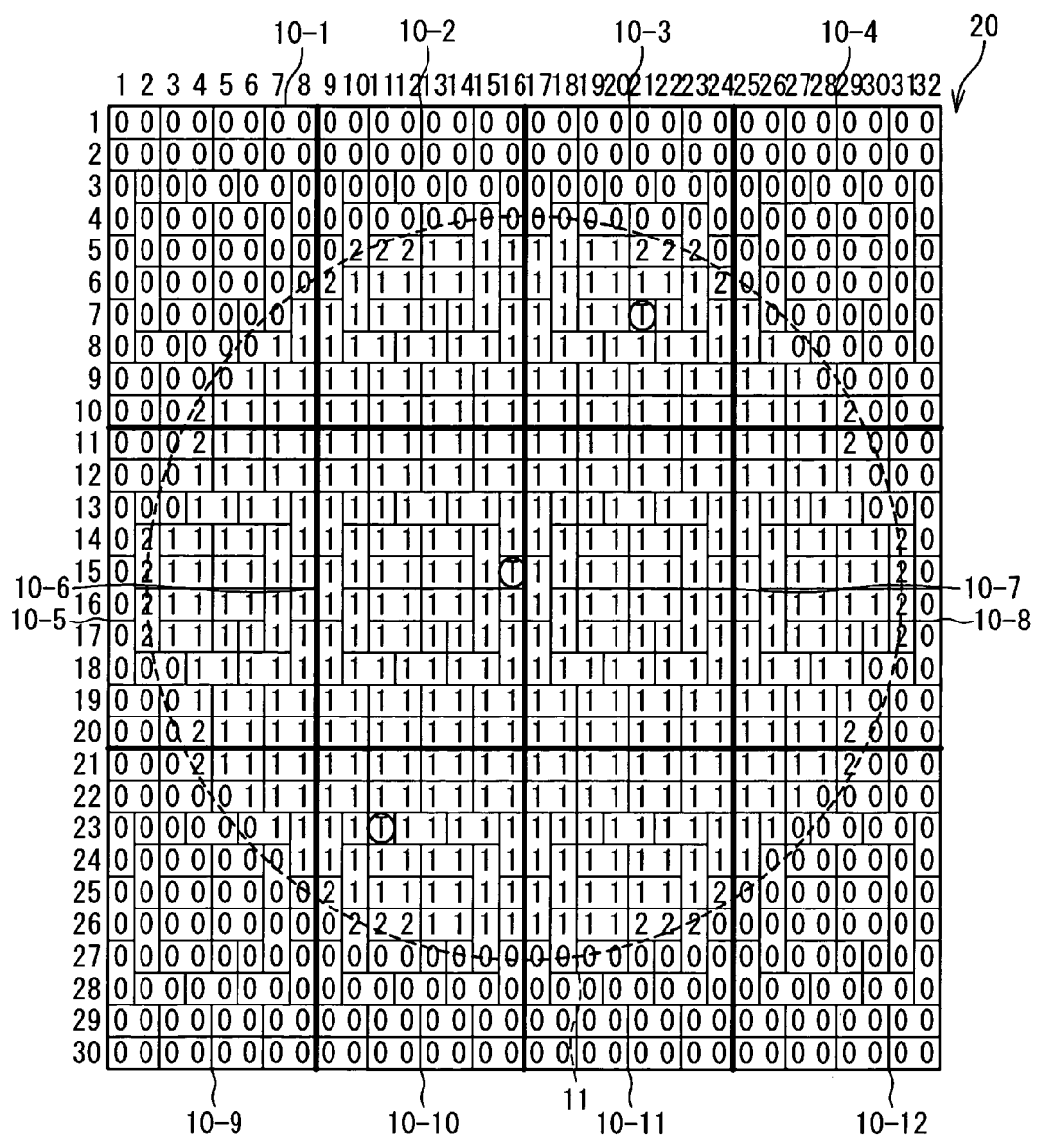

In the embodiment described above, each of the plurality of blocks included in the image data 10 indicates any one of chip status data "1", chip status data "2", and chip status data "0" as shown in FIG. 3. On the other hand, in this embodiment, as shown in FIG. 23, the block located in the 7th row of the 5th column in the area image data 10-3 indicates chip status data "T" instead of chip status data "1". The block located in the 5th row of the 8th column in the area image data 10-6 indicates chip status data "T" instead of chip status data "1". The block located in the 3rd row of the 3rd column in the area image data 10-10 indicates chip status data "T" instead of chip status data "1". The chip status data "T" represents that the chip lies on the semiconductor wafer 11 and corresponds to a TEG chip. The TEG chip belongs to an abnormal chip, as a data. That is, the chip status data "T" is treated as chip status data "2", so that the TEG chip is set for single measurement. As a result, the data processor 2 can generate search result data 20 as shown in FIG. 24 from the image data 10, thus permitting obtaining mixed results concerned with single measurement and paired measurement.

Figure 25:
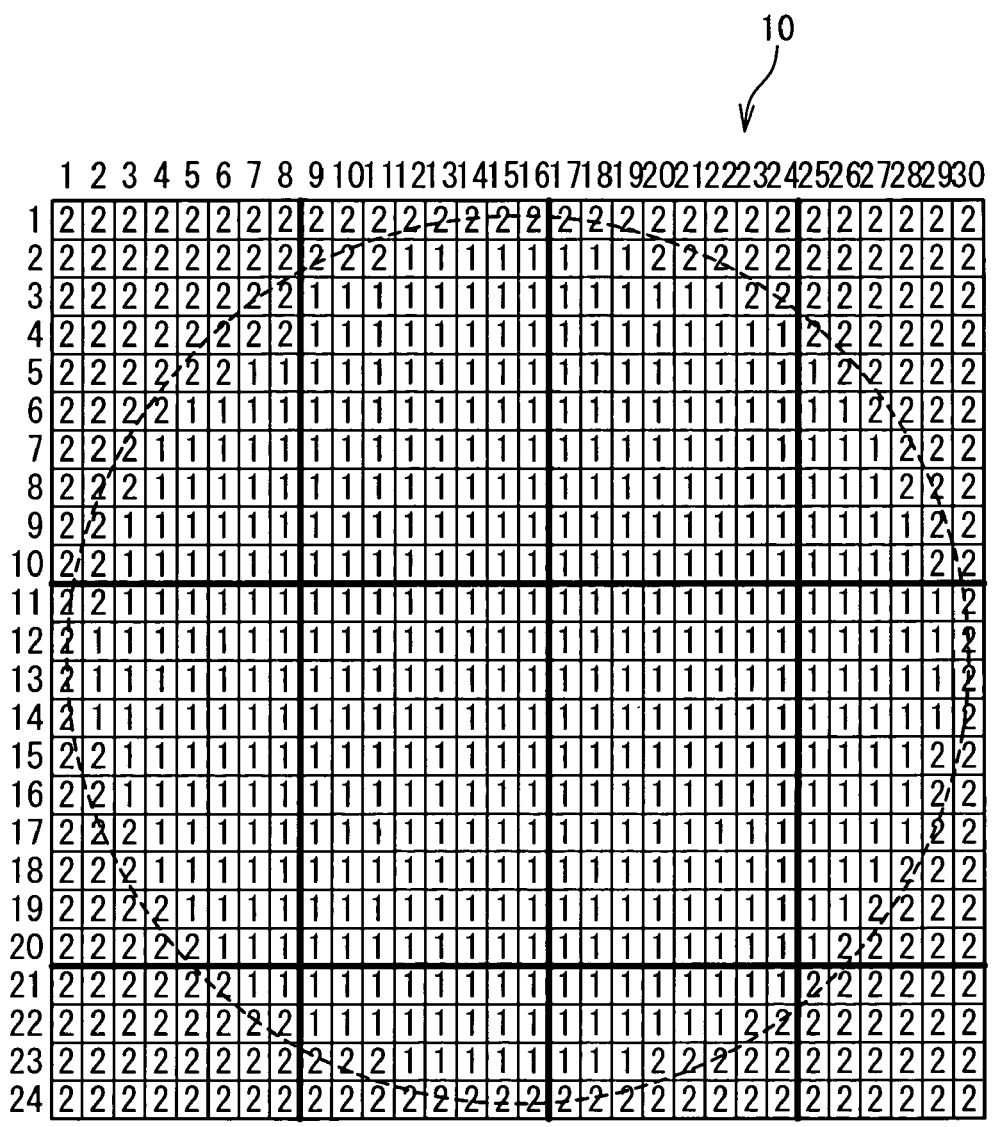
FIG. 25 is a schematic diagram showing an image data 10 in still another embodiment of the semiconductor chip inspection supporting apparatus according to the present invention.

In still another embodiment of the present invention, in a wafer burn-in device more recently developed, upon performing paired measurement by sharing an input-output pins, image data 10 as shown in FIG. 25 can be set to thereby obtain desired results, which will be described in detail below.

In the embodiment described above, each of the plurality of blocks included in the image data 10 indicates any one of chip status data "1", chip status data "2", and chip status data "0". On the other hand, in this embodiment, as shown in FIG. 25, of a plurality of blocks included in the image data 10, those located outside the wafer device 11 indicates chip status data "2" instead of chip status data "0". This permits the wafer burn-in device to obtain desired results upon performing paired measurement by sharing the input-output pins.

In still another embodiment, the relationships with a target chip (see F2 of FIG. 4) can refer to not only the up, down, left, and right directions but also to oblique directions, which will be described in detail below.

Figure 26:
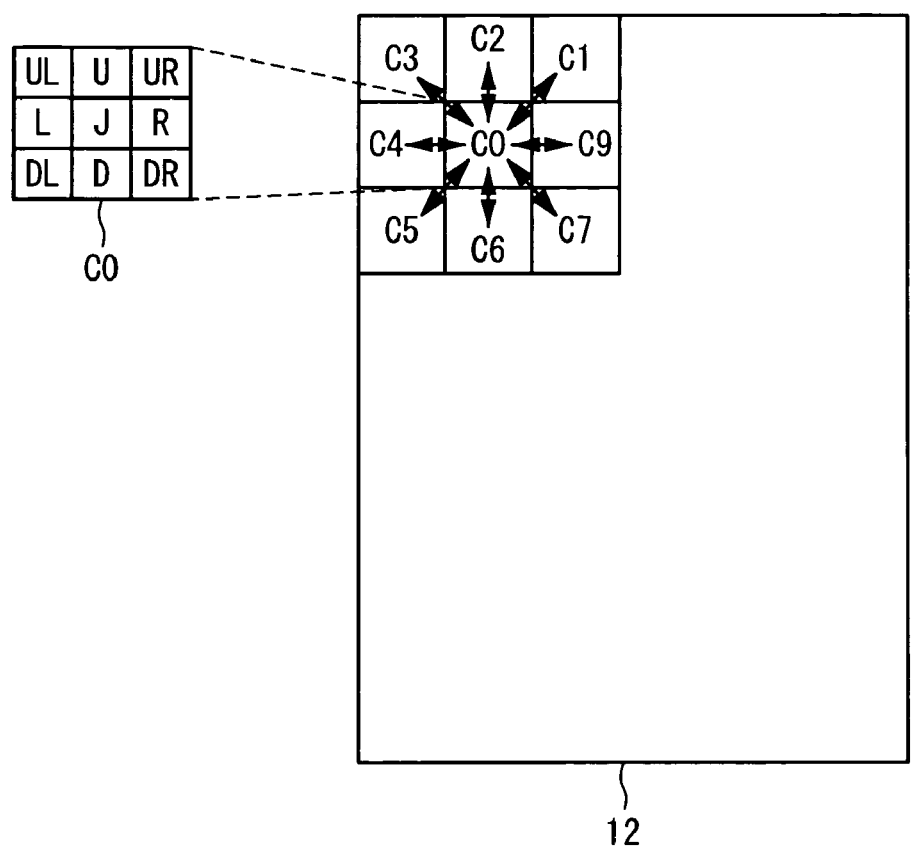
FIG. 26 is a schematic diagrams showing a relation between connection status sub-blocks and a connection status block in the other embodiment of the semiconductor chip inspection supporting apparatus according to the present invention.

In the embodiment described above, as shown by F2 of FIG. 4, each of the plurality of connection status blocks in the set area connection status data 12 includes a plurality of connection status sub-blocks, "U", "D", "L" and "R". On the other hand, in this embodiment, as shown in FIG. 26, each of a plurality of connection status blocks in set area connection status data 12 includes a plurality of sub-blocks: "U", "D", "L", "R" "UL", "UR", "DL" and "DR". Assume that C0 is a chip (target chip) representing one of the plurality connection status blocks. The connection status sub-block "U" indicates the relationship with an adjacent chip C2 located above the target chip C0. The connection status sub-block "D" indicates the relationship with an adjacent chip C6 located below the target chip C0. The connection status sub-block "L" indicates the relationship with an adjacent chip C4 located to the left of the target chip C0. The connection status sub-block "R" indicates the relationship with an adjacent chip C9 located to the right of the target chip C0. The connection status sub-block "UL" indicates the relationship with an adjacent chip C3 obliquely located to the upper left of the target chip C0. The connection status sub-block "UR" indicates the relationship with an adjacent chip C1 obliquely located to the upper right of the target chip C0. The connection status sub-block "DL" indicates the relationship with an adjacent chip C5 obliquely located to the lower left of the target chip C0. The connection status sub-block "DR" indicates the relationship with an adjacent chip C7 obliquely located to the lower right of the target chip C0.

Of the plurality of connection status sub-blocks, "U", "D", "L", "R" "UL", "UR", "DL" and "DR" of each of the plurality connection status blocks included in the set area connection status data 12, the connection status sub-blocks corresponding to an end portion of the area measured with the probe card each previously indicate a figure "0". The connection status sub-blocks "U", "D", "L", "R" "UL", "UR", "DL" and "DR" other than those described above each indicate a figure "1".

Consequently, paired measurement can be performed, considering not only the up, down, left, and right directions, but also the oblique directions.

Figure 27:
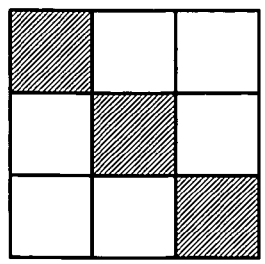
FIGS. 27 to 29 are schematic diagrams showing respective connection status blocks in the other embodiment of the semiconductor chip inspection supporting apparatus according to the present invention.
Figure 28:
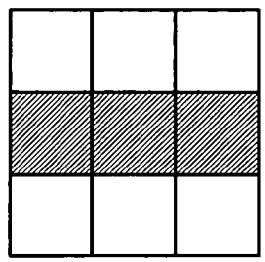
Figure 29:
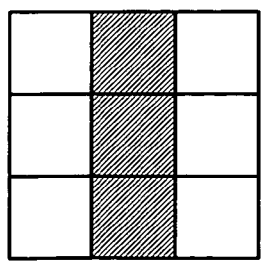

In the embodiment described above, paired measurement is performed on two chips. According to this embodiment, measurement can be performed on three chips arranged in an oblique direction as shown in FIG. 27. Moreover, measurement can be performed on three chips arranged in the horizontal direction as shown in FIG. 28. Further more, measurement can be performed on three chips arranged in the vertical direction as shown in FIG. 29. A combination of two or more chips can be easily obtained, and thus the number of chips subjected to paired measurement is not limited to three. The operation of the semiconductor chip inspection supporting apparatus in this embodiment according to the present invention will be described in detail below, taking FIGS. 26 to 29 into consideration.

In the step S1, the first generation section 201 examines each of a plurality of area image data 10-1 to 10-12 in image data 10 for identifying, from among a plurality of blocks, a block representing a normal chip and a block representing an abnormal chip that are adjacent to each other. Then, the first generation section 201 generates a plurality of area connection status data 14-1 to 14-12, and then stores these data into the result storage portion 31.

Of the plurality of connection status data 14-1 to 14-12, the area connection status data 14-2 will be discussed as an example in detail below.

In the step S1, the first generation section 201 reads out the set area connection status data 12 as the area connection status data 14-2 from the result storage portion 31.

The first generation section 201 examines the plurality of blocks in the area image data 10-2 for a block indicating chip status data "1" and a block indicating chip status data "2" that are adjacent to each other. Consequently, the first generation section 201 identifies that the adjacent blocks are: the blocks located in the 5th row of the 2nd column and the 6th row of the 2nd column, the blocks located in the 5th row of the 3rd column and the 6th row of the 3rd column, the blocks located in the 5th row of the 4th column and the 6th row of the 4th column, the blocks located in the 6th row of the 1st column and the 6th row of the 2nd column, the blocks located in the 5th row of the 4th column and the 5th row of the 5th column, and the blocks located in the 6th row of the 1st column and the 7th row of the 1st column. In addition, referring to the oblique directions, the first generation section 201 identifies that the adjacent blocks are: the blocks located in the 6th row of the 1st column and the 7th row of the 2nd column, the blocks located in the 5th row of the 2nd column and the 6th row of the 3rd column, the blocks located in the 5th row of the 3rd column and the 6th row of the 4th column, the blocks located in the 5th row of the 4th column and the 6th row of the 5th column, the blocks located in the 5th row of the 3rd column and the 6th row of the 2nd column, and the blocks located in the 5th row of the 4th column and the 6th row of the 3rd column.

Figure 30:
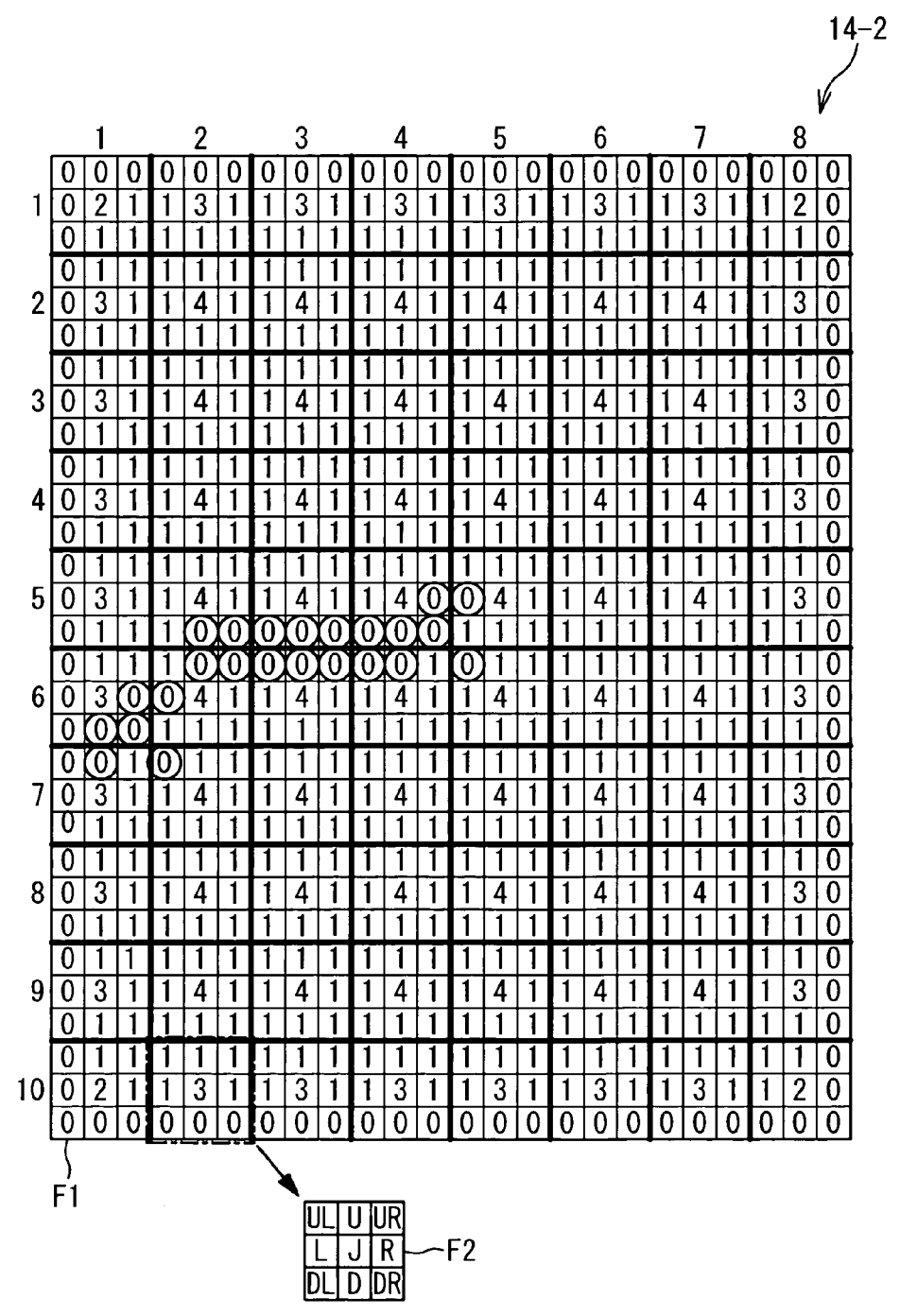

As a result, as shown in FIG. 30, the first generation section 201 changes (sets), to a figure "0", the figure "1" indicated in each of the connection status sub-blocks "D" of the connection status blocks located in the 5th row of the 2nd to 4th columns and the 6th row of the 1st column, the connection status sub-blocks "U" of the connection status blocks located in the 6th row of the 2nd to 4th columns and the 7th row of the 1st column, the connection status sub-blocks "R" of the connection status blocks located in the 6th row of the 1st column and the 5th row of the 4th column, and the connection status sub-blocks "L" of the connection status blocks located in the 6th row of the 2nd column and the 5th row of the 5th column in the area connection status data 14-2. In addition, referring to the oblique directions, the first generation section 201 changes (sets), to a figure "0", the figure "1" indicated in each of the connection status sub-blocks "DR" of the connection status blocks located in the 5th row of the 2nd to 4th columns and the 6th row of the 1st column, the connection status sub-blocks "UL" of the connection status blocks located in the 6th row of the 3rd to 5th columns and the 7th row of the 2nd column, the connection status sub-blocks "DL" of the connection status blocks located in the 5th row of the 3rd column and the 5th row of the 4th column, and the connection status sub-blocks "UR" of the connection status blocks located in the 6th row of the 2nd column and the 6th row of the 3rd column included in the area connection status data 14-2. The first generation section 201 stores this area connection status data 14-2 into the result storage portion 31.

In the step S2, the second generation section 202 of the generation portion 6 performs an AND operation on the figures indicated in the connection status sub-blocks "U", "D", "L", "R", "UL", "UR", "DL" and "DR", respectively, of the connection status blocks arrayed at the same locations of the plurality of area connection status data 14-1 to 14-12, to generate logical connection propriety data 16'. Then, the second generation section 202 stores this data into the result storage portion 31.

In the step S3, in the logical connection propriety data 16', the third generation section 203 adds up the figures indicated in the plurality of logical connection propriety sub-blocks "U", "D", "L", "R", "UL", "UR", "DL" and "DR" in each of the logical connection propriety blocks. The result is a data indicated in the connectable quantity sub-block "J" in each logical connection propriety block. Then, the third generation section 203 generates connection propriety data 16, and then stores this data into the storage portion 31.

In the step S4, the first search section 204 searches the plurality of connection propriety blocks in the connection propriety data 16 for a connection propriety block including a connectable quantity sub-block "J" indicating a figure "0" as a signal measurement block. In the step S5, the first processing section 209 specifies, the block of each of the plurality of area image data 10-1 to 10-12 corresponding to the single measurement block as a chip to be subjected to single measurement.

In the step S6, in the connection propriety data 16, the second search section 205 searches the plurality of connection propriety blocks, excluding the single measurement block, for first paired measurement blocks. The first paired measurement blocks consist of a first connection propriety block, i.e., a connection propriety block including a connectable quantity sub-block "J" indicating a figure "1", and one connection propriety block adjacent to the first connection propriety block. In the step S7, the second processing section 210 specifies, the blocks of each of the plurality of area image data 10-1 to 10-12 corresponding to the first paired measurement blocks as chips to be subjected to paired measurement.

In the step S8, in the connection propriety data 16, the third search section 206 searches the plurality of connection propriety blocks, excluding the single measurement block and the first paired measurement blocks, for second paired measurement blocks. The second paired measurement blocks consist of a second connection propriety block, i.e., a connection propriety block including a connectable quantity sub-block "J" indicating a figure "2", and at least one of two connection propriety blocks adjacent to the second connection propriety block (see examples shown in FIGS. 27 to 29). In the step S9, the third processing section 211 specifies the blocks of each of the plurality of area image data 10-1 to 10-12 corresponding to the second paired measurement blocks as chips to be subjected to paired measurement.

In the step S10, in the connection propriety data 16, the fourth search section 207 searches the plurality of connection propriety blocks, excluding the single measurement block and the first and second paired measurement blocks, for third paired measurement blocks. The third paired measurement blocks consist of a third connection propriety block, i.e., a connection propriety block including a connectable quantity sub-block "J" indicating a figure "3", and at least one of three connection propriety blocks adjacent to the third connection propriety block. In the step S11, the fourth processing section 212 specifies the blocks of each of the plurality of area image data 10-1 to 10-12 corresponding to the third paired measurement blocks as chips to be subjected to paired measurement.

In the step S12, in the connection propriety data 16, the fifth search section 208 searches the plurality of connection propriety blocks, excluding the single measurement block and the first to third paired measurement blocks, for fourth paired measurement blocks. The fourth paired measurement blocks consist of a fourth connection propriety block, i.e., a connection propriety block including a connectable quantity sub-block "J" indicating a figure "4" or above, and at least one of four or more connection propriety blocks adjacent to the fourth connection propriety block. In the step S13, the fifth processing section 213 specifies the blocks of each of the plurality of area image data 10-1 to 10-12 corresponding to the fourth paired measurement blocks as chips to be subjected to paired measurement. In the step S12: NO, the fifth search section 208 outputs the image data 10 including the area image data 10-1 to 10-12 in which at least one of the single measurement block and the first to fourth paired measurement blocks has been specified, to the output unit 4, as search result data 20.

As described above, according to the other embodiment of the semiconductor chip inspection supporting apparatus of the present invention, combinations for paired measurement using two or more chips can be easily determined.

More specifically, in the other embodiment, the data processor 2 generates the connection propriety data 16, whereby an abnormal chip is prohibited from being connected, as a counterpart chip for paired measurement, to a normal chip adjacent thereto. The data processor 2 outputs to the output unit 4 the search result data 20 obtained based on the plurality of area image data 10-1 to 10-12, the figures representing whether or not connection to an adjacent chip is prohibited (i.e., figures indicated in the connection propriety sub-blocks, "U", "D", "L", "R", "UL", "UR", "DL" and "DR"), and the figures representing the number of chips permitted for connection to an adjacent chip (i.e., figures indicated in the connectable quantity sub-blocks "J"). Consequently, paired measurement using two or more chips can be performed on each of the plurality of normal chips while referring to the search result 20 during the inspection. As described above, the semiconductor chip inspection supporting apparatus of the invention permits performing an inspection without causing malfunction of a normal chip during paired measurement using two or more chips.

According to the semiconductor chip inspection supporting apparatus of the present invention, as shown in FIGS. 3 and 23, when it is desired to share a probe card on different semiconductor wafers 11, a probe card sharable between two semiconductor wafers 11 can be easily provided by providing input conditions (chip status data "1", chip status data "2", chip status data "0", and chip status data "T") from two pieces of image data 10 (i.e., the image data 10 shown in FIG. 3 and the image data 10 shown in FIG. 23).

In this example, the results obtained in FIG. 23 are prioritized. For example, even when the wafer size is different between them, since data is finally treated as one piece of area information, the results can be obtained by taking the same procedures irrespectively of whether the number of water types is one, two, or more.

Moreover, optimum arrangement can be obtained for each area with the methods according to the present invention by adding a device for changing a pair for measurement to a switching device, such as a relay, with an input-output pin shared by the measurement device.

It is apparent that the present invention is not limited to the above embodiment, that may be modified and changed without departing form the scope and spirit of the invention.

What is claimed is:

1. A semiconductor chip inspection supporting apparatus comprising:

a data processing unit to which an image data is supplied, wherein said image data indicates a layout of a plurality of normal chips and a plurality of abnormal chip on a semiconductor wafer, wherein said data processing unit includes:

a generation portion which generates a connection propriety data indicating prohibition of each of said plurality of normal chips from being connected to adjacent one of said plurality of abnormal chips based on said image data, and a search processing portion which searches for a chip to be paired with said each of plurality of the normal chips for execution of paired measurement, based on said image data and said connection propriety data, wherein said data processing unit outputs said search result to a output device.

2. The semiconductor chip inspection supporting apparatus according to claim 1, wherein said image data includes a plurality of area image data corresponding to areas measured with a probe card,
   wherein each of said plurality of area image data includes a plurality of blocks regularly arrayed,
   wherein each of said plurality of blocks indicates chips on said semiconductor wafer,
   wherein said generation portion includes:
   a first generation section which generates a plurality of area connection status data by examining one, indicating said each normal chip, of said plurality of blocks and adjacent one, indicating adjacent said one abnormal chip, of said plurality of blocks in each of said plurality of area image data,
   wherein each of said plurality of area connection status data includes a plurality of connection status blocks corresponding to said plurality of blocks,
   wherein each of said plurality of connection status blocks includes a plurality connection status sub-blocks,
   wherein one, which corresponds to an end of said areas measured with the probe card, of said plurality of connection status sub-blocks and one, which is adjacent to one, corresponding to said one abnormal chip, of said plurality of connection status blocks, of said plurality of connection status sub-blocks indicate a figure of zero, in said plurality connection status sub-blocks in said each of plurality of connection status blocks,
   wherein one, which is not adjacent to said one, corresponding to said one abnormal chip, of said plurality of connection status blocks, of said plurality of connection status sub-blocks indicate a figure of one, in said plurality connection status sub-blocks in said each of plurality of connection status blocks,
   wherein said generation portion further includes:
   a second generation section which generates a logical connection propriety data by an AND operation performed on figures indicated in the same position located in each of said plurality of connection status sub-blocks in each of said plurality of connection status blocks in said plurality of area connection status data for all of said plurality of connection status sub-blocks,
   wherein said logical connection propriety data includes a plurality of logical connection propriety blocks corresponding to said plurality of said connection status blocks;
   wherein each of said plurality of logical connection propriety blocks includes a plurality of connection propriety sub-blocks with a figure obtained by said AND operation,
   wherein said generation portion further includes:
   a third generation section which generates said connection propriety data by adding up figures indicated in said plurality of connection propriety sub-blocks in each of said logical connection propriety blocks,
   wherein said connection propriety data includes a plurality of connection propriety blocks corresponding to said plurality of logical connection propriety blocks,
   wherein each of said plurality of connection propriety blocks includes said plurality of connection propriety sub-blocks and a connectable quantity sub-block with a figure obtained by said adding-up operation,
   wherein said figure of zero indicated in said plurality of connection propriety sub-blocks represents prohibition of a connection to an adjacent chip, and said figure of one indicated in said plurality of connection propriety sub-blocks represents permission of a connection to said adjacent chip,
   wherein a figure in said connectable quantity sub-block represents a number of the chips adjacent to and permitted to connect to,
   wherein said search processing portion outputs said search result data, based on said plurality of area image data, the figures indicated in said plurality of connection propriety sub-blocks and the figure indicated in said connectable quantity sub-block in said each of plurality of connection propriety block.

3. The semiconductor chip inspection supporting apparatus according to claim 2, wherein said search processing portion includes:
   a first search section which searches said plurality of connection propriety blocks in said connection propriety data for a single measurement block whose said connectable quantity sub-block indicates a figure of zero,
   a first processing section which specifies a block corresponding to said single measurement block in each of said plurality of area image data as a chip that a single measurement is executed,
   a second search section which searches said plurality of connection propriety blocks in said connection propriety data, excluding said single measurement block, for first paired measurement blocks including of a first connection propriety block whose a connectable quantity sub-block indicates a figure of one and a connection propriety block adjacent to said first connection propriety block,
   a second processing section which specifies blocks corresponding to said first paired measurement blocks in each of said plurality of area image data as chips that a paired measurement is executed,
   a third search section which searches said plurality of connection propriety blocks in said connection propriety data, excluding said single measurement block and said first paired measurement blocks, for second paired measurement blocks including of a second connection propriety block whose a connectable quantity sub-block indicates a figure of two and a connection propriety block adjacent to said second connection propriety block,
   a third processing section which specifies blocks corresponding to said second paired measurement blocks in each of said plurality of area image data as chips that the paired measurement is executed,
   a fourth search section which searches said plurality of connection propriety blocks in said connection propriety data, excluding said single measurement block and said first to second paired measurement blocks, for third paired measurement blocks including of a third connection propriety block whose a connectable quantity sub-block indicates a figure of three and a connection propriety block adjacent to said third connection propriety block,
   a fourth processing section which specifies blocks corresponding to said third paired measurement blocks in each of said plurality of area image data as chips that the paired measurement is executed,
   a fifth search section which searches said plurality of connection propriety blocks in said connection propriety data, excluding said single measurement block and said first to third paired measurement blocks, for fourth paired measurement blocks including of a fourth connection propriety block whose a connectable quantity sub-block indicates a figure of four and a connection propriety block adjacent to said fourth connection propriety block, and a fifth processing section which specifies blocks corresponding to said fourth paired measurement blocks in each of said plurality of area image data as chips that the paired measurement is executed, wherein said fifth processing section outputs said image data which includes said plurality of area image data specifying at least one of said single measurement block, and said first to fourth paired measurement blocks as said search result to said output device.

4. The semiconductor chip inspection supporting apparatus according to claim 2, wherein said search processing portion includes:

a first search section which searches said plurality of connection propriety blocks in said connection propriety data for a single measurement block whose said connectable quantity sub-block indicates a figure of zero, a first processing section which specifies a block corresponding to said single measurement block in each of said plurality of area image data as a chip that a single measurement is executed, a second search section which searches said plurality of connection propriety blocks in said connection propriety data, excluding said single measurement block, for first paired measurement blocks including of a first connection propriety block whose a connectable quantity sub-block indicates a figure of one and a connection propriety block adjacent to said first connection propriety block, a second processing section which specifies blocks corresponding to said first paired measurement blocks in each of said plurality of area image data as chips that a paired measurement is executed, a third search section which searches said plurality of connection propriety blocks in said connection propriety data, excluding said single measurement block and said first paired measurement blocks, for second paired measurement blocks including of a second connection propriety block whose a connectable quantity sub-block indicates a figure of two and at least one of two connection propriety block adjacent to said second connection propriety block, a third processing section which specifies blocks corresponding to said second paired measurement blocks in each of said plurality of area image data as chips that the paired measurement is executed, a fourth search section which searches said plurality of connection propriety blocks in said connection propriety data, excluding said single measurement block and said first to second paired measurement blocks, for third paired measurement blocks including of a third connection propriety block whose a connectable quantity sub-block indicates a figure of three and at least one of three connection propriety block adjacent to said third connection propriety block, a fourth processing section which specifies blocks corresponding to said third paired measurement blocks in each of said plurality of area image data as chips that the paired measurement is executed, a fifth search section which searches said plurality of connection propriety blocks in said connection propriety data, excluding said single measurement block and said first to third paired measurement blocks, for fourth paired measurement blocks including of a fourth connection propriety block whose a connectable quantity sub-block indicates a figure of four and at least one of four connection propriety block adjacent to said fourth connection propriety block, and a fifth processing section which specifies blocks corresponding to said fourth paired measurement blocks in each of said plurality of area image data as chips that the paired measurement is executed, wherein said fifth processing section outputs said image data which includes said plurality of area image data specifying at least one of said single measurement block, and said first to fourth paired measurement blocks as said search result to said output device.

5. The semiconductor chip inspection supporting apparatus according to claim 1, wherein said each normal chip is a chip including an electronic circuit on said semiconductor wafer, and wherein said each abnormal chip is a chip not being able to include said electronic circuit on said semiconductor wafer.

6. The semiconductor chip inspection supporting apparatus according to claim 1, wherein said each abnormal chip includes a test element group chip.

7. A method for supporting a semiconductor chip inspection by using a computer to which an image data is supplied, wherein said image data indicates a layout of a plurality of normal chips and a plurality of abnormal chip on a semiconductor wafer, said method comprising:

(a) generating a connection propriety data indicating prohibition of each of said plurality of normal chips from being connected to adjacent one of said plurality of abnormal chips based on said image data;

(b) searching for a chip to be paired with said each of plurality of the normal chips for execution of paired measurement, based on said image data and said connection propriety data; and (c) outputting said search result to an output device.

8. The method for supporting a semiconductor chip inspection according to claim 7, wherein said image data includes a plurality of area image data corresponding to areas measured with a probe card, wherein each of said plurality of area image data includes a plurality of blocks regularly arrayed, wherein each of said plurality of blocks indicates chips on said semiconductor wafer, wherein said step (a) includes:

(a1) generating a plurality of area connection status data by examining one, indicating said each normal chip, of said plurality of blocks and adjacent one, indicating adjacent said one abnormal chip, of said plurality of blocks in each of said plurality of area image data, wherein each of said plurality of area connection status data includes a plurality of connection status blocks corresponding to said plurality of blocks, wherein each of said plurality of connection status blocks includes a plurality connection status sub-blocks, wherein one, which corresponds to an end of said areas measured with the probe card, of said plurality of connection status sub-blocks and one, which is adjacent to one, corresponding to said one abnormal chip, of said plurality of connection status blocks, of said plurality of connection status sub-blocks indicate a figure of zero, in said plurality connection status sub-blocks in said each of plurality of connection status blocks, wherein one, which is not adjacent to said one, corresponding to said one abnormal chip, of said plurality of connection status blocks, of said plurality of connection status sub-blocks indicate a figure of one, in said plurality connection status sub-blocks in said each of plurality of connection status blocks, wherein said step (a) further includes:

(a2) generating a logical connection propriety data by an AND operation performed on figures indicated in the same position located in each of said plurality of connection status sub-blocks in each of said plurality of connection status blocks in said plurality of area connection status data for all of said plurality of connection status sub-blocks, wherein said logical connection propriety data includes a plurality of logical connection propriety blocks corresponding to said plurality of said connection status blocks, wherein each of said plurality of logical connection propriety blocks includes a plurality of connection propriety sub-blocks with a figure obtained by said AND operation, wherein said step (a) further includes:

(a3) generating said connection propriety data by adding up figures indicated in said plurality of connection propriety sub-blocks in each of said logical connection propriety blocks, wherein said connection propriety data includes a plurality of connection propriety blocks corresponding to said plurality of logical connection propriety blocks, wherein each of said plurality of connection propriety blocks includes said plurality of connection propriety sub-blocks and a connectable quantity sub-block with a figure obtained by said adding-up operation, wherein said figure of zero indicated in said plurality of connection propriety sub-blocks represents prohibition of a connection to an adjacent chip, and said figure of one indicated in said plurality of connection propriety sub-blocks represents permission of a connection to said adjacent chip, wherein a figure in said connectable quantity sub-block represents a number of the chips adjacent to and permitted to connect to, wherein said step (b) includes:

(b1) outputting said search result data, based on said plurality of area image data, the figures indicated in said plurality of connection propriety sub-blocks and the figure indicated in said connectable quantity sub-block in said each of plurality of connection propriety block.

9. The method for supporting a semiconductor chip inspection according to claim 8, wherein said step (b) further includes:

(b2) searching said plurality of connection propriety blocks in said connection propriety data for a single measurement block whose said connectable quantity sub-block indicates a figure of zero, (b3) specifying a block corresponding to said single measurement block in each of said plurality of area image data as a chip that a single measurement is executed, (b4) searching said plurality of connection propriety blocks in said connection propriety data, excluding said single measurement block, for first paired measurement blocks including of a first connection propriety block whose a connectable quantity sub-block indicates a figure of one and a connection propriety block adjacent to said first connection propriety block, (b5) specifying blocks corresponding to said first paired measurement blocks in each of said plurality of area image data as chips that a paired measurement is executed, (b6) searching said plurality of connection propriety blocks in said connection propriety data, excluding said single measurement block and said first paired measurement blocks, for second paired measurement blocks including of a second connection propriety block whose a connectable quantity sub-block indicates a figure of two and a connection propriety block adjacent to said second connection propriety block, (b7) specifying blocks corresponding to said second paired measurement blocks in each of said plurality of area image data as chips that the paired measurement is executed, (b8) searching said plurality of connection propriety blocks in said connection propriety data, excluding said single measurement block and said first to second paired measurement blocks, for third paired measurement blocks including of a third connection propriety block whose a connectable quantity sub-block indicates a figure of three and a connection propriety block adjacent to said third connection propriety block, (b9) specifying blocks corresponding to said third paired measurement blocks in each of said plurality of area image data as chips that the paired measurement is executed, (b10) searching said plurality of connection propriety blocks in said connection propriety data, excluding said single measurement block and said first to third paired measurement blocks, for fourth paired measurement blocks including of a fourth connection propriety block whose a connectable quantity sub-block indicates a figure of four and a connection propriety block adjacent to said fourth connection propriety block, (b11) specifying blocks corresponding to said fourth paired measurement blocks in each of said plurality of area image data as chips that the paired measurement is executed, and (b12) outputting said image data which includes said plurality of area image data specifying at least one of said single measurement block, and said first to fourth paired measurement blocks as said search result to an output device.

10. The method for supporting a semiconductor chip inspection according to claim 8, wherein said step (b) further includes:

(b2) searching said plurality of connection propriety blocks in said connection propriety data for a single measurement block whose said connectable quantity sub-block indicates a figure of zero, (b3) specifying a block corresponding to said single measurement block in each of said plurality of area image data as a chip that a single measurement is executed, (b4) searching said plurality of connection propriety blocks in said connection propriety data, excluding said single measurement block, for first paired measurement blocks including of a first connection propriety block whose a connectable quantity sub-block indicates a figure of one and a connection propriety block adjacent to said first connection propriety block, (b5) specifying blocks corresponding to said first paired measurement blocks in each of said plurality of area image data as chips that a paired measurement is executed, (b6) searching said plurality of connection propriety blocks in said connection propriety data, excluding said single measurement block and said first paired measurement blocks, for second paired measurement blocks including of a second connection propriety block whose a connectable quantity sub-block indicates a figure of two and at least one of two connection propriety block adjacent to said second connection propriety block, (b7) specifying blocks corresponding to said second paired measurement blocks in each of said plurality of area image data as chips that the paired measurement is executed, (b8) searching said plurality of connection propriety blocks in said connection propriety data, excluding said single measurement block and said first to second paired measurement blocks, for third paired measurement blocks including of a third connection propriety block whose a connectable quantity sub-block indicates a figure of three and at least one of three connection propriety block adjacent to said third connection propriety block, (b9) specifying blocks corresponding to said third paired measurement blocks in each of said plurality of area image data as chips that the paired measurement is executed, (b10) searching said plurality of connection propriety blocks in said connection propriety data, excluding said single measurement block and said first to third paired measurement blocks, for fourth paired measurement blocks including of a fourth connection propriety block whose a connectable quantity sub-block indicates a figure of four and at least one of four connection propriety block adjacent to said fourth connection propriety block, (b11) specifying blocks corresponding to said fourth paired measurement blocks in each of said plurality of area image data as chips that the paired measurement is executed, and (b12) outputting said image data which includes said plurality of area image data specifying at least one of said single measurement block, and said first to fourth paired measurement blocks as said search result to an output device.

11. The method for supporting a semiconductor chip inspection according to claim 7, wherein said each normal chip is a chip including an electronic circuit on said semiconductor wafer, and
wherein said each abnormal chip is a chip not being able to include said electronic circuit on said semiconductor wafer.

12. The method for supporting a semiconductor chip inspection according to claim 7, wherein said each abnormal chip includes a test element group chip.

13. A computer program product which is used for a method for supporting a semiconductor chip inspection by using a computer to which an image data is supplied, wherein said image data indicates a layout of a plurality of normal chips and a plurality of abnormal chip on a semiconductor wafer,
said computer program product embodied on a computer-readable medium and comprising code that, when executed, causes a computer to perform the following:

(a) generating a connection propriety data indicating prohibition of each of said plurality of normal chips from being connected to adjacent one of said plurality of abnormal chips based on said image data;

(b) searching for a chip to be paired with said each of plurality of the normal chips for execution of paired measurement, based on said image data and said connection propriety data; and (c) outputting said search result to an output device.

14. The computer program product according to claim 13, wherein said image data includes a plurality of area image data corresponding to areas measured with a probe card,
wherein each of said plurality of area image data includes a plurality of blocks regularly arrayed,
wherein each of said plurality of blocks indicates chips on said semiconductor wafer,
wherein said step (a) includes:
(a1) generating a plurality of area connection status data by examining one, indicating said each normal chip, of said plurality of blocks and adjacent one, indicating adjacent said one abnormal chip, of said plurality of blocks in each of said plurality of area image data,
wherein each of said plurality of area connection status data includes a plurality of connection status blocks corresponding to said plurality of blocks,
wherein each of said plurality of connection status blocks includes a plurality connection status sub-blocks,
wherein one, which corresponds to an end of said areas measured with the probe card, of said plurality of connection status sub-blocks and one, which is adjacent to one, corresponding to said one abnormal chip, of said plurality of connection status blocks, of said plurality of connection status sub-blocks indicate a figure of zero, in said plurality connection status sub-blocks in said each of plurality of connection status blocks,
wherein one, which is not adjacent to said one, corresponding to said one abnormal chip, of said plurality of connection status blocks, of said plurality of connection status sub-blocks indicate a figure of one, in said plurality connection status sub-blocks in said each of plurality of connection status blocks,
wherein said step (a) further includes:
(a2) generating a logical connection propriety data by an AND operation performed on figures indicated in the same position located in each of said plurality of connection status sub-blocks in each of said plurality of connection status blocks in said plurality of area connection status data for all of said plurality of connection status sub-blocks,
wherein said logical connection propriety data includes a plurality of logical connection propriety blocks corresponding to said plurality of said connection status blocks,
wherein each of said plurality of logical connection propriety blocks includes a plurality of connection propriety sub-blocks with a figure obtained by said AND operation,
wherein said step (a) further includes:
(a3) generating said connection propriety data by adding up figures indicated in said plurality of connection propriety sub-blocks in each of said logical connection propriety blocks,
wherein said connection propriety data includes a plurality of connection propriety blocks corresponding to said plurality of logical connection propriety blocks,
wherein each of said plurality of connection propriety blocks includes said plurality of connection propriety sub-blocks and a connectable quantity sub-block with a figure obtained by said adding-up operation, wherein said figure of zero indicated in said plurality of connection propriety sub-blocks represents prohibition of a connection to an adjacent chip, and said figure of one indicated in said plurality of connection propriety sub-blocks represents permission of a connection to said adjacent chip, wherein a figure in said connectable quantity sub-block represents a number of the chips adjacent to and permitted to connect to, wherein said step (b) includes:

(b1) outputting said search result data, based on said plurality of area image data, the figures indicated in said plurality of connection propriety sub-blocks and the figure indicated in said connectable quantity sub-block in said each of plurality of connection propriety block.

15. The computer program product according to claim 14, wherein said step (b) further includes:

(b2) searching said plurality of connection propriety blocks in said connection propriety data for a single measurement block whose said connectable quantity sub-block indicates a figure of zero, (b3) specifying a block corresponding to said single measurement block in each of said plurality of area image data as a chip that a single measurement is executed, (b4) searching said plurality of connection propriety blocks in said connection propriety data, excluding said single measurement block, for first paired measurement blocks including of a first connection propriety block whose a connectable quantity sub-block indicates a figure of one and a connection propriety block adjacent to said first connection propriety block, (b5) specifying blocks corresponding to said first paired measurement blocks in each of said plurality of area image data as chips that a paired measurement is executed, (b6) searching said plurality of connection propriety blocks in said connection propriety data, excluding said single measurement block and said first paired measurement blocks, for second paired measurement blocks including of a second connection propriety block whose a connectable quantity sub-block indicates a figure of two and a connection propriety block adjacent to said second connection propriety block, (b7) specifying blocks corresponding to said second paired measurement blocks in each of said plurality of area image data as chips that the paired measurement is executed, (b8) searching said plurality of connection propriety blocks in said connection propriety data, excluding said single measurement block and said first to second paired measurement blocks, for third paired measurement blocks including of a third connection propriety block whose a connectable quantity sub-block indicates a figure of three and a connection propriety block adjacent to said third connection propriety block, (b9) specifying blocks corresponding to said third paired measurement blocks in each of said plurality of area image data as chips that the paired measurement is executed, (b10) searching said plurality of connection propriety blocks in said connection propriety data, excluding said single measurement block and said first to third paired measurement blocks, for fourth paired measurement blocks including of a fourth connection propriety block whose a connectable quantity sub-block indicates a figure of four and a connection propriety block adjacent to said fourth connection propriety block, (b11) specifying blocks corresponding to said fourth paired measurement blocks in each of said plurality of area image data as chips that the paired measurement is executed, and (b12) outputting said image data which includes said plurality of area image data specifying at least one of said single measurement block, and said first to fourth paired measurement blocks as said search result to an output device.

16. The computer program product according to claim 14, wherein said step (b) further includes:

(b2) searching said plurality of connection propriety blocks in said connection propriety data for a single measurement block whose said connectable quantity sub-block indicates a figure of zero, (b3) specifying a block corresponding to said single measurement block in each of said plurality of area image data as a chip that a single measurement is executed, (b4) searching said plurality of connection propriety blocks in said connection propriety data, excluding said single measurement block, for first paired measurement blocks including of a first connection propriety block whose a connectable quantity sub-block indicates a figure of one and a connection propriety block adjacent to said first connection propriety block, (b5) specifying blocks corresponding to said first paired measurement blocks in each of said plurality of area image data as chips that a paired measurement is executed, (b6) searching said plurality of connection propriety blocks in said connection propriety data, excluding said single measurement block and said first paired measurement blocks, for second paired measurement blocks including of a second connection propriety block whose a connectable quantity sub-block indicates a figure of two and at least one of two connection propriety block adjacent to said second connection propriety block, (b7) specifying blocks corresponding to said second paired measurement blocks in each of said plurality of area image data as chips that the paired measurement is executed, (b8) searching said plurality of connection propriety blocks in said connection propriety data, excluding said single measurement block and said first to second paired measurement blocks, for third paired measurement blocks including of a third connection propriety block whose a connectable quantity sub-block indicates a figure of three and at least one of three connection propriety block adjacent to said third connection propriety block, (b9) specifying blocks corresponding to said third paired measurement blocks in each of said plurality of area image data as chips that the paired measurement is executed, (b10) searching said plurality of connection propriety blocks in said connection propriety data, excluding said single measurement block and said first to third paired measurement blocks, for fourth paired measurement blocks including of a fourth connection propriety block whose a connectable quantity sub-block indicates a figure of four and at least one of four connection propriety block adjacent to said fourth connection propriety block, (b11) specifying blocks corresponding to said fourth paired measurement blocks in each of said plurality of area image data as chips that the paired measurement is executed, and (b12) outputting said image data which includes said plurality of area image data specifying at least one of said single measurement block, and said first to fourth paired measurement blocks as said search result to an output device.

17. The computer program product according to claim 13, wherein said each normal chip is a chip including an electronic circuit on said semiconductor wafer, and wherein said each abnormal chip is a chip not being able to include said electronic circuit on said semiconductor wafer.

18. The computer program product according to claim 13, wherein said each abnormal chip includes a test element group chip.

\* \* \* \* \*